(12) United States Patent
Kodama et al.

(10) Patent No.: US 6,818,377 B2
(45) Date of Patent: Nov. 16, 2004

(54) POSITIVE PHOTOSENSITIVE COMPOSITION

(75) Inventors: Kunihiko Kodama, Shizuoka (JP); Kenichiro Sato, Shizuoka (JP); Toshiaki Aoai, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 202 days.

(21) Appl. No.: 10/176,067

(22) Filed: Jun. 21, 2002

(65) Prior Publication Data

US 2004/0161697 A2 Aug. 19, 2004

Related U.S. Application Data

(62) Division of application No. 09/606,681, filed on Jun. 30, 2000, now Pat. No. 6,517,991, which is a division of application No. 09/361,568, filed on Jul. 27, 1999, now Pat. No. 6,291,130.

(30) Foreign Application Priority Data

Jul. 27, 1998 (JP) ............................................ 10-211137
Sep. 17, 1998 (JP) ............................................ 10-263392
Jan. 13, 1999 (JP) ................................................. 11-6662
Jun. 30, 1999 (JP) ........................................... 11-186809

(51) Int. Cl.$^7$ .............................................. G03F 7/004
(52) U.S. Cl. .................................... 430/270.1; 430/910
(58) Field of Search ............................. 430/270.1, 910, 430/905

(56) References Cited

U.S. PATENT DOCUMENTS

| 5,691,111 | A | 11/1997 | Iwasa et al. |
| 5,824,451 | A | 10/1998 | Aoai et al. |
| 6,060,207 | A | 5/2000 | Shida et al. |
| 6,087,063 | A | 7/2000 | Hada et al. |
| 6,291,130 | B1 * | 9/2001 | Kodama et al. ......... 430/270.1 |
| 6,322,949 | B2 | 11/2001 | Suwa et al. |

FOREIGN PATENT DOCUMENTS

JP  11-015162 A  1/1999

OTHER PUBLICATIONS

DERWENT abstracts of JP 11–15162, Jan. 22, 1999.
English Language translation of JP 11–15162, Jan. 22, 1999.

* cited by examiner

*Primary Examiner*—Rosemary Ashton
(74) *Attorney, Agent, or Firm*—Sughrue Mion, PLLC

(57) ABSTRACT

A positive photosensitive composition comprising (A) a compound which generates an acid upon irradiation with an actinic ray or radiation, and (B-1) a resin having a group which is decomposed by the action of an acid to increase solubility in an alkaline developing solution and containing at least one structure represented by formulae (I), (II) and (III) as described in the specification or (B-2) a resin having at least one monovalent polyalicyclic group represented by formula (Ib) as described in the specification and a group which is decomposed by the action of an acid to increase solubility in an alkaline developing solution. The positive photosensitive composition containing the resin according to the present invention has high transmittance to far ultraviolet light particularly having a wavelength of 220 nm or less and exhibits good dry etching resistance. Further, the positive photosensitive composition exhibits high sensitivity, good resolution and good pattern profile when far ultraviolet light having a wavelength of 250 nm or less, particularly 220 nm or less (especially an ArF excimer laser beam) is employed as an exposure light source, and thus it can be effectively employed for the formation of fine pattern necessary for the production of semiconductor elements.

12 Claims, No Drawings

US 6,818,377 B2

POSITIVE PHOTOSENSITIVE COMPOSITION

This is a Divisional of application Ser. No. 09/606,681 filed Jun. 30, 2000 now U.S. Pat. No. 6,517,991, which is a Divisional of application Ser. No. 09/361,568, filed Jul. 27, 1999, now U.S. Pat. No. 6,291,130; the disclosures of which are incorporated herein by reference.

FIELD OF THE INVENTION

The present invention relates to a positive photosensitive composition for use in the production of a semiconductor such as IC, in the production of a circuit board such as liquid crystal and thermal head and in other photofabrication processes. More specifically, the present invention relates to a positive photosensitive composition suitable for use in a case where an exposure light source used is a far ultraviolet beam of 250 nm or less.

BACKGROUND OF THE INVENTION

A positive photoresist composition commonly used is a composition comprising an alkali-soluble resin and a naphthoquinonediazide compound as a photosensitive material. Examples thereof include a "novolak-type phenol resin/naphthoquinonediazide-substituted compound" described in U.S. Pat. Nos. 3,666,473, 4,115,128 and 4,173,470 and a "novolak resin comprising cresol-formaldehyde/trihydroxybenzophenone-1,2-naphthoquinonediazide sulfonic acid ester" as a most typical composition, described in L. F. Thompson, *Introduction to Microlithography*, No. 2, 19, pp. 112–121, ACS Publishing.

In these positive photoresists fundamentally comprising a novolak resin and a quinonediazide compound, the novolak resin exhibits high resistance against plasma etching and the naphthoquinonediazide compound acts as a dissolution inhibitor. The naphthoquinonediazide generates a carboxylic acid on irradiation of light and loses its dissolution inhibiting ability to thereby elevate the alkali solubility of the novolak resin.

From this viewpoint, a large number of positive photoresists comprising a novolak resin and a naphthoquinonediazide-base photosensitive material have heretofore been developed and used in practice, and satisfactory results can be obtained in the working for a line width of approximately from 0.8 to 2 μm.

However, integrated circuits are being more and more intensified in the integration degree and the production of a semiconductor substrate such as VLSI requires working of an ultrafine pattern comprising lines having a width of a half micron or less.

According to one of known techniques for achieving miniaturization of a pattern, a resist pattern is formed using an exposure light source having a shorter wavelength. This technique can be described using the following Rayleigh's formula showing the resolution R (line width) of an optical system:

$$R = k \cdot \lambda / NA$$

(wherein λ is a wavelength of the exposure light source, NA is a numerical aperture of the lens and k is a process constant). As is apparent from this formula, a higher resolution, namely, a smaller R value can be obtained by reducing the wavelength λ of the exposure light source.

For example, in the production of a DRAM having an integration degree up to 64 M bits, the i beam (365 nm) of a high-pressure mercury lamp is used at present as the light source. In the mass production of 256-M bit DRAMs, use of a KrF excimer laser (248 nm) in place of the i-line has been studied. Further, for the purpose of producing DRAMs having an integration degree of 1 G bits or more, a light source having a further shorter wavelength has been investigated. To this effect, an ArF excimer laser (193 nm), an $F_2$ excimer laser (157 nm), an X ray, an electron beam and the like are considered to be effective (see, Takumi Ueno et al., *Tanpacho Photoresist Zairyo-ULSI Ni Muketa Bisai Kako-* (*Short Wavelength Photoresist Material-Fine Working Toward ULSI-*), Bunshin Shuppan (1988).

When a conventional resist comprising a novolak resin and a naphthoquinonediazide compound is used for the pattern formation by photolithography with a far ultraviolet ray or excimer laser beam, the novolak resin and naphthoquinonediazide compound exhibit strong absorption in the far ultraviolet region and the light scarcely reaches the bottom of resist, as a result, the resist has low sensitivity and only a tapered pattern can be obtained.

One of the techniques for solving this problem is the chemical amplification-type resist composition described in U.S. Pat. No. 4,491,628 and European Patent No. 249,139. The chemical amplification-type positive resist composition is a pattern formation material which generates an acid in the exposed area on irradiation of radiation such as far ultraviolet ray and due to the reaction using the acid as a catalyst, differentiates solubility in a developer between the area irradiated with the active radiation and the non-irradiated area to form a pattern on a substrate.

Examples thereof include combinations of a compound capable of generating an acid by photolysis with an acetal or O,N-acetal compound (see, JP-A-48-89003 (the term "JP-A" as used herein means an "unexamined published Japanese patent application"), with an ortho ester or amide acetal compound (JP-A-51-120714), with a polymer having an acetal or ketal group on the main chain (JP-A-53-133429), with an enol ether compound (JP-A-55-12995), with an N-acyliminocarbonic acid compound (JP-A-55-126236), with a polymer having an ortho ester group on the main chain (JP-A-56-17345), with a tertiary alkyl ester compound (JP-A-60-3625), with a silyl ester compound (JP-A-60-10247) or with a silyl ether compound (JP-A-60-37549, JP-A-60-121446). These combinations in principle have a quantum yield exceeding 1 and therefore exhibit high photosensitivity.

A system which decomposes by heating in the presence of an acid and is alkali-solubilized is also used and examples thereof include combinations of a compound capable of generating an acid on exposure with an ester or carbonic acid ester compound having a tertiary or secondary carbon (e.g., tert-butyl, or 2-cyclohexenyl) described, for example, in JP-A-59-45439, JP-A-60-3625, JP-A-62-229242, JP-A-63-27829, JP-A-63-36240, JP-A-63-250642, JP-A-5-181279, *Polym. Eng. Sce.*, Vol. 23, page 1012 (1983), *ACS. Sym.*, Vol. 242, page 11 (1984), *Semiconductor World*, November, 1987, page 91, *Macromolecules*, Vol. 21, page 1475 (1988), and *SPIE*, Vol. 920, page 42 (1988), with an acetal compound described, for example, in JP-A-4-219757, JP-A-5-249682 and JP-A-6-65332, or with a tert-butyl ether compound described, for example, in JP-A-4-211258 and JP-A-6-65333.

Such systems are mainly composed of a resin having a basic skeleton of poly(hydroxystyrene) which is small in the absorption in the region of 248 nm and therefore, when the exposure light source is a KrF excimer laser, they have high sensitivity and high resolution and are capable of forming a good pattern. Thus they can form good systems as compared with conventional naphthoquinonediazide/novolak resin systems.

However, when the light source has a still shorter wavelength, for example, when the exposure light source used is an ArF excimer laser (193 nm), the above-described chemical amplification systems are yet deficient because the compound having an aromatic group substantially has large absorption in the region of 193 nm. As a polymer having small absorption in the 193 nm region, in *J. Vac. Sci. Technol.*, B9, 3357 (1991), the use of poly(meth)-acrylate is described. However, this polymer has a problem in that the resistance against dry etching which is commonly performed in the production process of semi-conductors is low as compared with conventional phenol resins having aromatic groups.

In *Proc. of SPIE*, 1672, 66 (1922), it is reported that polymers having alicyclic groups exhibit the dry etching resistance on the same level as that of the compounds having aromatic groups and at the same time, have small absorption in the 193 nm region. The use of these polymers has been aggressively studied in recent years. Specific examples thereof include the polymers described, for example, in JP-A-4-39665, JP-A-5-80515, JP-A-5-265212, JP-A-5-297591, JP-A-5-346668, JP-A-6-289615, JP-A-6-324494, JP-A-7-49568, JP-A-7-185046, JP-A-7-191463, JP-A-7-199467, JP-A-7-234511, JP-A-7-252324, JP-A-8-259626, JP-A-9-73173 and JP-A-9-90637. However, these polymers do not always have sufficient dry etching resistance and are disadvantageous in that the synthesis thereof necessitates many steps.

Further, the introduction of the alicyclic group in order to improve the dry etching resistance is accompanied with the decrease in adhesion to a substrate and causes a problem in that peeling off of the resist layer occurs in the pattern after development. In order to solve such a problem, a resin containing a unit having a γ-butyrolactone structure is proposed as described in EP-A-856773. Although the adhesion is improved by using the resin, it has only a low acid decomposing property due to the secondary carboxylic acid ester, resulting in decrease in sensitivity and exhibits insufficiently low resolution. Further, since the hydrophobic property of the resist layer increases by the introduction of the alicyclic group, such a resist composition has another problem of the occurrence of development defects.

SUMMARY OF THE INVENTION

Therefore, an object of the present invention is to provide a positive photosensitive composition suitable for use of an exposure light source having a wavelength of 250 nm or less, particularly 220 nm or less.

Another object of the present invention is to provide a positive photosensitive composition which provides good sensitivity, resolution, adhesion and resist pattern and exhibits sufficient dry etching resistance when used with an exposure light source having a wavelength of 250 nm or less, particularly 220 nm or less.

Other objects of the present invention will become apparent from the following description.

As a result of intensive investigations made by the inventors on positive photosensitive compositions while taking the properties described above into consideration, it has been found that the objects of the present invention are successfully accomplished by using a resin having a specific alicyclic group described below, to complete the present invention.

Specifically, the present invention comprises a positive photosensitive composition which comprises (A) a compound which generates an acid upon irradiation with an actinic ray or radiation, and (B) a resin having a group which is decomposed by the action of an acid to increase solubility in an alkaline developing solution and further containing a group having the specific alicyclic structure.

A first embodiment of the positive photosensitive composition according to the present invention includes the following:

(1) a positive photosensitive composition comprising (A) a compound which generates an acid upon irradiation with an actinic ray or radiation, and (B) a resin having a group which is decomposed by the action of an acid to increase solubility in an alkaline developing solution, wherein the resin contains at least one structure represented by the following formulae (I), (II) and (III):

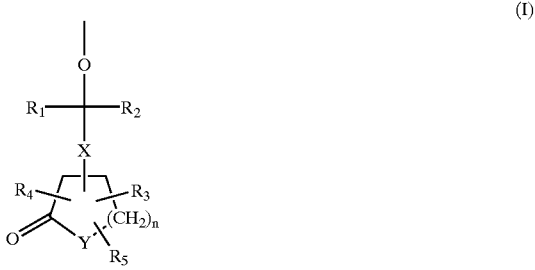

(I)

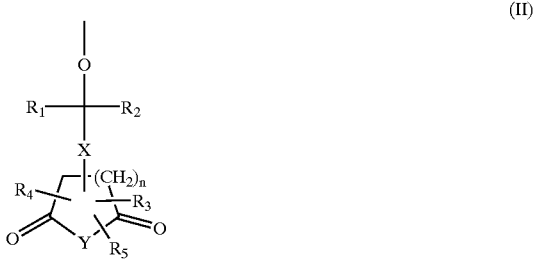

(II)

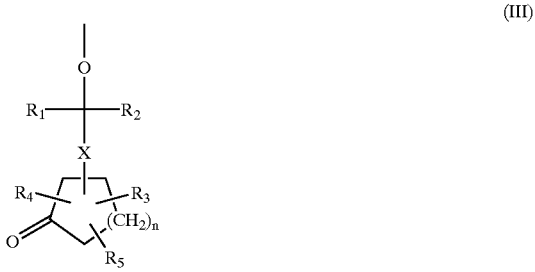

(III)

wherein $R_1$ and $R_2$, which may be the same or different, each represents a hydrogen atom or an optionally substituted straight-chain, branched chain or cyclic alkyl group, or $R_1$ and $R_2$ may be bonded to each other to form a monocyclic or polycyclic ring which may contain an oxygen atom, a sulfur atom, a nitrogen atom, a ketone bond, an ester bond, an imido bond or an amido bond as a linking group; $R_3$, $R_4$ and $R_5$, which may be the same or different, each represents a hydrogen atom, an optionally substituted straight-chain, branched chain or cyclic alkyl or alkoxy group, or two or more of $R_3$, $R_4$ and $R_5$ may be bonded to each other to form a monocyclic or polycyclic ring which may contain an oxygen atom, a sulfur atom, a nitrogen atom, a ketone bond, an ester bond, an imido bond or an amido bond as a linking group; X represents a single bond or a divalent linking group, or X and either or both of $R_1$ and $R_2$ may be bonded to each other to form a monocyclic or polycyclic ring; Y represents an oxygen atom, a sulfur atom, —NH—, —N(OH)— or —N(alkyl)-; and n represents an integer of from 1 to 3;

(2) a positive photosensitive composition comprising (A) a compound which generates an acid upon irradiation with an actinic ray or radiation, (B) a resin having a group which is decomposed by the action of an acid to increase solubility in an alkaline developing solution, and (C) a low molecular weight compound having a molecular weight of 3,000 or less and having a group which is decomposed by the action of an acid to increase solubility in an alkaline developing solution, wherein the resin (B) and/or the low molecular weight compound (C) contain at least one structure represented by formulae (I), (II) and (III) described in item (1) above;

(3) a positive photosensitive composition as described in item (1) or (2) above, wherein the resin having a group which is decomposed by the action of an acid to increase solubility in an alkaline developing solution is (D) a resin which contains at least one repeating unit having the structure represented by formula (I), (II) or (III) and a repeating unit having a monoalicyclic or polyalicyclic hydrocarbon moiety;

(4) a positive photosensitive composition as described in item (1), (2) or (3), wherein the monoalicyclic or polyalicyclic hydrocarbon moiety is an adamantane residue;

(5) a positive photosensitive composition as described in any one of items (1) to (4), wherein the resin having a group which is decomposed by the action of an acid to increase solubility in an alkaline developing solution contains a structure represented by formula (a):

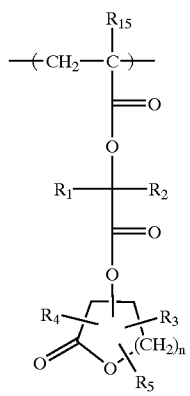

wherein $R_1$, $R_2$, $R_3$, $R_4$ and $R_5$, and n are the same as defined in formula (I), and $R_{15}$ represents a hydrogen atom, a halogen atom, a cyano group, an alkyl group or a haloalkyl group;

(6) the positive photosensitive composition as described in any one of items (1) to (5), wherein the resin having a group which is decomposed by the action of an acid to increase solubility in an alkaline developing solution contains a structure represented by formula (b):

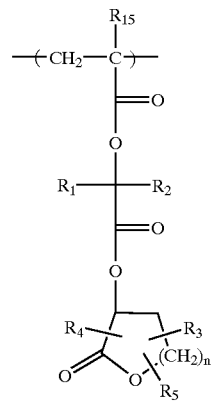

wherein $R_1$, $R_2$, $R_3$, $R_4$ and $R_5$, and n are the same as defined in formula (I), and $R_{15}$ represents a hydrogen atom, a halogen atom, a cyano group, an alkyl group or a haloalkyl group;

wherein $R_{15}$ in formulae a and b are the same as $R_{15}$ in formula (IV) described later;

(7) a positive photosensitive composition comprising (A) a compound which generates an acid upon irradiation with an actinic ray or radiation, (C) a low molecular weight compound having a molecular weight of 3,000 or less and having a group which is decomposed by the action of an acid to increase solubility in an alkaline developing solution, and (E) a resin which is insoluble in water but soluble in an alkaline developing solution, wherein the low molecular weight compound (C) contains at least one structure represented by formulae (I), (II) and (III) described in item (1) above;

(8) a positive photosensitive composition as described in any one of items (1) to (7) above, wherein $R_1$ and $R_2$ each represents a substituent other than a hydrogen atom;

(9) a positive photosensitive composition as described in any one of items (1) to (7) above, wherein the composition further comprises (F) a fluorine-base and/or silicon-base surface active agent;

(10) a positive photosensitive composition as described in any one of items (1) to (7) above, wherein the composition is suitable for exposure using far ultraviolet light having a wavelength of 250 nm or less as an exposure light source; and

(11) a positive photosensitive composition as described in any one of items (1) to (7) above, wherein the composition is suitable for exposure using far ultraviolet light having a wavelength of 220 nm or less as an exposure light source.

A second embodiment of the positive photosensitive composition according to the present invention includes the following:

(1) a positive photosensitive composition comprising (A) a compound which generates an acid upon irradiation with an actinic ray or radiation and (B) a resin having at least one monovalent polyalicyclic group represented by the following formula (Ib) and a group which is decomposed by the action of an acid to increase solubility in an alkaline developing solution:

(Ib)

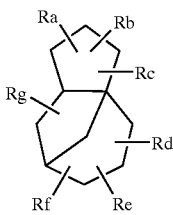

wherein $R_a$, $R_b$, $R_c$, $R_d$, $R_e$, $R_f$ and $R_g$, which may be the same or different, each represents an optionally substituted alkyl, cycloalkyl, alkenyl or alkynyl group, a halogen atom, a cyano group, $-R_{6b}-O-R_{7b}$, $-R_{8b}-CO-O-R_{9b}$, $-R_{10b}-CO-NR_{11b}R_{12b}$ or $-R_{13b}-O-CO-R_{14b}$; $R_{7b}$ and $R_{9b}$, which may be the same or different, each represents a hydrogen atom, an optionally substituted alkyl, cycloalkyl or alkenyl group or a group which is decomposed by the action of an acid to increase solubility in an alkaline developing solution; $R_{11b}$, $R_{12b}$ and $R_{14b}$, which may be the same or different, each represents a hydrogen atom, an optionally substituted alkyl, cycloalkyl or alkenyl group, or $R_{11b}$ and $R_{12b}$ may be bonded to each other to form a ring; $R_{6b}$, $R_{8b}$, $R_{10b}$ and $R_{13b}$, which may be the same or different, each represents a single bond, an optionally substituted alkylene, alkenylene or cycloalkylene group; two of $R_a$ to $R_g$, which are present on the same carbon atom, may represent in combination a carbonyl group (=O) or a thiocarbonyl group (=S); two of $R_a$ to $R_g$, which are bonded to adjacent carbon atoms, may be bonded to each other to form a double bond between these two carbon atoms; at least two of $R_a$ to $R_g$ may be bonded to each other to form a ring; and the monovalent polyalicyclic group represented by formula (Ib) may be connected to the resin moiety in any position thereof;

(2) a positive photosensitive composition as described in item (1) above, wherein the resin (B) is a resin comprising at least one repeating unit represented by the following formulae (IVb), (Vb) and (VIb) and a group which is decomposed by the action of an acid to increase solubility in an alkaline developing solution:

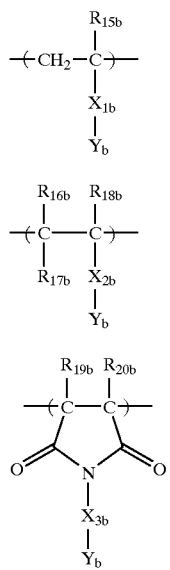

wherein $R_{15b}$, $R_{16b}$ and $R_{18b}$ to $R_{20b}$, which may be the same or different, each represents a hydrogen atom, a halogen atom, a cyano group, an alkyl group or a haloalkyl group; $R_{17b}$ represents a cyano group, $-CO-OR_{27b}$ or $-CO-NR_{28b}R_{29b}$; $X_{1b}$, $X_{2b}$ and $X_{3b}$, which may be the same or different, each represents a single bond, an optionally substituted divalent alkylene, alkenylene or cycloalkylene group, $-O-$, $-SO_2-$, $-O-CO-R_{30b}-$, $-CO-O-R_{31b}-$, or $-CO-NR_{32b}-R_{33b}-$; $R_{27b}$ represents a hydrogen atom, an optionally substituted alkyl, cycloalkyl or alkenyl group, or a group which is decomposed by the action of an acid to increase solubility in an alkaline developing solution; $R_{28b}$, $R_{29b}$ and $R_{32b}$, which may be the same or different, each represents a hydrogen atom or an optionally substituted alkyl, cycloalkyl or alkenyl group, or $R_{28b}$ and $R_{29b}$ may be bonded to each other to form a ring; $R_{30b}$, $R_{31b}$ and $R_{33b}$, which may be the same or different, each represents a single bond or a divalent alkylene, alkenylene or cycloalkylene group, or a divalent group formed by combining each of these groups with an ether, ester, amido, urethane or ureido group; and $Y_b$ represents the polyalicyclic group represented by formula (Ib) described in item (1) above;

(3) a positive photosensitive composition as described in item (1) or (2) above, wherein the resin (B) is a resin which, is decomposed by the action of an acid to increase solubility in an alkaline developing solution and has at least one repeating unit represented by formulae (IVb), (Vb) and (VIb) as described in item (2) above and at least one repeating unit represented by the following formulae (VIIb), (VIIIb) and (IXb):

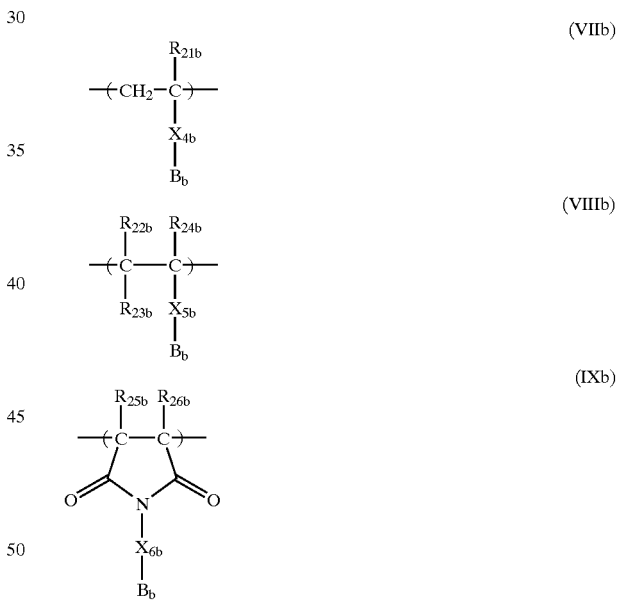

wherein $R_{21b}$, $R_{22b}$ and $R_{24b}$ to $R_{26b}$, which may be the same or different, each represents a hydrogen atom, a halogen atom, a cyano group, an alkyl group or a haloalkyl group; $R_{23b}$ represents a cyano group, $-CO-OR_{27b}$ or $-CO-NR_{28b}R_{29b}$; $X_{4b}$, $X_{5b}$ and $X_{6b}$, which may be the same or different, each represents a single bond, an optionally substituted divalent alkylene, alkenylene or cycloalkylene group, $-O-$, $-SO_2-$, $-O-CO-R_{30b}-$, $-CO-O-R_{31b}-$ or $-CO-NR_{32b}-R_{33b}-$; $R_{27b}$ represents a hydrogen atom, an optionally substituted alkyl, cycloalkyl or alkenyl group, or a group which is decomposed by the action of an acid to increase solubility in an alkaline developing solution; $R_{28b}$, $R_{29b}$ and $R_{32b}$, which may be the same or different, each represents a hydrogen atom or an optionally substituted alkyl, cycloalkyl or alkenyl group, or $R_{28b}$ and $R_{29b}$ may be bonded to each other to form a ring; $R_{30b}$, $R_{31b}$ and $R_{33b}$, which may be the same or different, each represents a single bond or a divalent alkylene, alkenylene or cycloalkylene group, or a divalent group formed by combining each of these groups with an ether, ester, amido, urethane or ureido group; and $B_b$ is a group which is decomposed by the action of an acid to increase solubility in an alkaline developing solution;

(4) a positive photosensitive composition as described in any one of items (1) to (3) above, wherein the resin (B) further comprises a carboxy group;

(5) a positive photosensitive composition as described in item (4) above, wherein the resin (B) further comprises at least one repeating unit represented by the following formulae (Xb), (XIb) and (XIIb) each having a carboxy group:

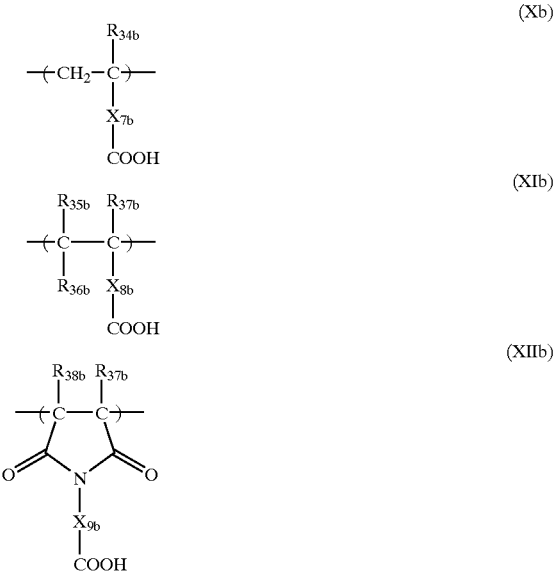

wherein $R_{34b}$, $R_{35b}$ and $R_{37b}$ to $R_{39b}$, which may be the same or different, each represents a hydrogen atom, a halogen atom, a cyano group, an alkyl group or a haloalkyl group; $R_{36b}$ represents a cyano group, a carboxy group, —CO—$OR_{40b}$ or —CO—$NR_{41b}R_{42b}$; $X_{7b}$, $X_{8b}$ and $X_{9b}$, which may be the same or different, each represents a single bond, an optionally substituted divalent alkylene, alkenylene or cycloalkylene group, —O—, —SO$_2$—, —O—CO—$R_{43b}$—, —CO—O—$R_{44b}$— or —CO—$NR_{45b}$—$R_{46b}$—; $R_{40b}$ represents an optionally substituted alkyl, cycloalkyl or alkenyl group; $R_{41b}$, $R_{42b}$ and $R_{45b}$, which may be the same or different, each represents a hydrogen atom or an optionally substituted alkyl, cycloalkyl or alkenyl group, or $R_{41b}$ and $R_{42b}$ may be bonded to each other to form a ring; $R_{43b}$, $R_{44b}$ and $R_{46b}$, which may be the same or different, each represents a single bond or a divalent alkylene, alkenylene or cycloalkylene group, or a divalent group formed by combining each of these groups with an ether, ester, amido, urethane or ureido group;

(6) a positive photosensitive composition as described in any one of items (1) to (5) above, wherein the composition further comprises a low molecular weight acid-decomposable dissolution inhibiting compound whose solubility in an alkaline developing solution increases by the action of an acid and which has a group capable of being decomposed by the action of an acid and a molecular weight of 3,000 or less;

(7) a positive photosensitive composition as described in any of items (1) to (6) above, wherein the composition is suitable for exposure using far ultraviolet light having a wavelength of 250 nm or less as an exposure light source; and (8) a positive photosensitive composition as described in item (7) above, wherein the composition is suitable for exposure using far ultraviolet light having a wavelength of 220 nm or less as an exposure light source.

DETAILED DESCRIPTION OF THE INVENTION

Now, the first embodiment of the photosensitive composition according to the present invention will be described in more detail below.

Component (B): a resin having a structure represented by formula (I), (II) or (III) described above and a group which is decomposed by the action of an acid to increase solubility in an alkaline developing solution (hereinafter also referred to as an acid-decomposable group sometimes):

In the present invention, the structure represented by formula (I), (II) or (III) describe above and the acid-decomposable group each may be bonded to any site of the base resin. Specifically, the structure represented by formula (I), (II) or (III) describe above and the acid-decomposable group may be bonded to different repeating units in the base resin. Alternatively, the base resin may contain repeating units each having both the structure represented by formula (I), (II) or (III) describe above and the acid-decomposable group. Further, the structure represented by formula (I), (II) or (III) describe above and the acid-decomposable group are present in the base resin in these two manners described above. Moreover, the structure represented by formula (I), (II) or (III) describe above may contain the acid-decomposable group.

In the formula (I), (II) or (III) describe above, the optionally substituted straight-chain, branched chain or cyclic alkyl group represented by $R_1$, $R_2$, $R_3$, $R_4$ or $R_5$ is preferably an optionally substituted straight-chain, branched chain or cyclic alkyl group having from 1 to 12 carbon atoms, for example, methyl, ethyl, propyl, n-butyl, sec-butyl, hexyl, 2-ethylhexyl, octyl, cyclopropyl or cyclopentyl.

$R_1$ and $R_2$ may be bonded to each other to form a monocyclic or polycyclic ring which may contain an oxygen atom, a sulfur atom, a nitrogen atom, a ketone bond, an ester bond, an imido bond or an amido bond as a linking group. The ring structure includes a 5-membered to 8-membered ring and a polycyclic structure containing two or more 5-membered to 8-membered rings. Specific examples thereof include cyclohexane ring, cyclopentane ring, tetrahydropyran ring, piperidine ring, retrahydropyrrole ring, cyclohexanone ring and butyrolactone ring.

The alkoxy group represented by $R_3$, $R_4$ or $R_5$ is preferably an optionally substituted alkoxy group having from 1 to 8 carbon atoms, for example, methoxy, ethoxy, hydroxyethoxy, propoxy, hydroxypropoxy or butoxy.

Two or more of $R_3$, $R_4$ and $R_5$ may be bonded to each other to form a monocyclic or polycyclic ring which may contain an oxygen atom, a sulfur atom, a nitrogen atom, a ketone bond, an ester bond, an imido bond or an amido bond as a linking group. The ring structure include those described for $R_1$ and $R_2$.

$R_1$, $R_2$, $R_3$, $R_4$ or $R_5$ may have a substituent, for example, an alkyl group, an alkenyl group, an alkoxy group, an acyloxy group or a halogen atom.

X represents a single bond or a divalent linking group. The divalent linking group includes, for example, an oxygen atom, a sulfur atom, —NH— and a divalent organic group. The divalent organic group includes, for example, an optionally substituted straight-chain, branched chain or cyclic alkylene or alkenylene group, —COO—, —CO—, —SO$_2$—, —SO$_2$NH—, —CONH—, —CONHSO$_2$—, —N(alkyl)-(wherein alkyl preferably represents an alkyl group having from 1 to 8 carbon atoms, for example, methyl, ethyl, propyl, butyl or octyl), —COS—, or a divalent linking group composed of two or more of these groups.

The alkylene group included in X is preferably an optionally substituted alkylene group having from 1 to 8 carbon atoms, for example, methylene, ethylene, propylene, butylene, hexylene or octylene. The cyclic alkylene group included in X is preferably an optionally substituted cyclo alkylene group having from 5 to 8 carbon atoms, for example, cyclopenthylene or cyclohexylene. The alkenylene group included in X is preferably an optionally substituted alkenylene group having from 2 to 6 carbon atoms, for example, ethenylene, propenylene or butenylene.

Y represents an oxygen atom, a sulfur atom, —NH—, —N(OH)— or —N(alkyl)-(wherein alkyl preferably represents an alkyl group having from 1 to 8 carbon atoms, for example, methyl, ethyl, propyl, butyl or octyl). An oxygen atom or a sulfur atom is preferred.

n represents an integer of from 1 to 3.

In the resin according to the present invention, although a repeating structural unit having the group represented by any one of formulae (I) to (III) may be any unit having the group represented by one of formulae (I) to (III), a repeating structural unit represented by any one of the following formulae (IV) to (VI) is preferred. Among others, the repeating structural unit represented by formula (IV) is more preferred.

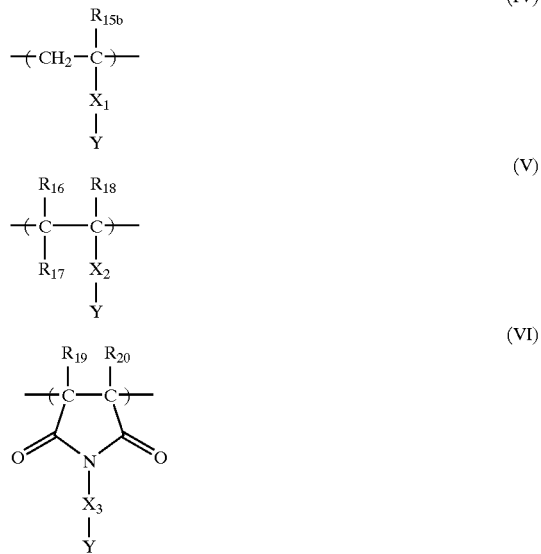

wherein $R_{15}$, $R_{16}$ and $R_{18}$ to $R_{20}$, which may be the same or different, each represents a hydrogen atom, a halogen atom, a cyano group, an alkyl group or a haloalkyl group; $R_{17}$ represents a cyano group, —CO—OR$_{27}$ or —CO—NR$_{28}$R$_{29}$; $X_1$, $X_2$ and $X_3$, which may be the same or different, each represents a single bond, an optionally substituted divalent alkylene, alkylene or cycloalkylene group, —CO—, —SO$_2$—, —O—CO—R$_{30}$—, —CO—O—R$_{31}$— or —CO—NR$_{32}$—R$_{33}$—; $R_{27}$ represents a hydrogen atom, an optionally substituted alkyl, cycloalkyl or alkenyl group, or a group which is decomposed by the action of an acid to increase solubility in an alkaline developing solution; $R_{28}$, $R_{29}$ and $R_{32}$, which may be the same or different, each represents a hydrogen atom or an optionally substituted alkyl, cycloalkyl or alkenyl group, or $R_{28}$ and $R_{29}$ may be bonded to each other to form a ring; $R_{30}$, $R_{31}$ and $R_{33}$, which may be the same or different, each represents a single bond or a divalent alkylene, alkenylene or cycloalkylene group, or a divalent group formed by combining each of these groups with an ether, ester, amido, urethane or ureido group; and Y represents the structure represented by formula (I), (II) or (III) described above.

Preferred examples of the alkyl group represented by each of $R_{27}$ to $R_{29}$ and $R_{32}$ include an optionally substituted alkyl group having from 1 to 8 carbon atoms, such as methyl, ethyl, propyl, n-butyl, sec-butyl, hexyl, 2-ethylhexyl, and octyl.

Preferred examples of the cycloalkyl group represented by each of $R_{27}$ to $R_{29}$ and $R_{32}$ include an optionally substituted cycloalkyl group such having from 3 to 8 carbon atoms, such as cyclopropyl, cyclopentyl, and cyclohexyl.

Preferred examples of the alkenyl group represented by each of $R_{27}$ to $R_{29}$ and $R_{32}$ include an optionally substituted alkenyl group having from 2 to 6 carbon atoms, such as vinyl, propenyl, allyl, butenyl, pentenyl, hexenyl, and cyclohexenyl.

In the structure represented by formula (I), (II) or (III), the linking group represented by X may be bonded to the cyclic structure in any position thereof.

Preferred examples of the alkyl group represented by each of $R_{15}$, $R_{16}$ and $R_{18}$ to $R_{20}$ include an optionally substituted alkyl group having from 1 to 4 carbon atoms, such as methyl, ethyl, propyl, n-butyl, and sec-butyl.

Preferred examples of the haloalkyl group represented by each of $R_{15}$, $R_{16}$ and $R_{18}$ to $R_{20}$ include an alkyl group having from 1 to 4 carbon atoms and substituted with one or more of fluorine, chlorine, and bromine atoms. Specific examples thereof include fluoromethyl, chloromethyl, bromomethyl, fluoroethyl, chloroethyl, and bromoethyl.

Preferred examples of the alkylene group represented by each of $X_1$, $X_2$ and $X_3$ include an optionally substituted alkylene group having from 1 to 8 carbon atoms, such as methylene, ethylene, propylene, butylene, hexylene, and octylene.

Preferred examples of the alkenylene group represented by each of $X_1$, $X_2$ and $X_3$ include an optionally substituted alkenylene group having from 2 to 6 carbon atoms, such as ethenylene, propenylene, and butenylene.

Preferred examples of the cycloalkylene group represented by each of $X_1$, $X_2$ and $X_3$ include an optionally substituted cycloalkylene group having from 5 to 8 carbon atoms, such as cyclopentylene and cyclohexylene.

Examples of the alkylene, alkenylene and cycloalkylene groups represented by each of $R_{30}$, $R_{31}$ and $R_{33}$ include the same alkylene, alkenylene and cycloalkylene groups as those described above, and further include divalent groups each formed by combining any one of those groups with at least one of ether, ester, amido, urethane and ureido groups.

Preferred examples of the ring formed by bonding $R_{28}$ and $R_{29}$ each other together with the nitrogen atom include five- to eight-membered rings. Specific examples thereof include pyrrolidine, piperidine, and piperazine.

$R_{27}$ also represents a group which is decomposed by the action of an acid to increase solubility in an alkaline developing solution (acid-decomposable group).

In the resin according to the present invention, the acid-decomposable group may be contained in the structure of group represented by one of formulae (I) to (III) or may be contained in a repeating unit having a group represented by any one of formulae (I) to (III) (for example, as $R_{27}$), or may be contained in other repeating units. The acid-decomposable groups may be contained in two or more kinds of such structures or units.

Examples of the acid-decomposable group include a group which is hydrolyzed by the action of an acid to form an acid and a group which releases a carbon cation by the action of an acid to form an acid. Preferred examples thereof include groups represented by the following formulae (XIII) and (XIV). Such acid-decomposable groups serve to impart excellent storage stability.

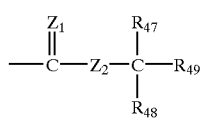 (XIII)

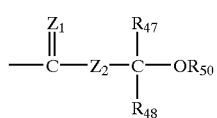 (XIV)

wherein $R_{47}$ to $R_{49}$, which may be the same or different, each represents a hydrogen atom or an optionally substituted alkyl, cycloalkyl or alkenyl group, provided that at least one of $R_{47}$ to $R_{49}$ in formula (XIII) is not a hydrogen atom; $R_{50}$ represents an optionally substituted alkyl, cycloalkyl, or alkenyl group; or two of $R_{47}$ to $R_{49}$ in formula (XIII) or two of $R_{47}$, $R_{48}$ and $R_{50}$ in formula (XIV) may be bonded to each other to form a three- to eight-membered cyclic structure comprising carbon atoms and optionally containing one or more heteroatoms; and $Z_1$ and $Z_2$, which may be the same or different, each represents an oxygen atom or a sulfur atom.

Specific examples of the cyclic structure include cyclopropyl, cyclopentyl, cyclohexyl, cycloheptyl, 1-cyclohexenyl, 2-tetrahydrofuranyl and 2-tetrahydropyranyl.

Preferred examples of the alkyl, cycloalkyl and alkenyl groups are the same as those described hereinabove with regard to $R_{27}$.

Preferred examples of the substituent which may be possessed by the substituents described above in detail include a hydroxy group, a halogen atom (fluorine, chlorine, bromine and iodine), a nitro group, a cyano group, an amido group, a sulfonamido group, an alkyl group as described for $R_{27}$ above, an alkoxy group such as methoxy, ethoxy, hydroxyethoxy, propoxy, hydroxypropoxy and butoxy, an alkoxycarbonyl group such as methoxycarbonyl and ethoxycarbonyl, an acyl group such as formyl, acetyl and benzoyl, an acyloxy group such as acetoxy and butyryloxy, and a carboxy group.

The content of repeating unit having the alicyclic group represented by formula (I), (II) or (III) (preferably a repeating unit represented by any one of formulae (IV) to (VI)) in the resin according to the present invention may be controlled while taking account of the balance among the dry etching resistance, developing property with alkali and the like. However, the content thereof is preferably 20% by mole or more, more preferably from 30 to 80% by mole, yet more preferably from 40 to 70% by mole, based on the total repeating units.

Specific examples of the repeating unit represented by any one of formulae (IV) to (VI) are set forth below as (a1) to (a50). However, the present invention should not be construed as being limited thereto.

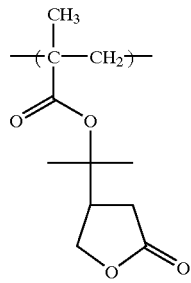 (a1)

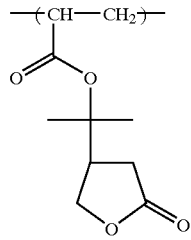 (a2)

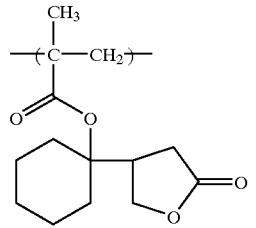 (a3)

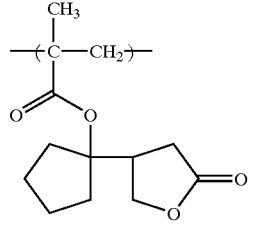 (a4)

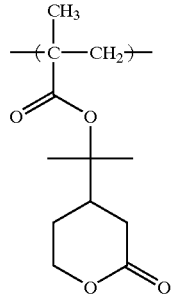 (a5)

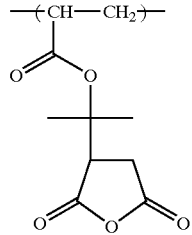 (a6)

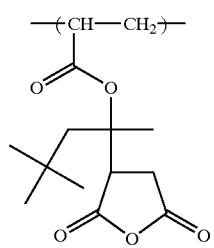 (a7)
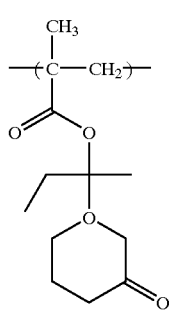 (a8)
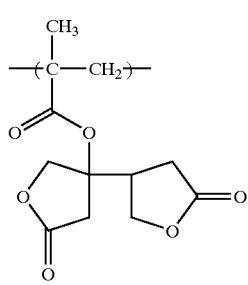 (a9)
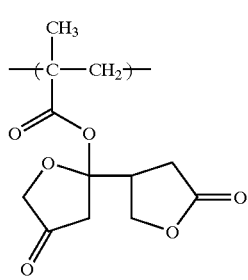 (a10)
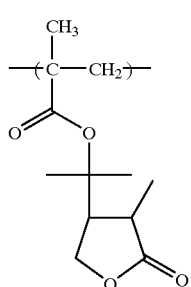 (a11)
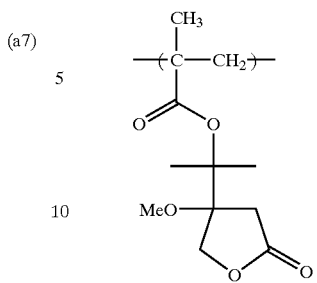 (a12)
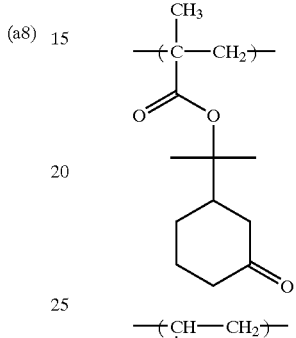 (a13)
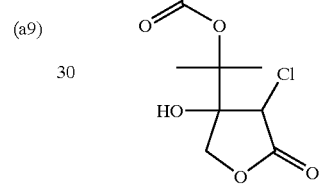 (a14)
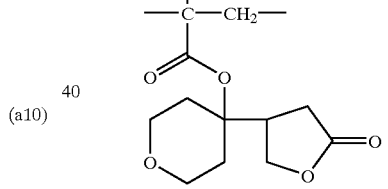 (a15)
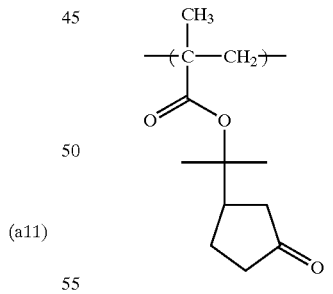 (a16)
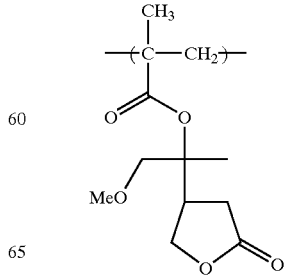 (a17)

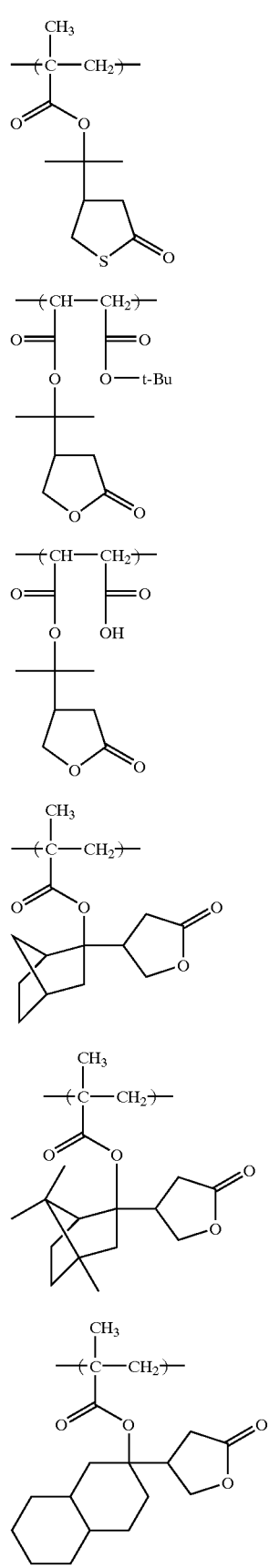
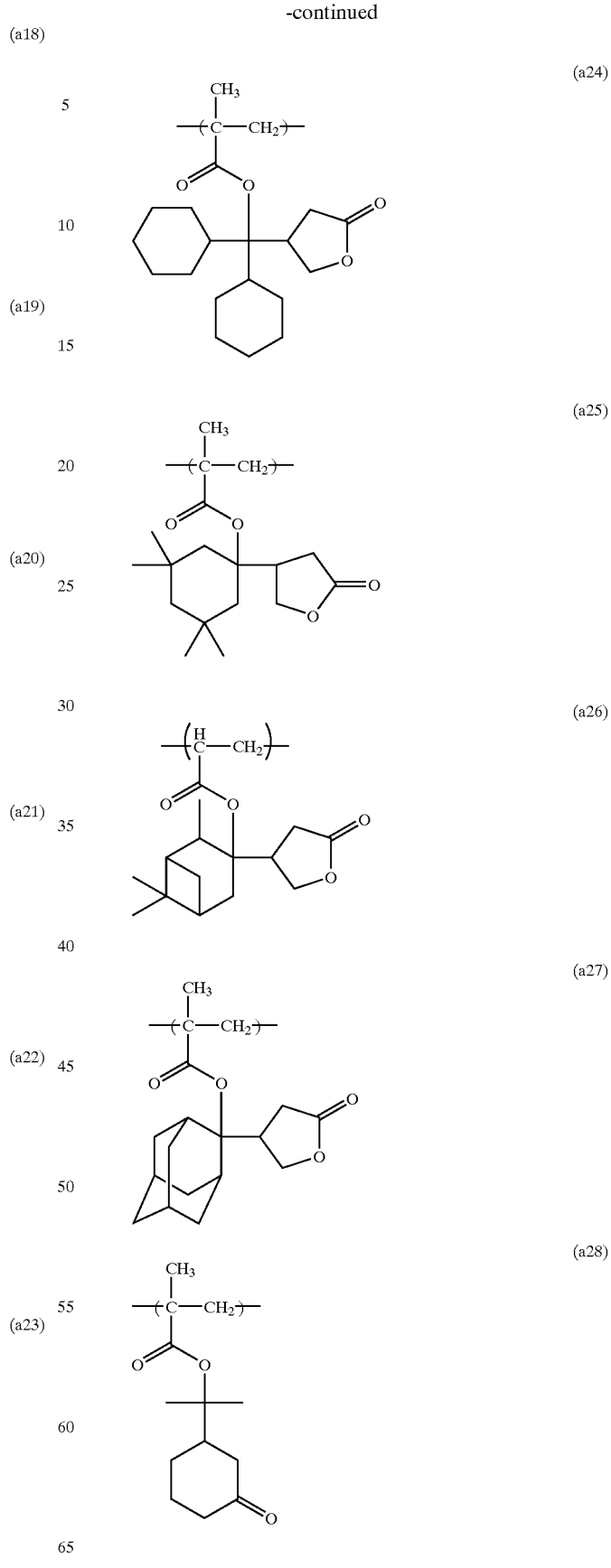

-continued

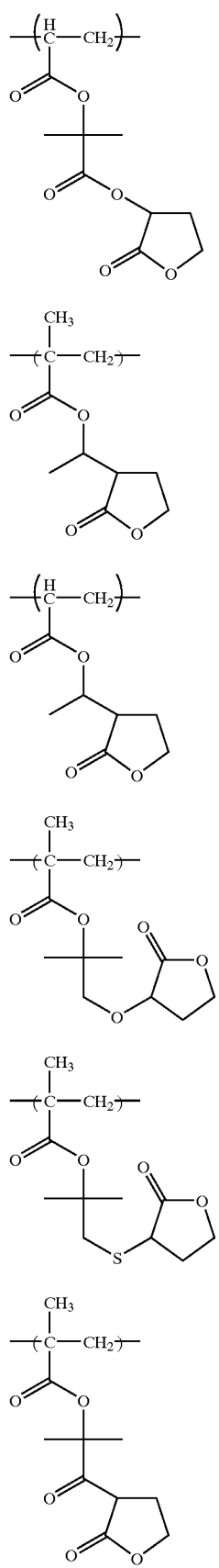
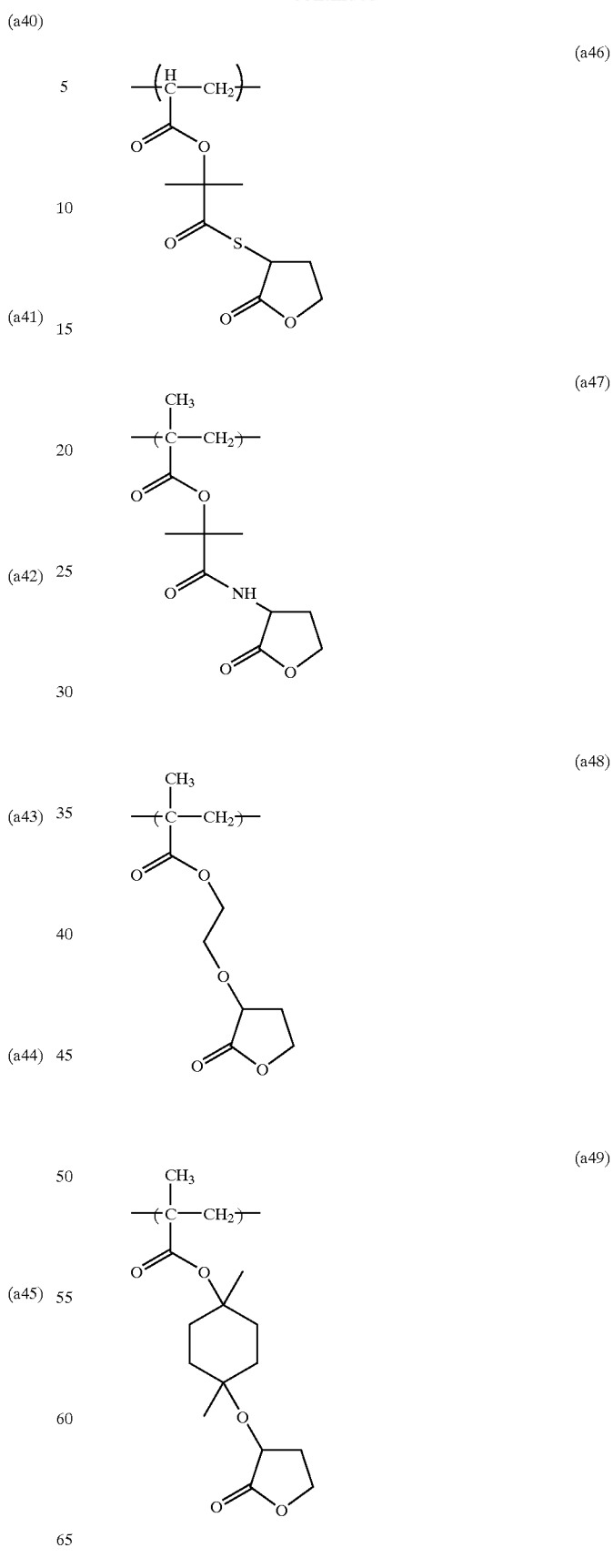

(a50)
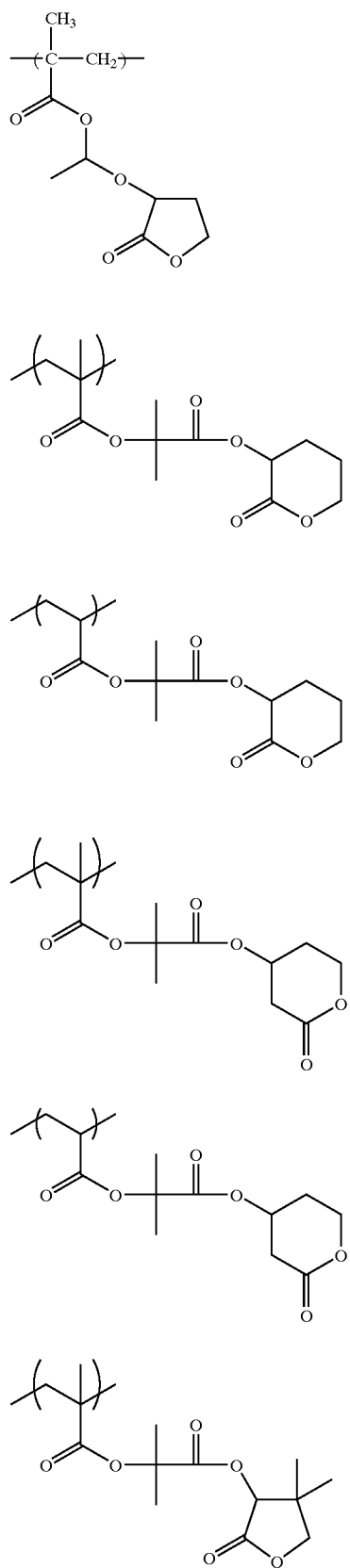
(a51)
(a52)
(a53)
(a54)
(a55)
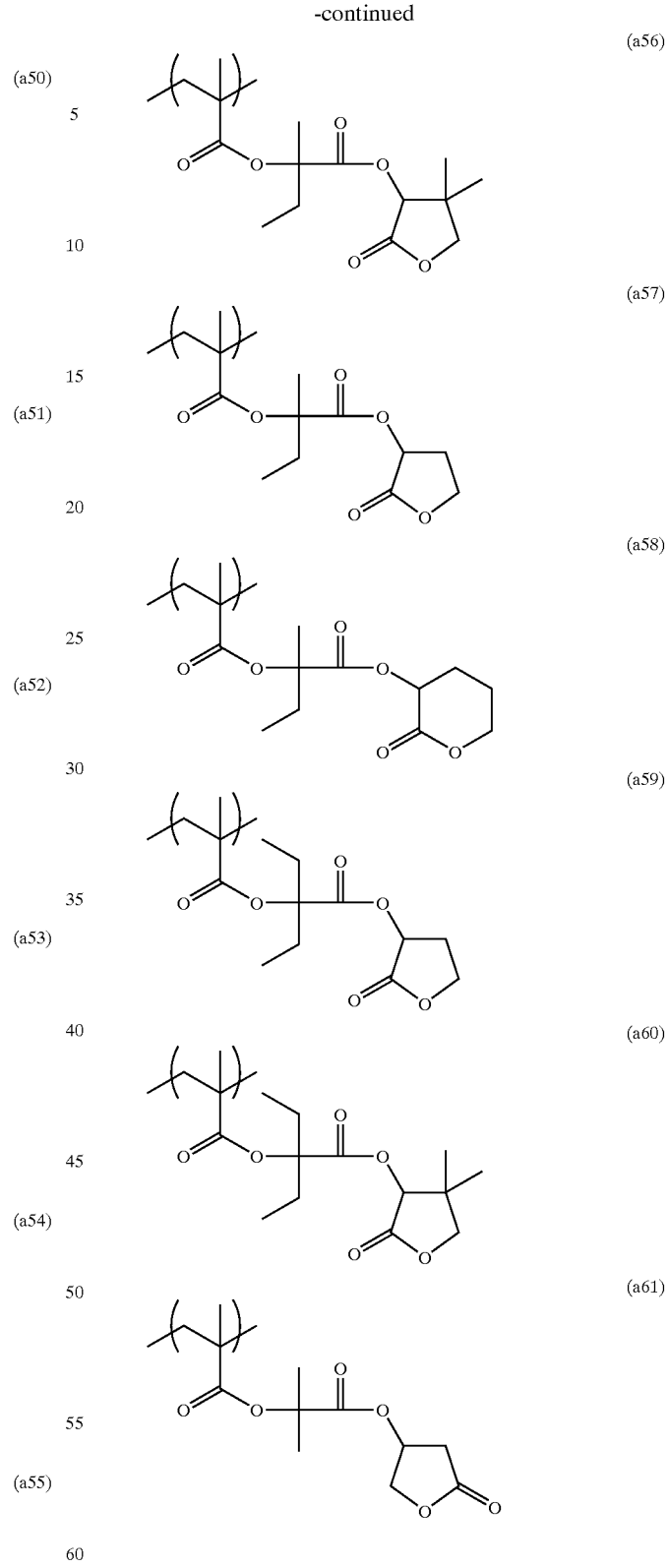
(a56)
(a57)
(a58)
(a59)
(a60)
(a61)
Of the repeating structural units according to the present invention, those having the following structure which includes a tertiary ester group as a connecting group are excellent in the acid-decomposability and particularly preferred in view of sensitivity.

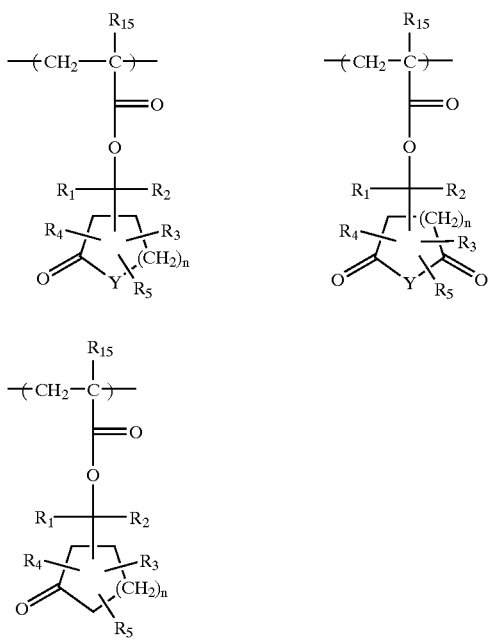

wherein $R_1$ to $R_5$, Y, n and $R_{15}$ each has the same meaning as defined above.

The resin having the structure represented by formula (a) wherein the ester linking group is bound to the lactone exhibits a high hydrophilic properties due to the synergic effect of adjacent oxygen atoms and is preferred in terms of sensitivity, adhesion to substrate, and reduction of development defects. Furthermore, the resin having the structure represented by formula (b) wherein the ester linking group is bound to the α-position of the lactone is preferred in terms of sensitivity, adhesion to substrate, reduction of development defects, and resolution, since the lactone decomposes with an alkali developing solution to produce carboxylic acid, so that the dissolution rate of the exposed portion increases.

Component (C): a low molecular weight compound having a molecular weight of 3,000 or less and having a group which is decomposed by the action of an acid to increase solubility in an alkaline developing solution:

The acid-decomposable dissolution inhibiting compound for use in the present invention is a low molecular weight compound which contains at least one structure represented by formula (I), (II) or (III), has a molecular weight of 3,000 or less and may further contain an acid-decomposable group, when it is employed in combination with an alkaline-soluble resin. On the other hand, when the compound is used in combination with the resin according to the present invention, it is a compound which contains an acid-decomposable group, may or may not contain the group represented by any one of formulae (I) to (III), and has a molecular weight of 3,000 or less.

In order to prevent reduction in transmissibility particularly at 220 nm or less, an alicyclic or aliphatic compound such as a cholic acid derivative described in *Proceeding of SPIE*, 2724, 355 (1996) is preferred. In the present invention, when the acid-decomposable dissolution inhibiting compound is used, the amount thereof added is from 3 to 50% by weight, preferably from 5 to 40% by weight, more preferably form 10 to 35% by weight, based on the whole solid content of the photosensitive composition.

Specific examples of the low molecular weight compound having a molecular weight of 3,000 or less and containing the group represented by any one of formulae (I) to (III) and a group which is decomposed by the action of an acid to increase solubility in an alkaline developing solution are set forth below, but the present invention should not be construed as being limited thereto.

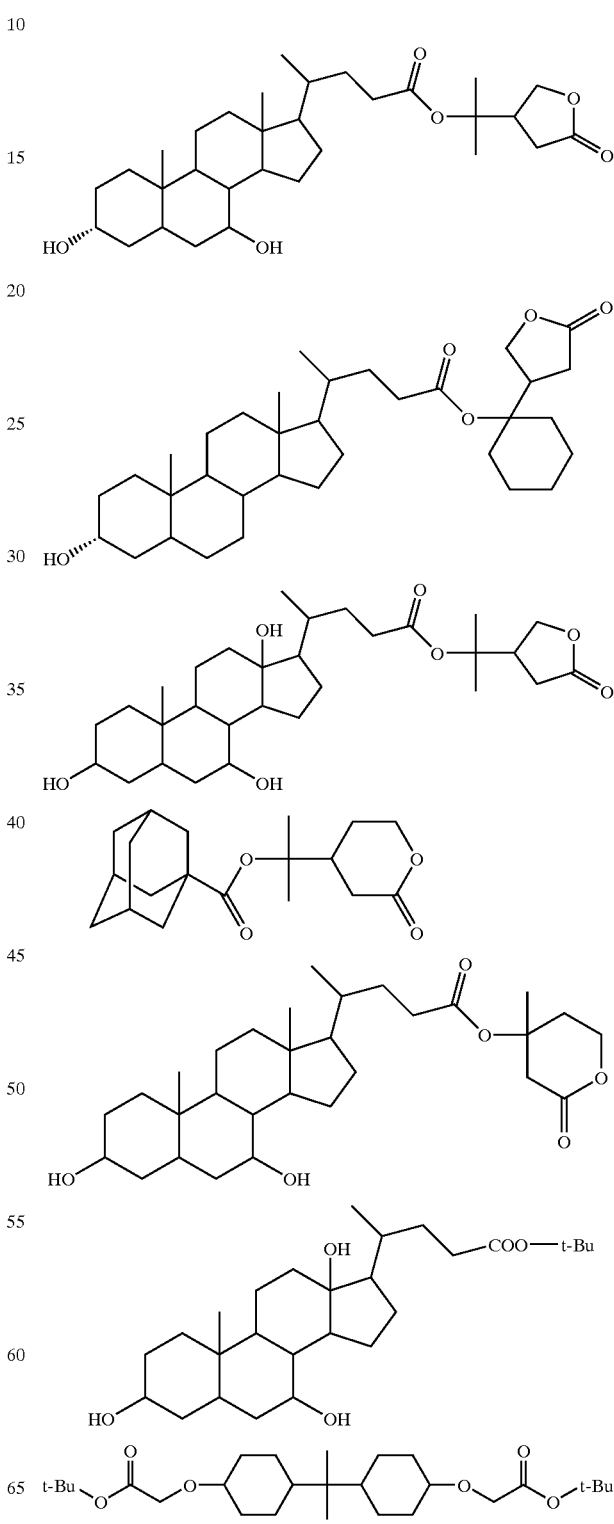

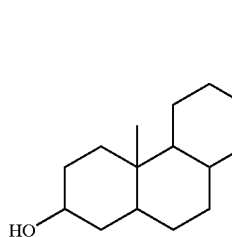

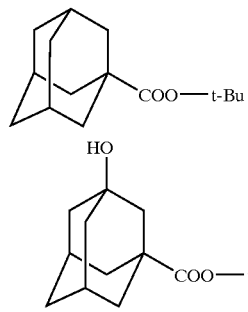

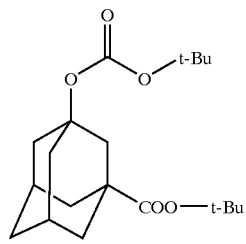

Component (D): a resin which has a group that is decomposed by the action of an acid to increase solubility in an alkaline developing solution and contains at least one repeating unit having a structure represented by formula (I), (II) or (III) described above and a repeating unit having a monoalicyclic or polyalicyclic hydrocarbon moiety:

The objects of the present invention can be attained by using the resin which contains at least one repeating unit having a structure represented by formula (I), (II) or (III) described above and a repeating unit having a monoalicyclic or polyalicyclic hydrocarbon moiety as the resin having a group which is decomposed by the action of an acid to increase solubility in an alkaline developing solution in order to increase dry etching resistance.

The structural unit having the monoalicyclic or polyalicyclic hydrocarbon moiety used in resin (D) is preferably selected from structural units having an alicyclic group, represented by the following formula (VII), (VIII) or (IX):

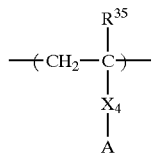

(VII)

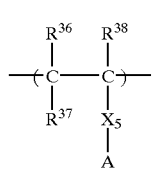

(VIII)

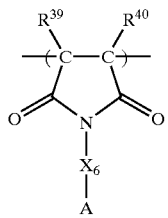

(IX)

wherein $R_{35}$, $R_{36}$ and $R_{38}$ to $R_{40}$, which may be the same or different, each represents a hydrogen atom, a halogen atom, a cyano group, an alkyl group or a haloalkyl group; $R_{37}$ represents a cyano group, —CO—O$R_{47}$ or —CO—N$R_{48}R_{49}$; $X_4$, $X_5$ and $X_6$, which may be the same or different, each represents a single bond, an optionally substituted divalent alkylene, alkenylene or cycloalkylene group, —CO—, —SO$_2$—, —O—CO—$R_{50}$—, —CO—O—$R_{51}$— or —CO—N$R_{52}$—$R_{53}$—; $R_{47}$ represents a hydrogen atom, an optionally substituted alkyl, cycloalkyl or alkenyl group, or a group which is decomposed by the action of an acid to increase solubility in an alkaline developing solution; $R_{48}$, $R_{49}$ and $R_{52}$, which may be the same or different, each represents a hydrogen atom or an optionally substituted alkyl, cycloalkyl or alkenyl group, or $R_{48}$ and $R_{49}$ may be bonded to each other to form a ring; $R_{50}$, $R_{51}$ and $R_{53}$, which may be the same or different, each represents a single bond or a divalent alkylene, alkenylene or cycloalkylene group, or a divalent group formed by combining each of these groups with an ether, ester, amido, urethane or ureido group; and A represents a monoalicyclic or polyalicylic group.

Details of the substituents represented by $R_{35}$ to $R_{40}$, $R_{47}$ to $R_{53}$ and $X_4$ to $X_6$ are same as those described for $R_{15}$ to $R_{20}$, $R_{27}$ to $R_{33}$ and $X_1$ to $X_3$ in formulae (IV) to (VI) above, respectively. Preferred examples thereof are also same as those described above.

The monoalicyclic group represented by A includes an optionally substituted monoalicyclic group having 3 or more carbon atoms, for example, cyclopropane, cyclobutane, cyclopentane or cyclohexane, preferably an optionally substituted monoalicyclic group having from 3 to 8 carbon atoms.

The polyalicyclic group represented by A includes an optionally substituted polyalicyclic group having 5 or more carbon atoms, for example, bicyclo-, tricyclo- or tetra-cycloalicyclic group, preferably an optionally substituted polyalicyclic group having from 6 to 30 carbon atoms, more preferably an optionally substituted polyalicyclic group having from 7 to 25 carbon atoms.

Preferred examples of the substituent of the polyalicyclic group include a hydroxyl group, a halogen atom (e.g., fluorine, chlorine, bromine or iodine), a nitro group, a cyano group, an amido group, a sulfonamido group, an alkyl group such as the alkyl group described for $R_{47}$ above, an alkoxy group having from 1 to 8 carbon atoms, for example, methoxy, ethoxy, hydroxyethoxy, propoxy, hydroxypropoxy or butoxy, an alkoxycarbonyl group, for example, methoxycarbonyl or ethoxycarbonyl, an acyl group, for example, formyl, acetyl or benzoyl, an acyloxy group, for example, acetoxy or butyryloxy, and a carboxy group.

Representative structural examples of the polyalicyclic or monoalicyclic moiety in the polyalicyclic or monoalicyclic group are set forth below.

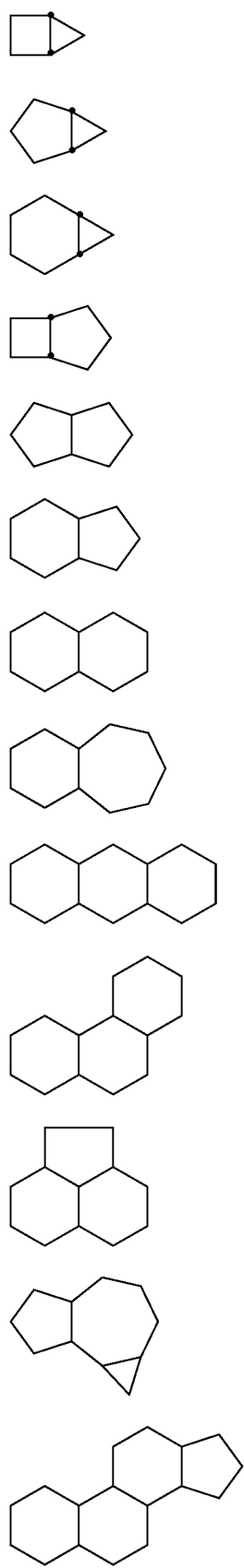
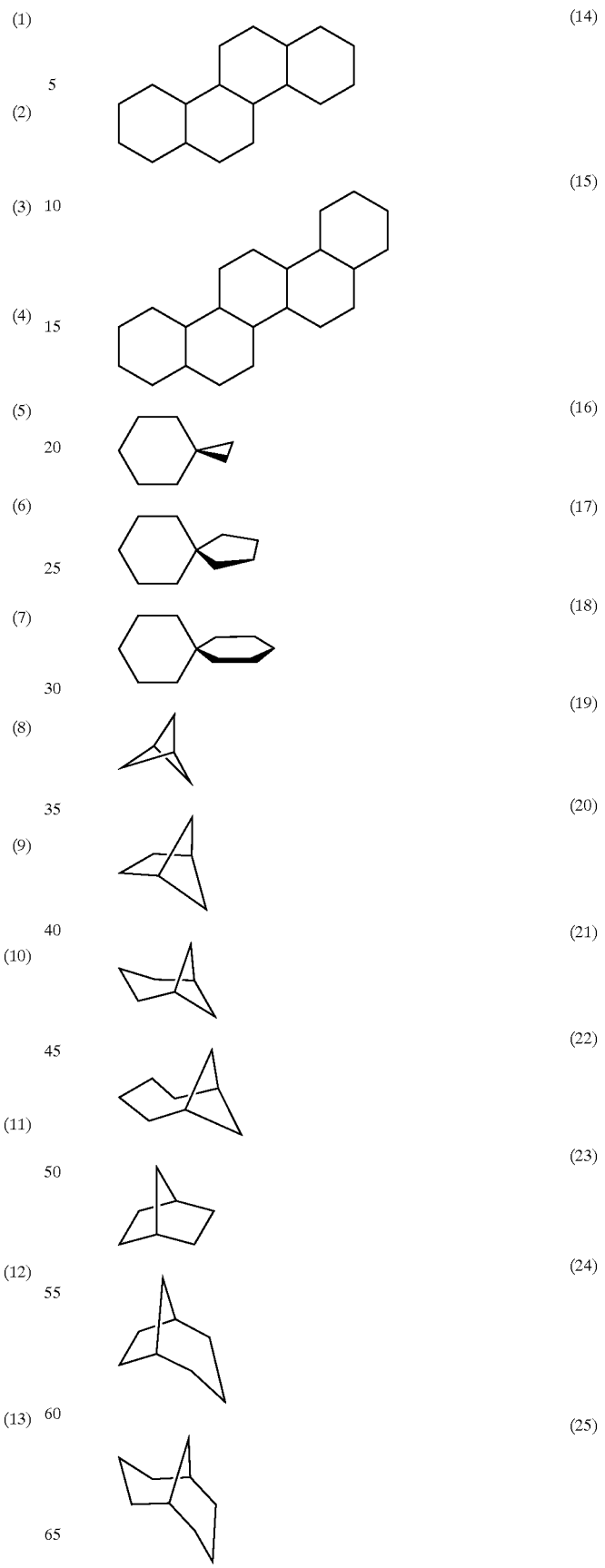

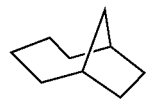 (26)
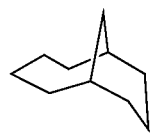 (27)
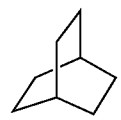 (28)
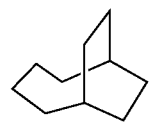 (29)
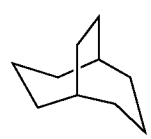 (30)
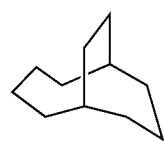 (31)
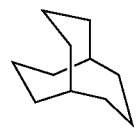 (32)
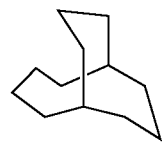 (33)
 (34)
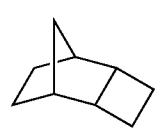 (35)
 (36)
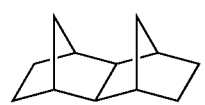 (37)
 (38)
 (39)
 (40)
 (41)
 (42)
 (43)
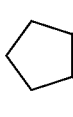 (44)
 (45)
 (46)
 (47)
 (48)
 (49)

The content of the structural unit having the alicyclic group described above (preferably the repeating unit represented by formula (VII), (VIII) or (IX)) in the resin according to the present invention is controlled while taking account of the balance among dry etching resistance, developing property with alkali and the like. However, the content thereof is preferably 20% by mole or more, more preferably from 30 to 80% by mole, still more preferably from 35 to 70% by mole, and particularly preferably from 40 to 60% by mole, based on the whole repeating unit.

In resin (D), a ratio of the repeating unit having the structure represented by formula (I), (II) or (III) to the repeating unit containing a monoalicyclic or polyalicyclic hydrocarbon moiety is preferably from 80:20 to 20:80, more preferably from 70:30 to 30:70. Also, the monoalicyclic or polyalicyclic hydrocarbon moiety may be included in the repeating unit having the structure represented by formula (I), (II) or (III).

Specific examples of the repeating unit represented by any one of formulae (VII), (VIII) and (IX) are set forth below, but the present invention should not be construed as being limited thereto.

(b1)

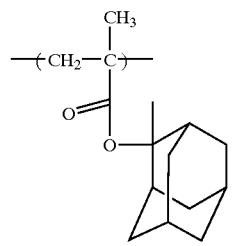

(b2)

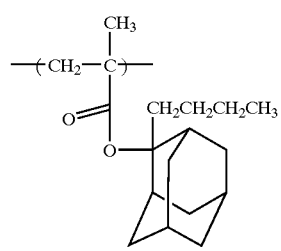

(b3)

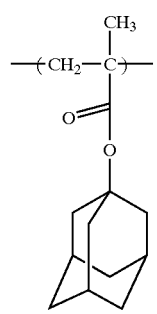

-continued (B4)

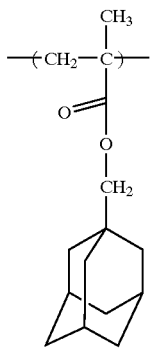

(b5)

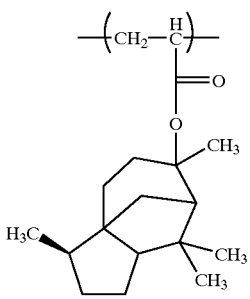

(b6)

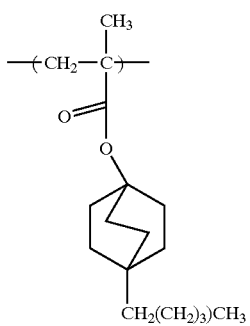

(b7)

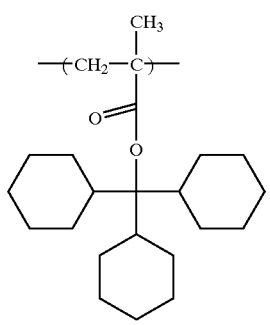

(b8)

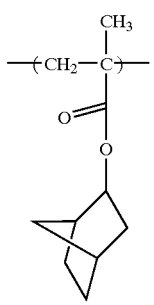

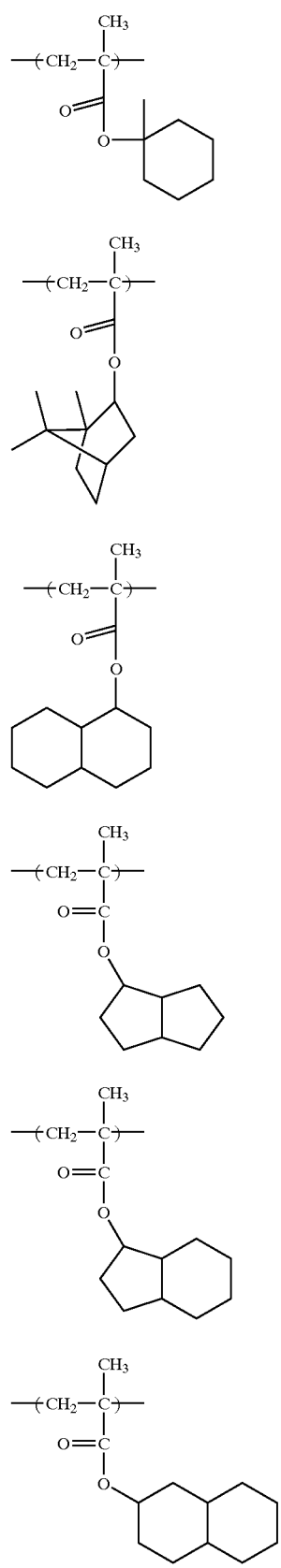
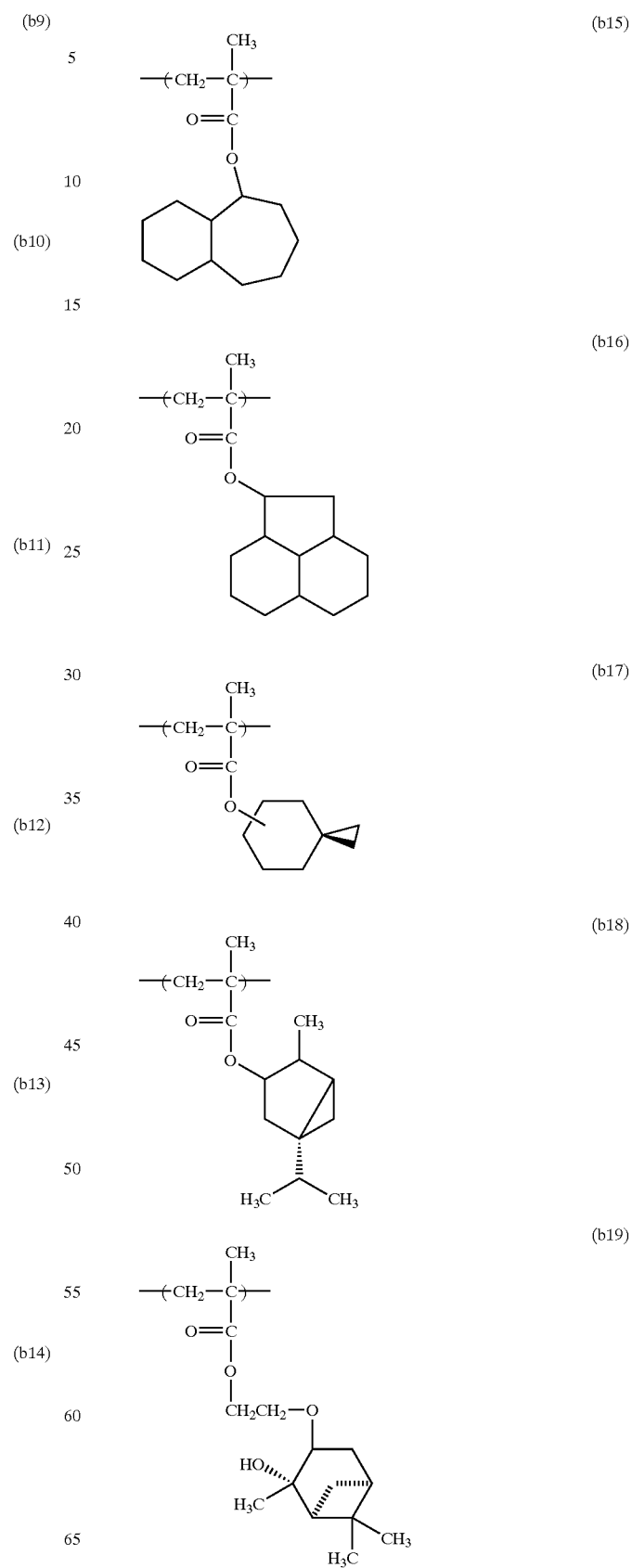

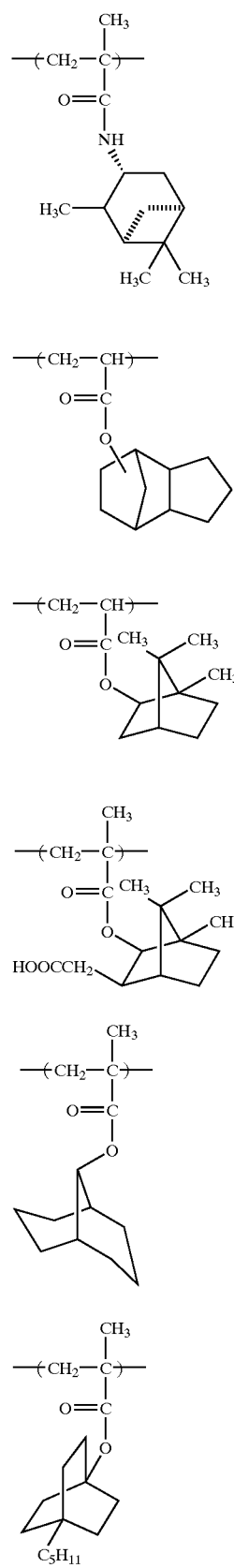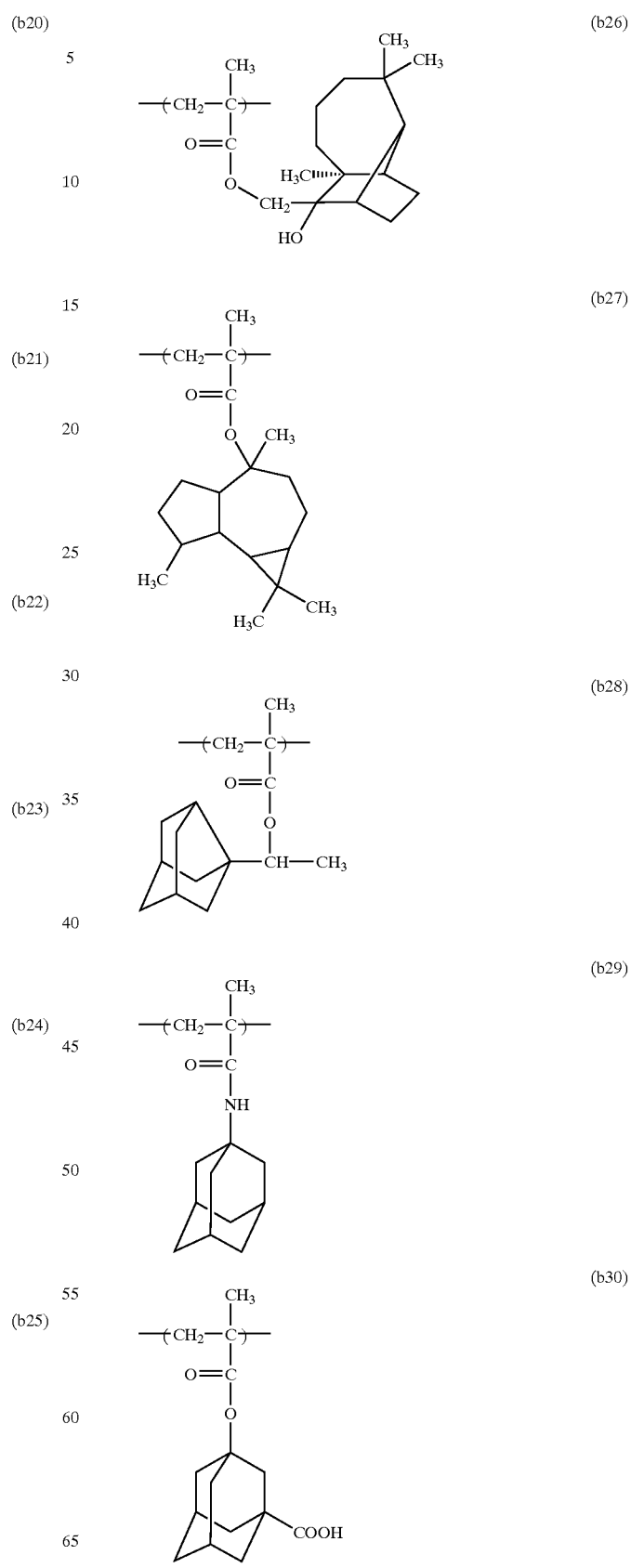

-continued
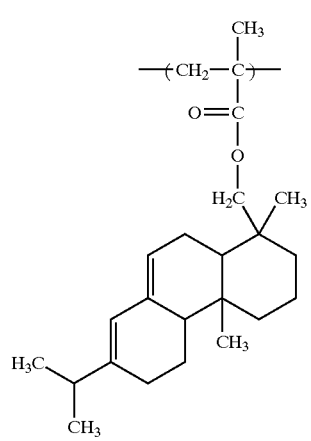
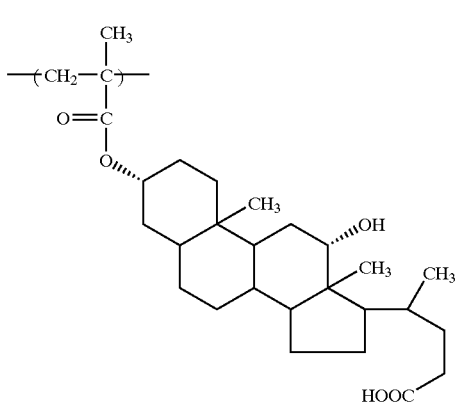
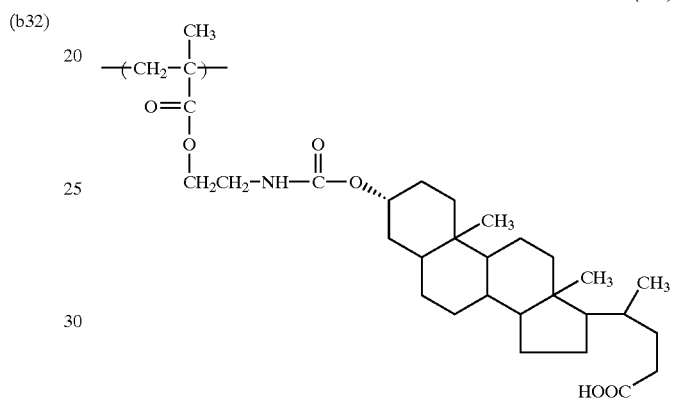
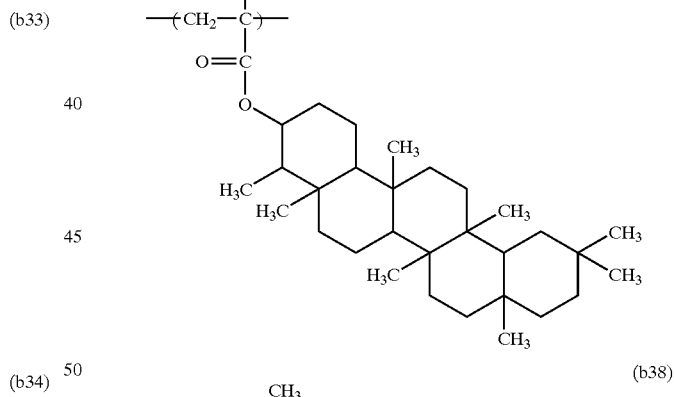
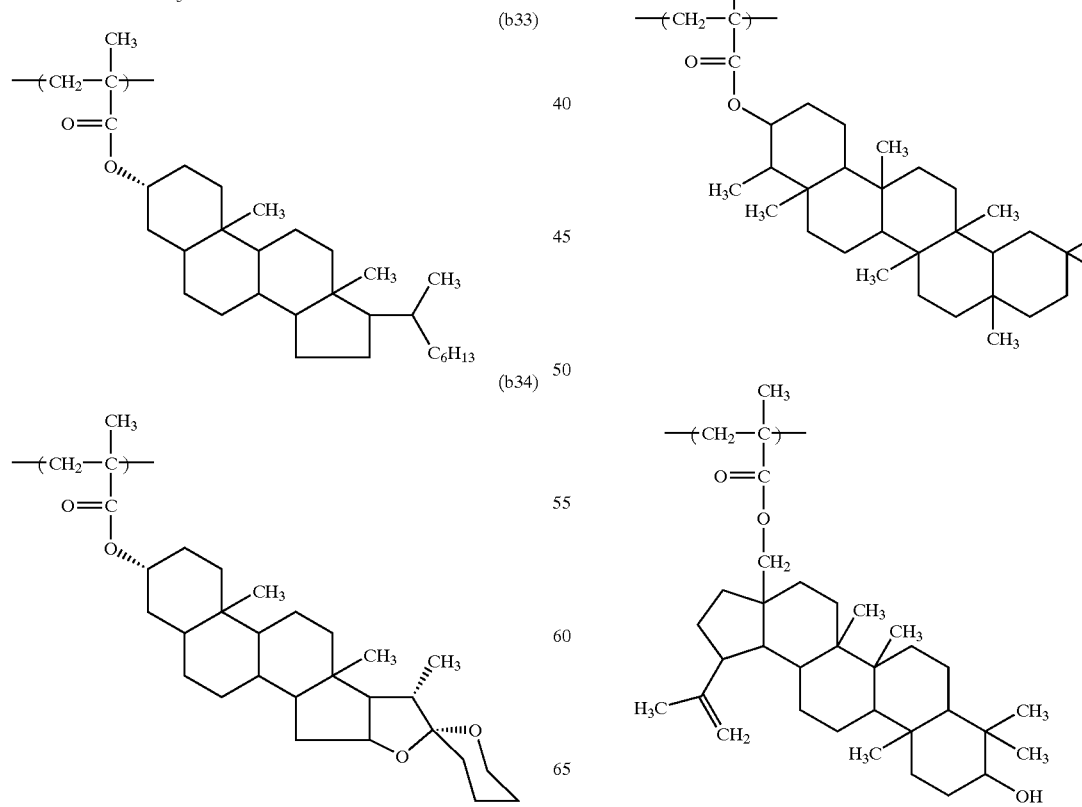

(b39)
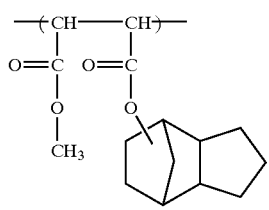
(b40)
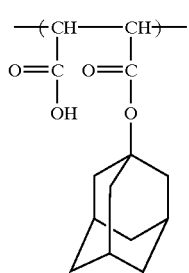
(b41)
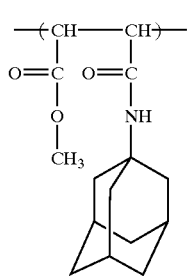
(b42)
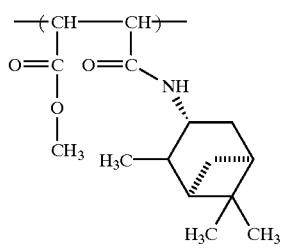
(b43)
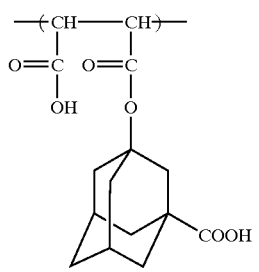
(b44)
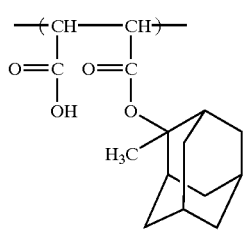
(b45)
(b46)
(b47)
(b48)

(b49) 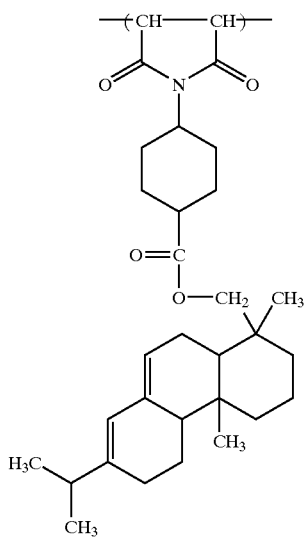

(b50) 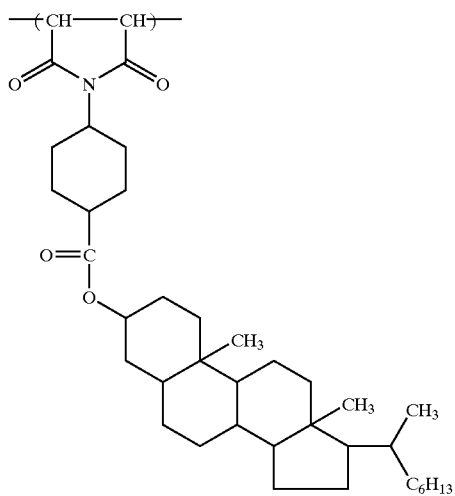

(b51) 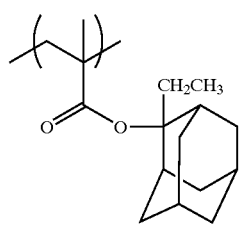

(b52) 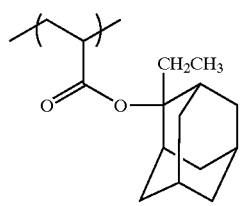

(b53) 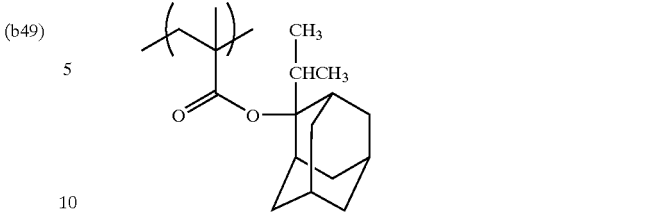

Component (E): a resin which is insoluble in water but soluble in an alkaline developing solution:

A resin which is insoluble in water but soluble in an alkaline developing solution and does not contain an acid-decomposable group (hereinafter simply referred to as an alkali-soluble resin sometimes) can be employed in the positive photosensitive composition according to the present invention in order to increase sensitivity. The alkali-soluble resin containing no acid-decomposable group described above preferably includes a resin containing a repeating unit having a carboxy group (preferably a repeating unit represented by formula (XV), (XVI) or (XVII) shown hereinafter). One or more other monomers as described in <Other polymerizable monomers> described hereinafter may be copolymerized therewith in order to control alkali-solubility. Also, in order to improve dry etching resistance, a repeating unit having an alicyclic group represented by formula (VII), (VIII) or (IX) described above may be copolymerized therewith. Further, both of these copolymerization described above may be effected.

In the present invention, novolak resins or polyhydroxy styrene derivatives may also be employed. However, since these resins have large absorption to light having a wavelength of 250 nm or shorter, it is preferred to use them in the partially hydrogenated form or in an amount of not more than 30% by weight based on the whole amount of resin.

The alkali-soluble resin containing an acid-decomposable group which can be contained in the positive photosensitive composition may comprise at least one repeating unit represented by the following formulae (X), (XI) and (XII):

(X)

(XI)

(XII)

wherein $R_{55}$, $R_{56}$ and $R_{58}$ to $R_{60}$, which may be the same or different, each represents a hydrogen atom, a halogen atom, a cyano group, an alkyl group or a haloalkyl group; $R_{57}$ represents a cyano group, —CO—$OR_{67}$ or —CO—$NR_{68}R_{69}$; $X_7$, $X_8$ and $X_9$, which may be the same or different, each represents a single bond, an optionally substituted divalent alkylene, alkenylene or cycloalkylene group, —CO—, —$SO_2$—, —O—CO—$R_{70}$—, —CO—O—$R_{71}$— or —CO—$NR_{72}$—$R_{73}$—; $R_{67}$ represents a hydrogen atom, an optionally substituted alkyl, cycloalkyl or alkenyl group, or a group which is decomposed by the action of an acid to increase solubility in an alkaline developing solution; $R_{68}$, $R_{69}$ and $R_{72}$, which may be the same or different, each represents a hydrogen atom or an optionally substituted alkyl, cycloalkyl or alkenyl group, or $R_{68}$ and $R_{69}$ may be bonded to each other to form a ring; $R_{70}$, $R_{71}$ and $R_{73}$, which may be the same or different, each represents a single bond or a divalent alkylene, alkenylene or cycloalkylene group, or a divalent group formed by combining each of these groups with an ether, ester, amido, urethane or ureido group; and B is a group which is decomposed by the action of an acid to increase solubility in an alkaline developing solution.

Details of the group which is decomposed by the action of an acid to increase solubility in an alkaline developing solution represented by B are same as those of the acid-decomposable group described for $R_{27}$ in formula (IV), (V) or (VI) above.

Details of the substituents represented by $R_{55}$ to $R_{60}$, $R_{67}$ to $R_{73}$ and $X_7$ to $X_9$ are same as those described for $R_{15}$ to $R_{20}$, $R_{27}$ to $R_{33}$ and $X_1$ to $X_3$ in formulae (IV) to (VI) above, respectively. Preferred examples thereof are also same as those described above.

The content of the repeating unit represented by formula (X), (XI) or (XII) in the resin according to the present invention is controlled while taking account of characteristics such as developing property with alkali, adhesion to a substrate and the like. However, the content thereof is preferably from 0 to 80% by mole, more preferably from 0 to 70% by mole, and still more preferably from 0 to 60% by mole, based on the whole repeating unit.

Specific examples of the repeating unit represented by any one of formulae (X), (XI) and (XII) are set forth below, but the present invention should not be construed as being limited thereto.

(c1)

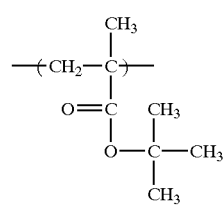

(c2)

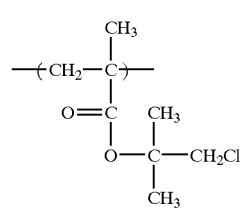

(c3)

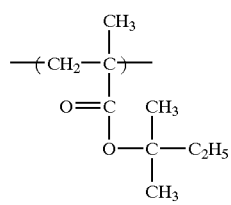

(c4)

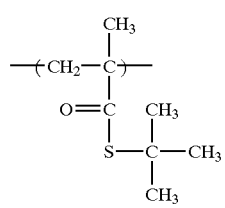

(c5)

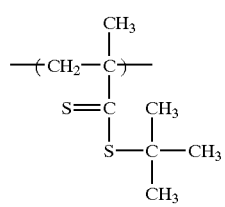

(c6)

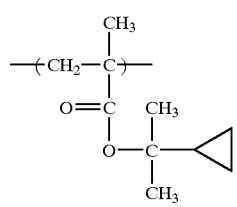

(c7)

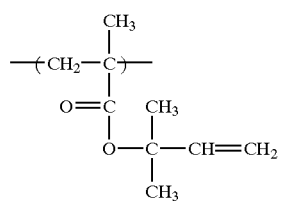

(c8)

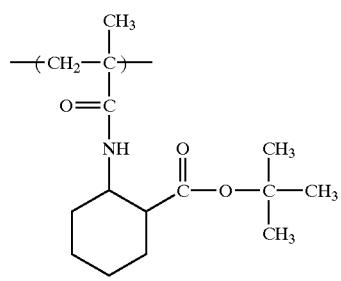

(c9)

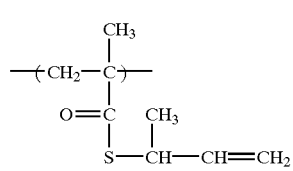

(c10) 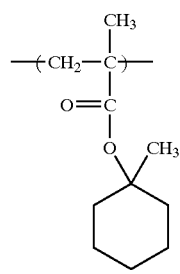
(c11) 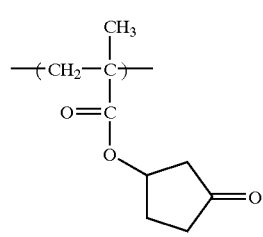
(c12) 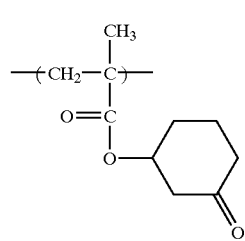
(c13) 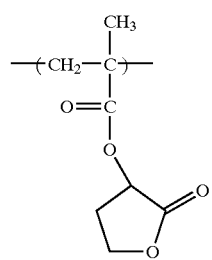
(c14) 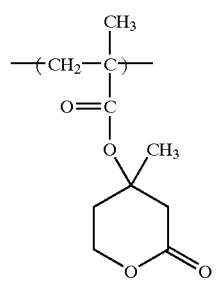
(c15) 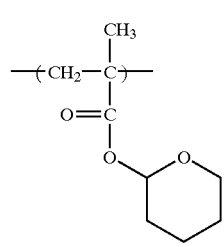
(c16) 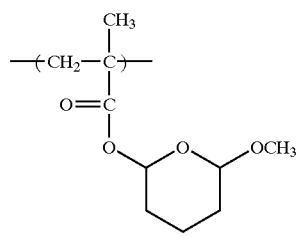
(c17) 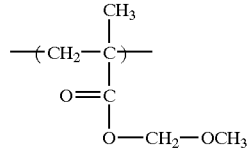
(c18) 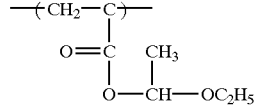
(c19) 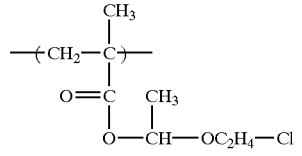
(c20) 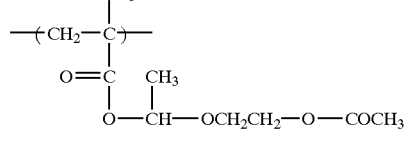
(c21) 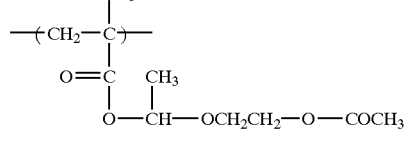
(c22) 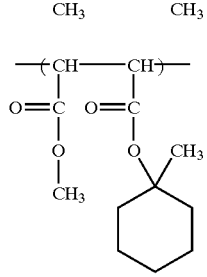
(c23) 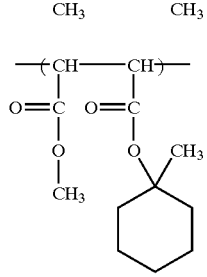

-continued (c24) 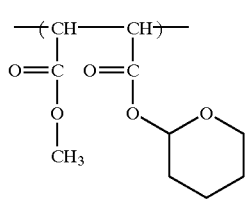

(c25) 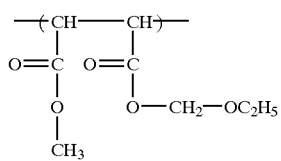

(c26) 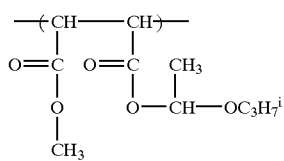

(c27) 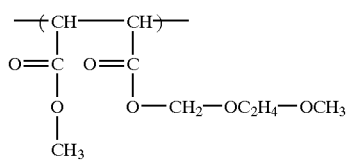

(c28) 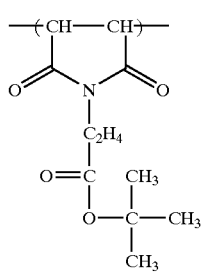

(c29) 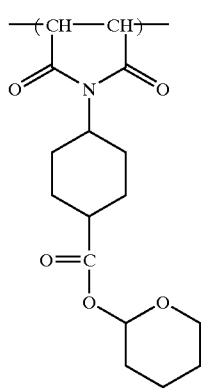

(c30) 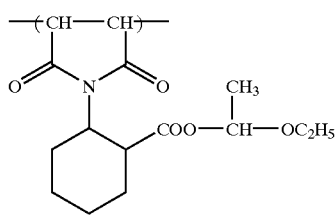

The resin according to the present invention may further contain a carboxy group.

The carboxy group may be contained in the repeating unit represented by any one of formulae (IV) to (IX) described above, or may be contained in the repeating unit having the acid-decomposable group and the low molecular weight compound (C), or may be contained in a repeating unit other than those repeating units. Further, the carboxy groups may be contained in two or more kinds of such positions as described above.

A repeating unit having the carboxy group is preferably a repeating unit represented by the following formula (XV), (XVI) or (XVII):

 (XV)

 (XVI)

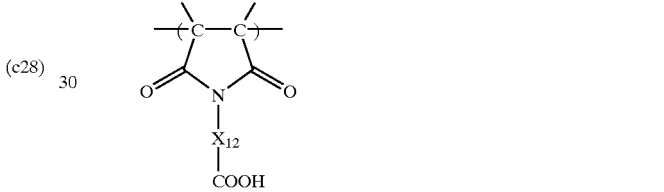 (XVII)

wherein $R_{75}$, $R_{76}$ and $R_{78}$ to $R_{80}$, which may be the same or different, each represents a hydrogen atom, a halogen atom, a cyano group, an alkyl group or a haloalkyl group; $R_{77}$ represents a cyano group, $—CO—OR_{87}$ or $—CO—NR_{88}R_{89}$; $X_{10}$, $X_{11}$, and $X_{12}$, which may be the same or different, each represents a single bond, an optionally substituted divalent alkylene, alkenylene or cycloalkylene group, $—CO—$, $—SO_2—$, $—O—CO—R_{90}—$, $—CO—O—R_{91}—$ or $—CO—NR_{92}—R_{93}—$; $R_{87}$ represents a hydrogen atom, an optionally substituted alkyl, cycloalkyl or alkenyl group, or a group which is decomposed by the action of an acid to increase solubility in an alkaline developing solution; $R_{88}$, $R_{89}$ and $R_{92}$, which may be the same or different, each represents a hydrogen atom or an optionally substituted alkyl, cycloalkyl or alkenyl group, or $R_{88}$ and $R_{89}$ may be bonded to each other to form a ring; and $R_{90}$, $R_{91}$ and $R_{93}$, which may be the same or different, each represents a single bond or a divalent alkylene, alkenylene or cycloalkylene group, or a divalent group formed by combining each of these groups with an ether, ester, amido, urethane or ureido group.

Details of the substituents represented by $R_{75}$ to $R_{80}$, $R_{87}$ to $R_{93}$ and $X_{10}$ to $X_{12}$ are same as those described for $R_{15}$ to $R_{20}$, $R_{27}$ to $R_{33}$ and $X_1$ to $X_3$ in formulae (IV) to (VI) above, respectively. Preferred examples thereof are also same as those described above.

The content of the repeating unit having a carboxy group described above (preferably the repeating unit represented by formula (XV), (XVI) or (XVII)) in the resin according to the present invention is controlled while taking account of characteristics such as developing property with alkali, adhesion to a substrate, sensitivity and the like. However, the content thereof is preferably from 0 to 60% by mole, more preferably from 0 to 40% by mole, and still more preferably from 0 to 20% by mole, based on the whole repeating unit. The content of carboxy group-containing repeating unit used herein means a content of the total carboxy group-containing repeating units in the resin, including the repeating unit having a carboxy group represented by any one of formulae (IV) to (IX), the low molecular weight compound (C) and the repeating unit containing an acid-decomposable group and a carboxy group.

Specific examples of the repeating unit represented by any one of formulae (XV), (XVI) and (XVII) are set forth below, but the present invention should not be construed as being limited thereto.

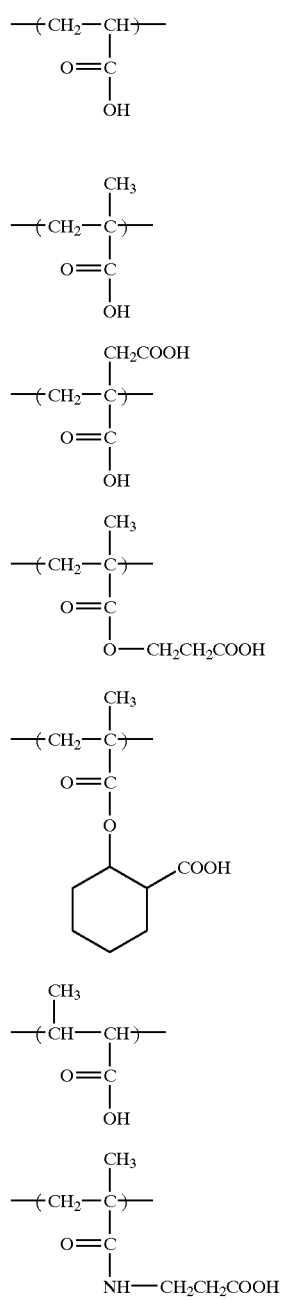

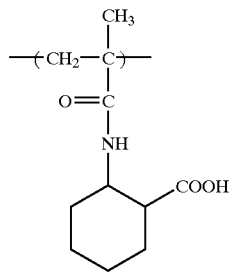

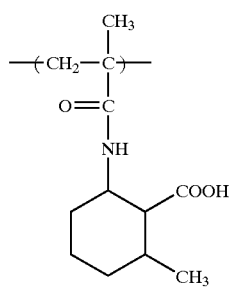

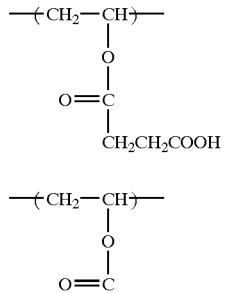

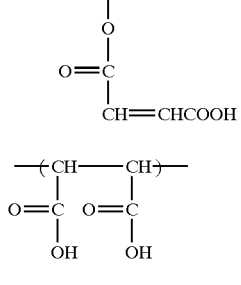

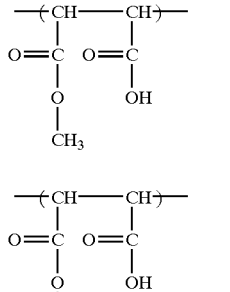

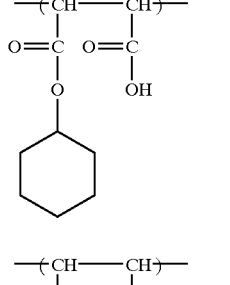

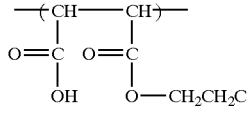

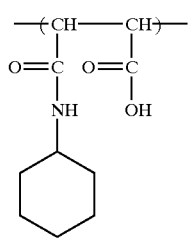

(d16)

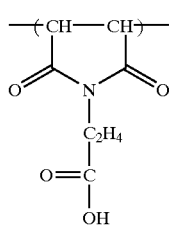

(d17)

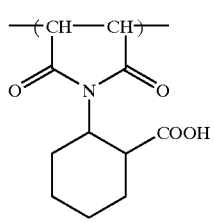

(d18)

<Other Polymerizable Monomers>

For the purpose of improving characteristics of the resin for use in the first embodiment of the photosensitive composition according to the present invention, one or more other monomers may further be copolymerized within the range of not severely impairing transmissibility at 220 nm or less and dry etching resistance of the resin.

Examples of the copolymerizable monomer which can be used include compounds having one addition-polymerizable unsaturated bond, selected, for example, from acrylic acid esters, acrylamides, methacrylic acid esters, methacrylamides, allyl compounds, vinyl ethers, vinyl esters, styrenes and crotonic acid esters.

Specific examples thereof include acrylic acid esters such as alkyl (the alkyl group preferably has from 1 to 10 carbon atoms) acrylate (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, or tetrahydrofurfuryl acrylate) and aryl acrylate (e.g., phenyl acrylate, or hydroxyphenyl acrylate); methacrylic acid esters such as alkyl (the alkyl group preferably has from 1 to 10 carbon atoms) methacrylate (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, or tetrahydrofurfuryl methacrylate) and aryl methacrylate (e.g., phenyl methacrylate, hydroxyphenyl methacrylate, cresyl methacrylate, or naphthyl methacrylate); acrylamides such as acrylamide, N-alkylacrylamide (the alkyl group is an alkyl group having from 1 to 10 carbon atoms, for example, methyl group, ethyl group, propyl group, butyl group, tert-butyl group, heptyl group, octyl group, cyclohexyl group, benzyl group, hydroxyethyl group or benzyl group), N-arylacrylamide (the aryl group is, for example, phenyl group, tolyl group, nitrophenyl group, naphthyl group, cyanophenyl group, hydroxyphenyl group or carboxyphenyl group), N,N-dialkylacrylamide (the alkyl group is an alkyl group having from 1 to 10 carbon atoms, for example, methyl group, ethyl group, butyl group, isobutyl group, ethylhexyl group or cyclohexyl group), N,N-diarylacrylamide (the aryl group is, for example, phenyl group), N-methyl-N-phenylacrylamide, N-hydroxyethyl-N-methylacrylamide and N-2-acetamidoethyl-N-acetylacrylamide; methacrylamides such as methacrylamide, N-alkylmethacrylamide (the alkyl group is an alkyl group having from 1 to 10 carbon atoms, for example, methyl group, ethyl group, tert-butyl group, ethylhexyl group, hydroxyethyl group or cyclohexyl group), N-arylmethacrylamide (the aryl group is, for example, phenyl group, hydroxyphenyl group or carboxyphenyl group), N,N-dialkylmethacrylamide (the alkyl group is, for example, ethyl group, propyl group or butyl group), N,N-diaryl-methacrylamide (the aryl group is, for example, phenyl group), N-hydroxyethyl-N-methylmethacrylamide, N-methyl-N-phenylmethacrylamide and N-ethyl-N-phenylmethacrylamide; allyl compounds such as allyl esters (e.g., allyl acetate, allyl caproate, allyl caprylate, allyl laurate, allyl palmitate, allyl stearate, allyl benzoate, allyl acetoacetate, or allyl lactate) and allyloxyethanol; vinyl ethers such as alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, or tetrahydrofurfuryl vinyl ether) and vinyl aryl ether (e.g., vinyl phenyl ether, vinyl tolyl ether, vinyl chlorophenyl ether, vinyl 2,4-dichlorophenyl ether, vinyl naphthyl ether, vinyl anthranyl ether); vinyl esters such as vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl phenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate; styrenes such as styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, or acetoxymethylstyrene), alkoxystyrene (e.g., methoxystyrene, 4-methoxy-3-methylstyrene, or dimethoxystyrene), halostyrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, or 4-fluoro-3-trifluoromethylstyrene), hydroxystyrene (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, or 4-hydroxy-3-(2-hydroxybenzyl)styrene) and carboxystyrene; crotonic acid esters such as alkyl crotonate (e.g., butyl crotonate, hexyl crotonate, or glycerin monocrotonate); dialkyl itaconates (e.g., dimethyl itaconate, diethyl itaconate, or dibutyl itaconate); dialkyl esters of a maleic acid or fumaric acid (e.g., dimethyl maleate, or dibutyl fumarate); maleic anhydride; maleimide; acrylonitrile; methacrylonitrile; and maleonitrile. In addition, addition-polymerizable unsaturated compounds which can be copolymerized in general may be used.

Among these, monomers capable of increasing the alkali solubility, for example, monomers having a carboxyl group, such as carboxystyrene, N-(carboxyphenyl)acrylamide and N-(carboxyphenyl)methacrylamide, monomers having a phenolic hydroxyl group, such as hydroxystyrene, N-(hydroxyphenyl)-acrylamide, N-(hydroxyphenyl) methacrylamide, hydroxyphenyl acrylate and hydrophenyl methacrylate, and maleimide are preferred as the copolymerizable component.

The content of the other polymerizable monomer in the resin according to the present invention is preferably not more than 50% by mole, more preferably not more than 30% by mole, based on the whole repeating unit.

The resin according to the present invention which contains the repeating unit having the structural group represented by formula (I), (II) or (III) (preferably the repeating unit represented by any one of formulae (IV) to (IX)), the repeating unit having an acid-decomposable group (preferably the repeating unit represented by any one of formulae (X) to (XII)), if desired, the repeating unit having a carboxy group (preferably the repeating unit represented by any one of formulae (XV) to (XVII)), if desired, and a repeating unit derived from other polymerizable monomer, if desired, is synthesized by a radical, cation or anion polymerization of unsaturated monomers corresponding to the respective structures.

More specifically, the respective monomers are mixed based on the desired composition as described above and polymerized in an appropriate solvent in a monomer concentration of from about 10 to 40% by weight by adding a polymerization catalyst, and if desired, by heating.

The resin according to the present invention has a molecular weight, in terms of a weight average molecular weight (Mw: polystyrene basis), of 2,000 or more, preferably from 3,000 to 1,000,000, more preferably from 3,000 to 200,000, and still more preferably from 4,000 to 100,000. As the molecular weight is larger, heat resistance or the like is more improved, however, developing property or the like deteriorates. Therefore, the molecular weight is controlled in a preferred range taking account of the balance of these characteristics. A degree of dispersion (Mw/Mn) is preferably from 1.0 to 5.0, more preferably from 1.0 to 3.0. As the degree of dispersion is smaller, heat resistance and image performance (pattern profile, defocus latitude, or the like) are improved.

In the present invention, the amount of the above described resin added to the photosensitive composition is from 50 to 99.7% by weight, preferably from 70 to 99% by weight, based on the whole solid content.

Component (F): a fluorine-base and/or silicon-base surface active agent:

The fluorine-base surface active agent and silicon-base surface active agent which can be included in the positive photosensitive composition according to the present invention is described below.

The photosensitive composition according to the present invention may contain either a fluorine-base surface active agent, a silicon-base surface active agent or both of them.

Examples of the surface active agents (F) include those described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988, U.S. Pat. Nos. 5,405,720, 5,360,692, 5,529,881, 5,296,330, 5,436,098, 5,576,143, 5,294,511, and 5,824,451. Commercially available surface active agents are also employed as they are.

Examples of commercially available surface active agents which can be used include fluorine-base surface active agents and silicon-base surface active agents, for example, F-Top EF301 and EF303 (manufactured by Shin Akita Chemical Co., Ltd.), Florad FC430 and FC431 (manufactured by Sumitomo 3M Ltd.), Megafac F171, F173, F176, F189 and R08 (manufactured by Dainippon Ink and Chemicals, Inc.) and Surflon S-382, SC101, SC102, SC103, SC104, SC105 and SC106 (manufactured by Asahi Glass Co., Ltd.). Also, polysiloxane polymer KP-341 (manufactured by Shin-Etsu Chemical Co., Ltd.) is employed as the silicon-base surface active agent.

The amount of the surface active agent added is ordinarily from 0.01 to 2 parts by weight, preferably from 0.01 to 1 part by weight, per 100 parts by weight of the solid content in the photosensitive composition according to the present invention.

The surface active agents may be used individually or in combination of two or more thereof.

Now, the second embodiment of the photosensitive composition according to the present invention will be described in more detail below.

Component (B): a resin having a polyalicyclic group represented by formula (Ib) described above and a group which is decomposed by the action of an acid to increase solubility in an alkaline developing solution (hereinafter also referred to as an acid-decomposable group sometimes):

In the present invention, the polyalicyclic group represented by formula (Ib) describe above and the acid-decomposable group each may be bonded to any site of the base resin. Specifically, the polyalicyclic group represented by formula (Ib) describe above and the acid-decomposable group may be bonded to different repeating units in the base resin, or both of them may be bonded to the same repeating unit in the base resin. Further, the polyalicyclic group and the acid-decomposable group are present in the base resin in these two manners described above.

In the resin according to the present invention, although a repeating structural unit having the group represented by formula (Ib) may be any unit having the group represented by formula (Ib), a repeating unit represented by any one of formulae (IVb), (Vb) and (VIb) described above is preferred.

In the above formulae, the alkyl group represented by any one of $R_a$, $R_b$, $R_c$, $R_d$, $R_e$, $R_f$, $R_g$, $R_{7b}$, $R_{9b}$, $R_{11b}$, $R_{12b}$, $R_{14b}$, $R_{27b}$ to $R_{29b}$ and $R_{32b}$ is preferably an optionally substituted alkyl group having from 1 to 8 carbon atoms, for example, methyl, ethyl, propyl, n-butyl, sec-butyl, hexyl, 2-ethylhexyl or octyl. The cycloalkyl group is preferably an optionally substituted cycloalkyl group having from 3 to 8 carbon atoms, for example, cyclopropyl, cyclopentyl or cyclohexyl. The alkenyl group is preferably an optionally substituted alkenyl group having from 2 to 6 carbon atoms, for example, vinyl, propenyl, allyl, butenyl, pentenyl, hexenyl or cyclohexenyl. The alkynyl group represented by any one of $R_a$ to $R_g$ is preferably an alkynyl group having from 2 to 4 carbon atoms, for example, acetylene or propargyl.

Two of $R_a$ to $R_g$, which are present on the same carbon atom, may represent in combination a carbonyl group (=O) or a thiocarbonyl group (=S).

Two of $R_a$ to $R_g$, which are bonded to adjacent carbon atoms, may be bonded to each other to form a double bond between these two carbon atoms. It is preferred that the double bond formed between two carbon atoms is not form a conjugated double bond between two carbon atoms.

Further, at least two of $R_a$ to $R_g$ may be bonded to each other to form a ring. The ring is preferably a 3-membered to 8-membered ring which may contain a hetero atom, for example, cyclopropyl, cyclopentyl, cyclohexyl, cycloheptyl, tetrahydrofuryl or tetrahydropyranyl. The ring may further have a substituent.

The monovalent polyalicyclic group represented by formula (Ib) may be connected to the resin moiety in any position thereof.

The polyalicyclic group represented by formula (Ib) described above has several stereoisomers and all of such stereoisomers are included in the present invention.

The alkyl group represented by any one of $R_{15b}$, $R_{16b}$, $R_{18b}$ to $R_{22b}$ and $R_{24b}$ to $R_{26b}$ is preferably an optionally substituted alkyl group having from 1 to 4 carbon atoms, for example, methyl, ethyl, propyl, n-butyl or sec-butyl. The haloalkyl group is preferably an alkyl group having from 1 to 4 carbon atoms substituted with a fluorine atom, a chlorine atom or a bromine atom, for example, fluoromethyl; chloromethyl, bromomethyl, fluoroethyl, chloroethyl or bromoethyl.

The alkylene group represented by any one of $R_{6b}$, $R_{8b}$, $R_{10b}$, $R_{13b}$ and $X_{1b}$ to $X_{6b}$ is preferably an optionally substituted alkylene group having from 1 to 8 carbon atoms, for example, methylene, ethylene, propylene, butylene, hexylene or octylene.

The alkenylene group is preferably an optionally substituted alkenylene group having from 2 to 6 carbon atoms, for example, ethenylene, propenylene or butenylene. The cycloalkylene group is preferably an optionally substituted cycloalkylene group having from 5 to 8 carbon atoms, for example, cyclopentylene or cyclohexylene.

The alkylene, alkenylene or cycloalkylene group represented by $R_{30b}$, $R_{31b}$ and $R_{33b}$ are same as those described above. $R_{30b}$, $R_{31b}$ and $R_{33b}$ also represents a divalent group formed by combining each of these groups with an ether, ester, amido, urethane or ureido group.

The ring formed by $R_{11b}$ and $R_{12b}$ or $R_{28b}$ and $R_{29b}$ together with the nitrogen atom is preferably a 5-membered to 8-membered ring. Specific examples thereof include pyrrolidine, piperidine or piperazine.

$R_{7b}$, $R_{9b}$, $R_{27b}$ and $B_b$ each represents a group which is decomposed by the action of an acid to increase solubility in an alkaline developing solution (acid-decomposable group).

In the resin according to the present invention, the acid-decomposable group may be contained in the group represented by formula (Ib) (for example, as $R_{7b}$ or $R_{9b}$), or may be contained in a repeating unit having a group represented by formula (Ib) (for example, as $R_{27b}$), or may be contained in other repeating units. The acid-decomposable groups may be contained in two or more kinds of such groups or units.

Examples of the acid-decomposable group include a group which is hydrolyzed by the action of an acid to form an acid and a group which releases a carbon cation by the action of an acid to form an acid. Preferred examples include groups represented by formulae (XIII) and (XIV) described hereinbefore. Such acid-decomposable groups serve to impart excellent storage stability.

The content of the structural unit having the alicyclic group represented by formula (Ib) described above (preferably the repeating unit represented by formula (IVb), (Vb) or (VIb)) in the resin according to the present invention is controlled while taking account of the balance among dry etching resistance, developing property with alkali and the like. However, the content thereof is preferably 20% by mole or more, more preferably from 30 to 80% by mole, and still more preferably from 40 to 65% by mole, based on the whole repeating unit.

The content of the repeating unit having the acid-decomposable group described above(preferably the repeating unit represented by formula (VIIb), (VIIIb) or (IXb)) in the resin according to the present invention is controlled while taking account of characteristics such as developing property with alkali, adhesion to a substrate and the like. However, the content thereof is preferably from 5 to 100% by mole, more preferably from 10 to 100% by mole, and still more preferably from 20 to 100% by mole, based on the whole repeating unit. The content of the acid-decomposable group-containing repeating unit used herein means a content of the total acid-decomposable group-containing repeating units in the resin, including the repeating unit having the group represented by formula (Ib) describe above which contains an acid-decomposable group.

Specific examples of the repeating unit represented by any one of formulae (IVb), (Vb) and (VIb) are set forth below as (a'1) to (a'10), but the present invention should not be construed as being limited thereto.

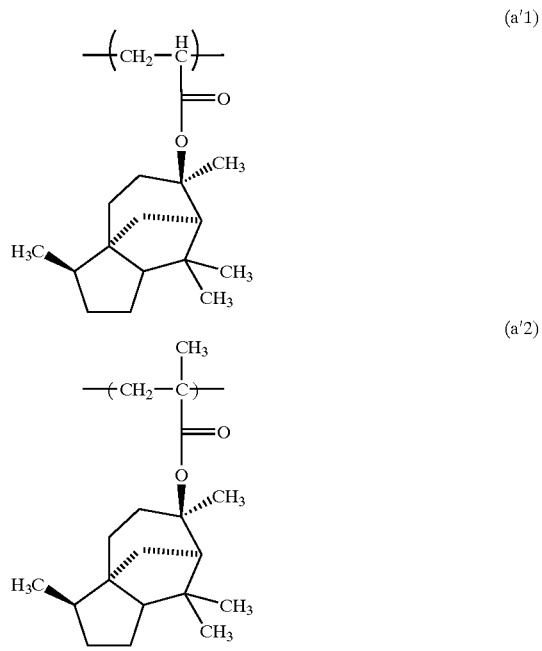

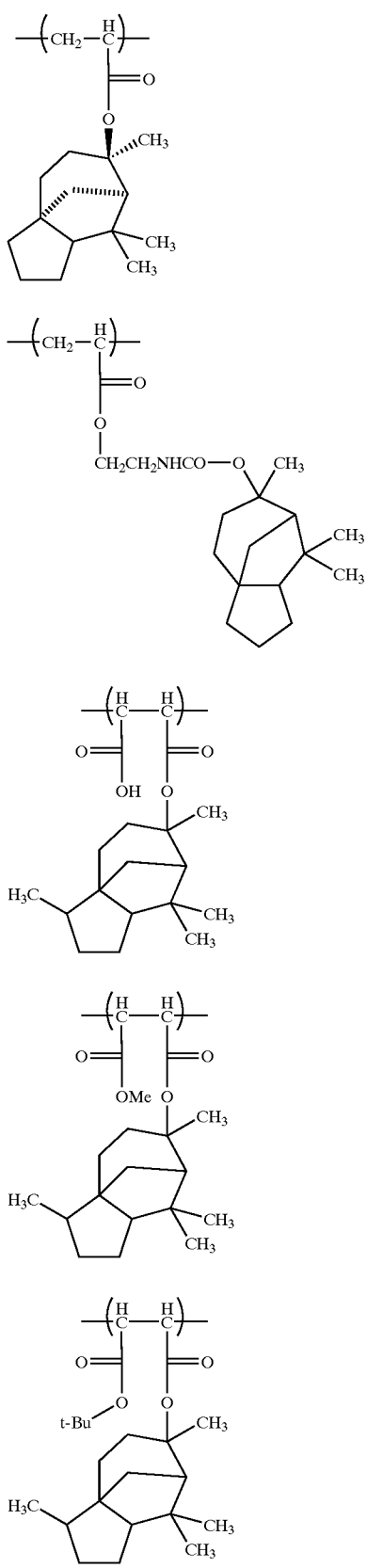
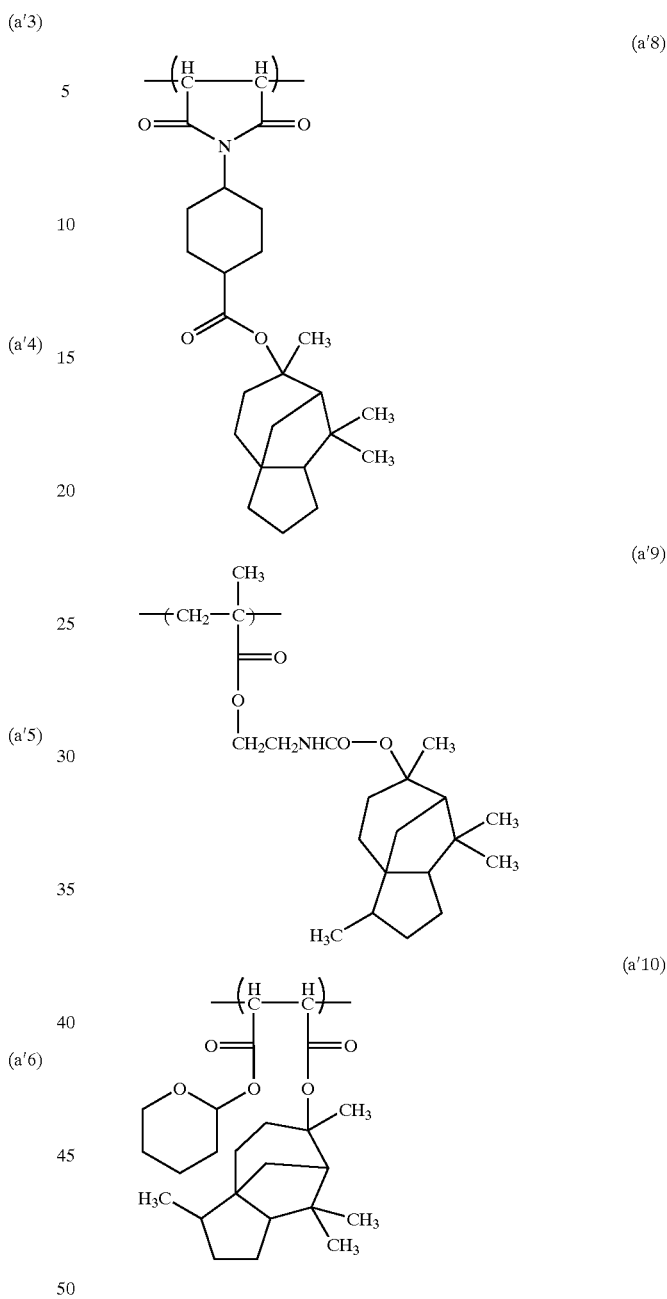

Specific examples of the repeating unit represented by any one of formulae (VIIb), (VIIIb) and (IXb) include (c1) to (c30) set forth hereinbefore with respect to the first embodiment of the photosensitive composition according to the present invention, but the present invention should not be construed as being limited thereto.

Of the structural units having the group represented by formula (Ib) in the present invention, (a'1), (a'2) and (a'3) are particularly preferred.

[2] Repeating Structural Unit Having a Carboxy Group:

In the resin according to the present invention, a carboxy group may be contained in the repeating unit having the group represented by formula (Ib) described above, or may be contained in the repeating unit having the acid-decomposable group, or may be contained in a repeating unit other than those repeating units. Further, the carboxy groups may be contained in two or more kinds of such positions as described above.

Of the repeating units having a carboxy group, repeating units represented by formulae (Xb), (XIb) and (XIIb) described above are preferred.

In the formula (Xb), (XIb) or (XIIb) described above, the alkyl group represented by any one of $R_{34b}$, $R_{35b}$ and $R_{37b}$ to $R_{39b}$ is preferably an optionally substituted alkyl group having from 1 to 4 carbon atoms, for example, methyl, ethyl, propyl, n-butyl or sec-butyl. The haloalkyl group is preferably an alkyl group having from 1 to 4 carbon atoms substituted with a fluorine atom, a chlorine atom or a bromine atom, for example, fluoromethyl, chloromethyl, bromomethyl, fluoroethyl, chloroethyl or bromoethyl.

The alkyl group represented by any one of $R_{40b}$ to $R_{42b}$ and $R_{45b}$ is preferably an optionally substituted alkyl group having from 1 to 8 carbon atoms, for example, methyl, ethyl, propyl, n-butyl, sec-butyl, hexyl, 2-ethylhexyl or octyl. The cycloalkyl group is preferably an optionally substituted cycloalkyl group having from 3 to 8 carbon atoms, for example, cyclopropyl, cyclopentyl or cyclohexyl. The alkenyl group is preferably an optionally substituted alkenyl group having from 2 to 6 carbon atoms, for example, vinyl, propenyl, allyl, butenyl, pentenyl, hexenyl or cyclohexenyl.

The alkylene group represented by any one of $X_{7b}$ to $X_{9b}$ is preferably an optionally substituted alkylene group having from 1 to 8 carbon atoms, for example, methylene, ethylene, propylene, butylene, hexylene or octylene. The alkenylene group is preferably an optionally substituted alkenylene group having from 2 to 6 carbon atoms, for example, ethenylene, propenylene or butenylene. The cycloalkylene group is preferably an optionally substituted cycloalkylene group having from 5 to 8 carbon atoms, for example, cyclopentylene or cyclohexylene.

Preferred examples of the alkylene, alkenylene and cycloalkylene group represented by $R_{43b}$, $R_{44b}$ and $R_{46b}$ are same as those described for $X_{7b}$ to $X_{9b}$ above, respectively. $R_{43b}$, $R_{44b}$ and $R_{46b}$ each also represents a divalent group formed by combining each of these groups with an ether, ester, amido, urethane or ureido group.

Preferred examples of the substituent which may be possessed by the substituents described above include a hydroxy group, a halogen atom (fluorine, chlorine, bromine, and iodine), a nitro group, a cyano group, an amido group, a sulfonamido group, an alkyl group such as the alkyl group described with regard to $R_a$ to $R_g$ hereinbefore, an alkoxy group such as methoxy, ethoxy, hydroxyethoxy, propoxy, hydroxypropoxy and butoxy, an alkoxycarbonyl group such as methoxycarbonyl and ethoxycarbonyl, an acyl group such as formyl, acetyl and benzoyl, an acyloxy group such as acetoxy and butyryloxy, and a carboxy group.

The content of the repeating unit having a carboxy group described above (preferably the repeating unit represented by formula (Xb), (XIb) or (XIIb)) in the resin according to the present invention is controlled while taking account of characteristics such as developing property with alkali, adhesion to a substrate, sensitivity and the like. However, the content thereof is preferably from 0 to 60% by mole, more preferably from 0 to 40% by mole, and still more preferably from 0 to 20% by mole, based on the whole repeating unit. The content of carboxy group-containing repeating unit used herein means a content of the total carboxy group-containing repeating units in the resin, including the repeating unit having the group represented by formula (Ib) containing a carboxy group and the repeating unit containing an acid-decomposable group and a carboxy group.

Specific examples of the repeating unit represented by any one of formulae (Xb), (XIb) and (XIIb) include (d-1) to (d-18) set forth hereinbefore with respect to the first embodiment of the photosensitive composition according to the present invention, but the present invention should not be construed as being limited thereto.

[3] Resin (B) containing the repeating unit described above according to the present invention:

For the purpose of improving characteristics of the resin (B) for use in the second embodiment of the photosensitive composition according to the present invention, one or more other monomers may further be copolymerized within the range of not severely impairing transmissibility at 220 nm or less and dry etching resistance of the resin.

Copolymerizable monomers which can be used are same as those described for other polymerizable monomers with respect to the first embodiment of the photosensitive composition according to the present invention.

The resin (B) according to the present invention which contains the repeating unit having the group represented by formula (Ib) (preferably the repeating unit represented by any one of formulae (IVb) to (VIb)), the repeating unit having an acid-decomposable group (preferably the repeating unit represented by any one of formulae (VIIb) to (IXb)), the repeating unit having a carboxy group (preferably the repeating unit represented by any one of formulae (Xb) to (XIIb)), if desired, and a repeating unit derived from other polymerizable monomer, if desired, is synthesized by a radical, cation or anion polymerization of unsaturated monomers corresponding to the respective structures.

More specifically, the respective monomers are mixed based on the desired composition as described above and polymerized in an appropriate solvent in a monomer concentration of from about 10 to 40% by weight by adding a polymerization catalyst, and if desired, by adding a chain transfer agent, and if desired, by heating.

The resin (B) according to the present invention has a molecular weight, in terms of a weight average molecular weight (Mw: polystyrene basis), of 2,000 or more, preferably from 3,000 to 1,000,000, more preferably from 3,000 to 200,000, and still more preferably from 3,000 to 100,000. As the molecular weight is larger, heat resistance or the like is more improved, however, developing property or the like deteriorates. Therefore, the molecular weight is controlled in a preferred range taking account of the balance of these characteristics. A degree of dispersion (Mw/Mn) is preferably from 1.0 to 5.0, more preferably from 1.0 to 3.0. As the degree of dispersion is smaller, heat resistance and image performance (pattern profile, defocus latitude, or the like) are improved.

In the present invention, the amount of the above described resin added to the photosensitive composition is from 50 to 99.7% by weight, preferably from 70 to 99% by weight, based on the whole solid content.

Now, the compound (A) which generates an acid upon irradiation with an actinic ray or radiation for use in the first or second embodiment of the photosensitive composition according to the present invention will be described in more detail below.

The compound which generates an acid upon irradiation with an actinic ray or radiation for use in the present invention is a photo acid generator.

The compound which decomposes on irradiation of an active ray or radiation to generate an acid for use in the present invention may be appropriately selected from photoinitiators for photo-cation polymerization, photoinitiators for photo-radical polymerization, photo-achromatizing agents, photo-discoloring agents, known compounds used in a microresist or the like, which generate an acid by light (ultraviolet ray or far ultraviolet ray of from 200 to 400 nm, particularly preferably, g-line, h-line, i-line, KrF excimer laser beam), an ArF excimer laser beam, an electron beam, an X ray, a molecular beam or an ion beam, and a mixture of these compounds.

Other examples of the compound generating an acid on irradiation of an actinic ray or radiation for use in the present invention include diazonium salts described in S. I. Schlesinger, *Photogr. Sci. Eng.,* 18, 387 (1974) and T. S. Bal et al., *Polymer,* 21, 423 (1980), ammonium salts described in U.S. Pat. Nos. 4,069,055, 4,069,056 and Re 27,992 and JP-A-3-140140, phosphonium salts described in D. C. Necker et al., *Macromolecules,* 17, 2468 (1984), C. S. Wen et al., *Teh, Proc. Conf. Rad. Curing ASIA,* p. 478, Tokyo, October (1988) and U.S. Pat. Nos. 4,069,055 and 4,069,056, iodonium salts described in J. V. Crivello et al., *Macromolecules,* 10(6), 1307 (1977), *Chem. & Eng. News,* Nov. 28, p. 31 (1988), European Patent 104143, 339049 and 410201, JP-A-2-150848 and JP-A-2-296514, sulfonium salts described in J. V. Crivello et al., *Polymer J.* 17, 73 (1985), J. V. Crivello et al., *J. Org. Chem.,* 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14(5), 1141 (1981), J. V. Crivello et al., *J. Polymer Sci., Polymer Chem. Ed.,* 17, 2877 (1979), European Patents 370693, 161811, 410201, 339049, 233567, 297443 and 297442, U.S. Pat. Nos. 3,902,114, 4,933,377, 4,760,013, 4,734,444 and 2,833, 827, German Patents 2,904,626, 3,604,580 and 3,604,581, JP-A-7-28237 and JP-A-8-27102, selenonium salts described in J. V. Crivello et al., *Macromolecules,* 10(6), 1307 (1977), and J. V. Crivello et al., *J. Polymer Sci., Polymer Chem. Ed.,* 17, 1047 (1979), onium salts such as arsonium salt described in C. S. Wen et al., *Teh, Proc. Conf. Rad. Curing ASIA,* p. 478, Tokyo, October (1988), organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metals/organic halides described in K. Meier et al., *J. Rad. Curing,* 13(4), 26 (1986), T. P. Gill et al., *Inorg Chem.,* 19, 3007 (1980), D. Astruc, *Acc. Chem. Res.,* 19(12), 377 (1896) and JP-A-2-161445, photo-acid generators having an o-nitrobenzyl type protective group, described in S. Hayase et al., *J. Polymer Sci.,* 25, 753 (1987), E. Reichmanis et al., *J. Polymer Sci., Polymer Chem. Ed.,* 23, 1 (1985), Q. Q. Zhu et al., *J. Photochem.,* 36, 85, 39, 317 (1987), B. Amit et al., *Tetrahedron Lett.,* (24)2205 (1973), D. H. R. Barton et al., *J. Chem. Soc.,* 3571 (1965), P. M. Collins et al., *J. Chem. Soc.,* Perkin I, 1695 (1975), M. Rudinstein et al., *Tetrahedron Lett.,* (17), 1445 (1975), J. W. Walker et al., *J. Am. Chem. Soc.,* 110, 7170 (1988), S. C. Busman et al., *J. Imaging Technol.,* 11(4), 191 (1985), H. M. Houlihan et al., *Macromolecules,* 21, 2001 (1988), P. M. Collins et al., *J. Chem. Soc. Chem. Commun.,* 532 (1972), S. Hayase et al., *Macromolecules,* 18, 1799 (1985), E. Reichmanis et al., *J. Electrochem. Soc., Solid State Sci. Technol.,* 130(6), F. M. Houlihan et al., *Macromolecules,* 21, 2001 (1988), European Patents 290750, 046083, 156535, 271851 and 388343, U.S. Pat. Nos. 3,901,710 and 4,181,531, JP-A-60-198538 and JP-A-53-133022, compounds which photolyze and generate a sulfonic acid, represented by iminosulfonate and the like and described in M. Tunooka et al., *Polymer Preprints Japan,* 35(8), G. Berner et al., *J. Rad. Curing,* 13(4), W. J. Mijs et al., *Coating Technol.,* 55(697), 45 (1983) Akzo, H. Adachi et al., *Polymer Preprints, Japan,* 37(3), European Patents 199672, 084515, 044115, 618564 and 101122, U.S. Pat. Nos. 4,371,605 and 4,431,774, JP-A-64-18143, JP-A-2-245756 and JP-A-3-140109, disulfone compounds described in JP-A-61-166544 and JP-A-2-71270, and diazoketosulfone and diazodisulfone compounds described in JP-A-3-103854, JP-A-3-103856 and JP-A-4-210960.

Furthermore, polymer compounds having the group or compound generating an acid by light introduced into the main or side chain thereof may also be used and examples thereof include compounds described in M. E. Woodhouse et al., *J. Am. Chem. Soc.,* 104, 5586 (1982), S. P. Pappas et al., *J. Imaging Sci.,* 30(5), 218 (1986), S. Kondo et al., *Makromol. Chem., Rapid Commun.,* 9, 625 (1988), Y. Yamada et al., *Makromol. Chem.,* 152, 153, 163 (1972), J. V. Crivello et al., *J. Polymer Sci., Polymer Chem. Ed.,* 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Also, compounds which generate an acid by light described in V. N. R. Pillai, *Synthesis,* (1), 1 (1980), A. Abad et al., *Tetrahedron Lett.,* (47) 4555 (1971), D. H. R. Barton et al., *J. Chem. Soc.,* (C), 329 (1970), U.S. Pat. No. 3,779, 778 and European Patent 126712 may be used.

Among the above-described compounds which decompose on irradiation of an actinic ray or radiation and generate an acid, those which can be particularly effectively used are described below.

(1) Oxazole derivative represented by formula (PAG1) shown below or s-triazine derivative represented by formula (PAG2) shown below, substituted with trihalomethyl group:

(PAG1)

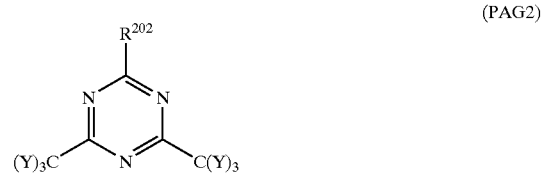

(PAG2)

wherein $R^{201}$ represents a substituted or unsubstituted aryl group or an alkenyl group, $R^{202}$ represents a substituted or unsubstituted aryl group, alkenyl group or alkyl group, or $-C(Y)_3$, and Y represents a chlorine atom or a bromine atom.

Specific examples thereof include the following compounds, however, the present invention should not be construed as being limited thereto.

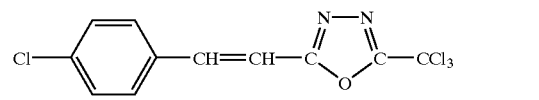

(PAG1-1)

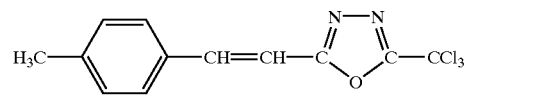

(PAG1-2)

(PAG1-3) 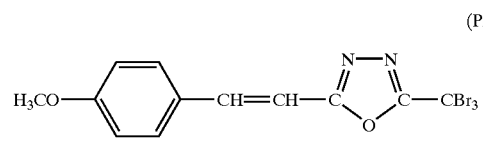
(PAG1-4) 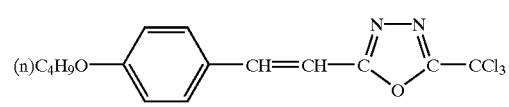
(PAG1-5) 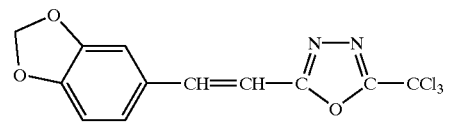
(PAG1-6) 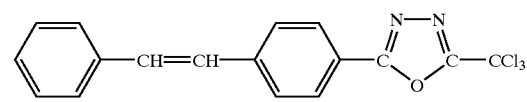
(PAG1-7) 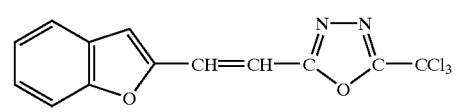
(PAG1-8) 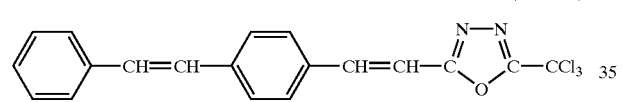
(PAG2-1) 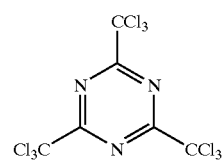
(PAG2-2) 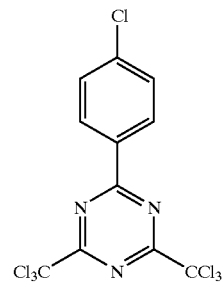
(PAG2-3) 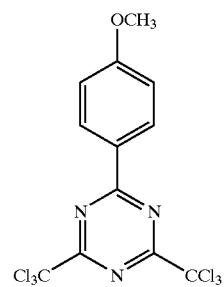
(PAG2-4) 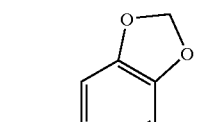
(PAG2-5) 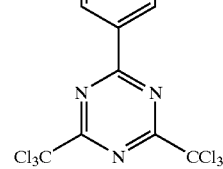
(PAG2-6) 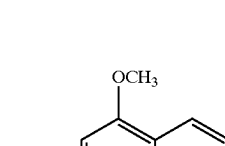
(PAG2-7) 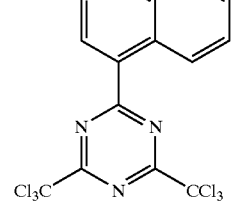
(PAG2-8) 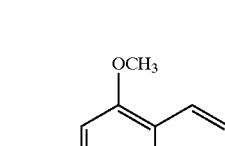

-continued

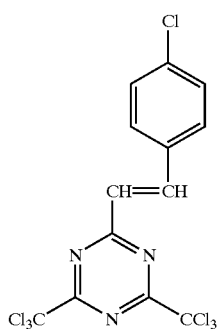
(PAG2-9)

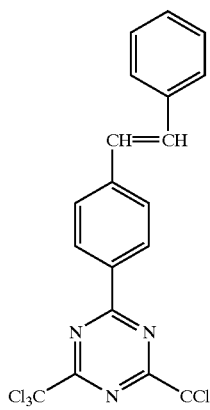
(PAG2-10)

(2) Iodonium salt represented by formula (PAG3) shown below or sulfonium salt represented by formula (PAG4) shown below:

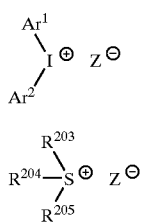

(PAG3)

(PAG4)

wherein $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$ and $R^{205}$ each independently represents a substituted or unsubstituted alkyl group or an aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxyl group, a hydroxyl group and a halogen atom, and for the alkyl group, an alkoxy group having from 1 to 8 carbon atoms, a carboxyl group and an alkoxycarbonyl group.

$Z^-$ represents a counter anion and examples thereof include a perfluoroalkane sulfonate anion such as $BF_4^-$, $AsF_6^-$, $PF_6^-$, $SbF_6^-$, $SiF_6^{2-}$, $ClO_4^-$ and $CF_3SO_3^-$, a pentafluorobenzene sulfonate anion, a condensed polynuclear aromatic sulfonate anion such as naphthalene-1-sulfonate anion, anthraquinone sulfonate anion, and a sulfonic acid group-containing dye, however, the present invention should not be construed as being limited thereto.

Two of $R^{203}$, $R^{204}$ and $R^{205}$ or $Ar^1$ and $Ar^2$ may be combined through a single bond or a substituent.

Specific examples thereof include the following compounds, however, the present invention should not be construed as being limited thereto.

(PAG3-1)

(PAG3-2)

(PAG3-3)

(PAG3-4)

(PAG3-5)

(PAG3-6)

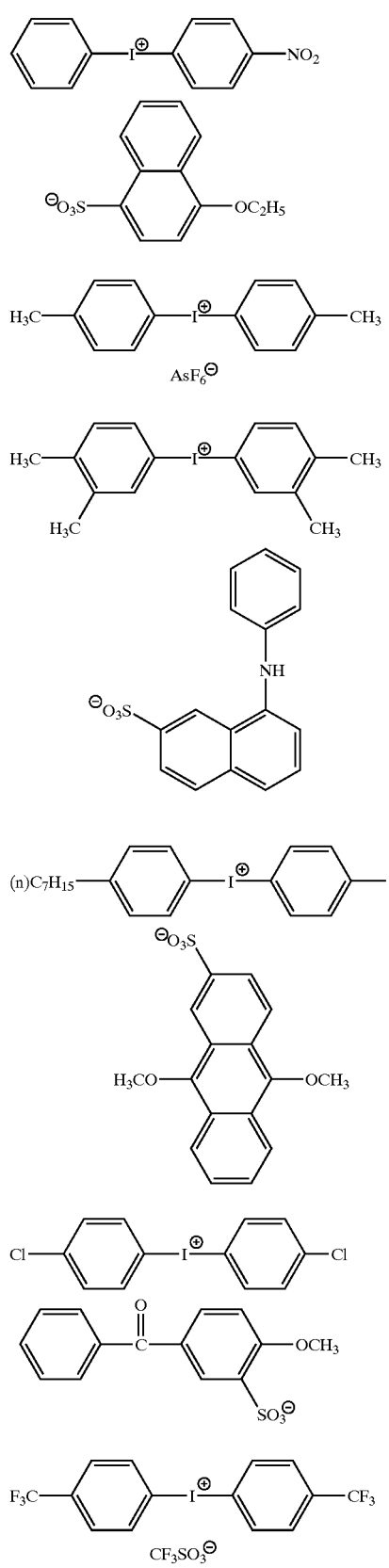
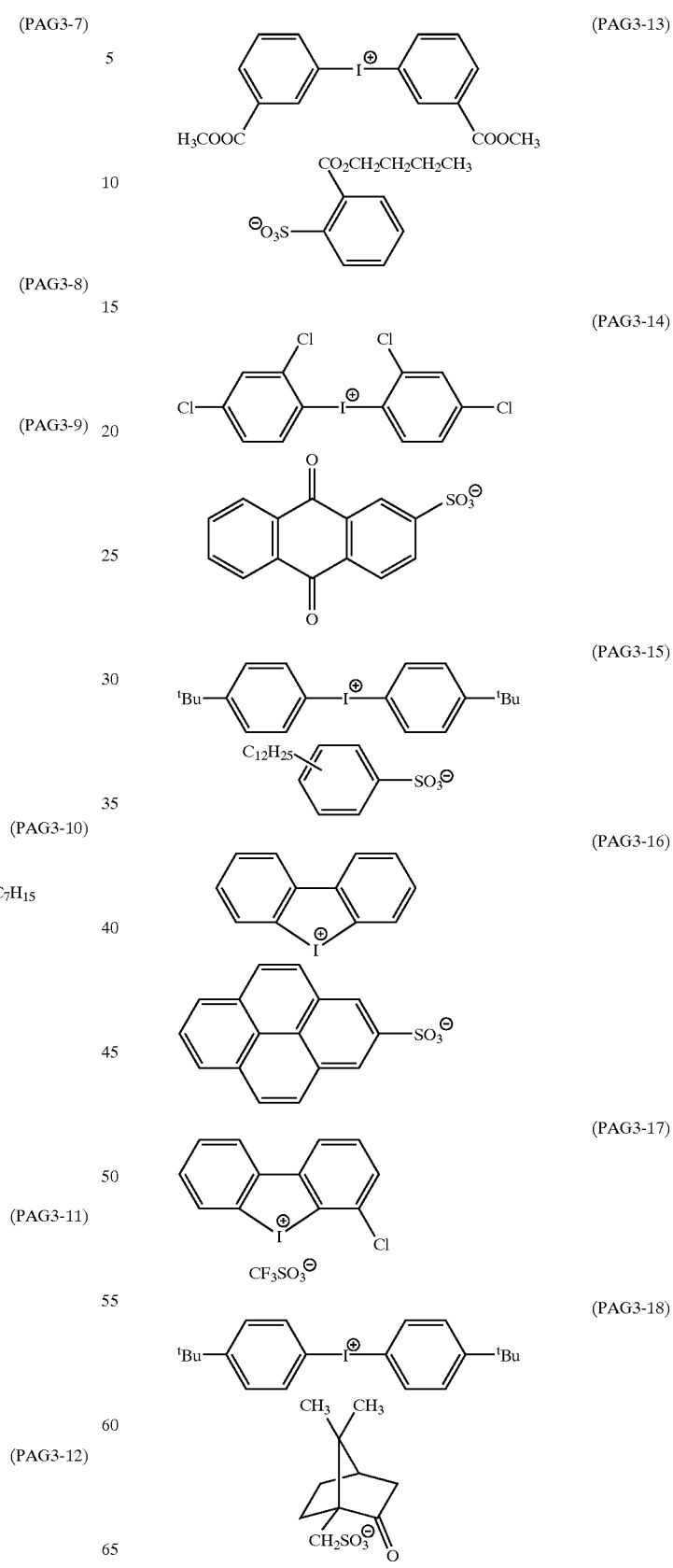

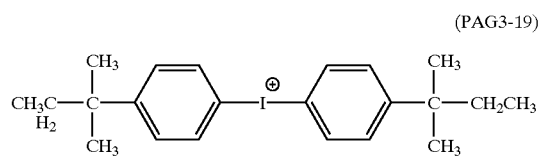
(PAG3-19)
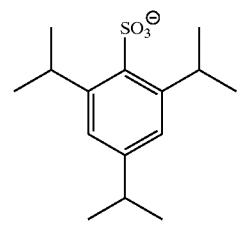
(PAG3-20)
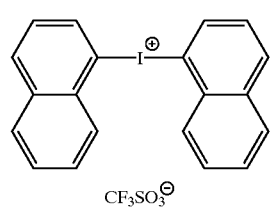
(PAG3-21)
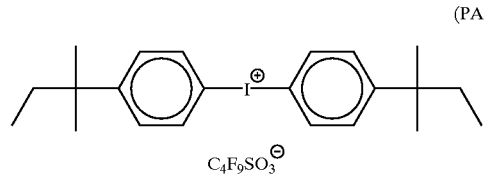
(PAG4-1)
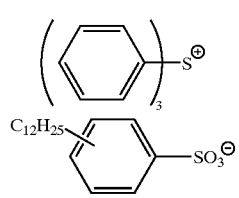
(PAG4-2)
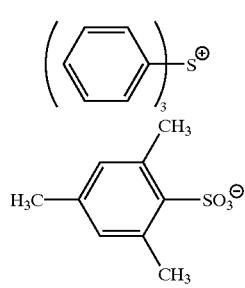
(PAG4-3)
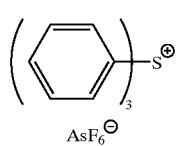
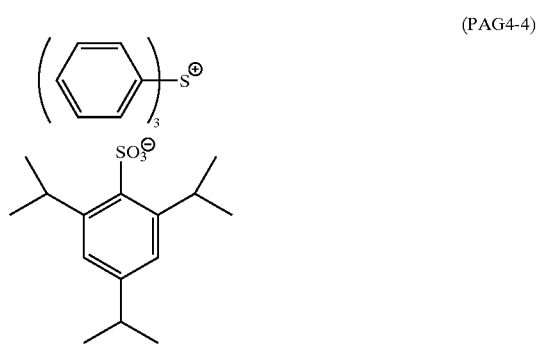
(PAG4-4)
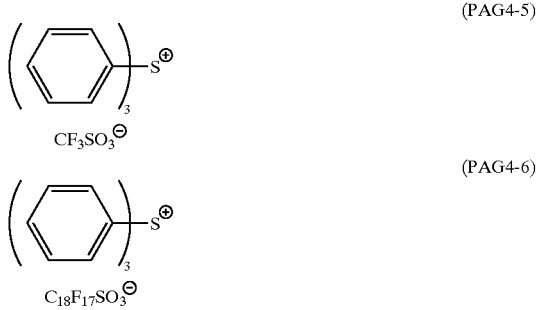
(PAG4-5)
(PAG4-6)
(PAG4-7)
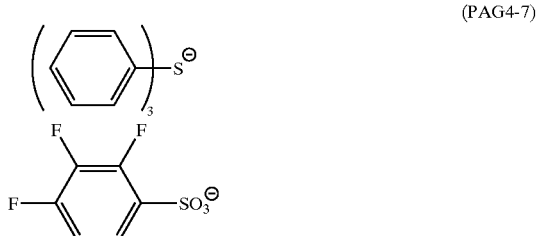
(PAG4-8)
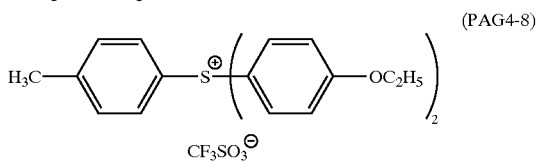
(PAG4-9)
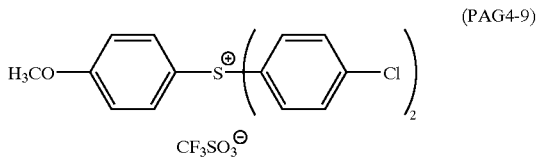
(PAG4-10)
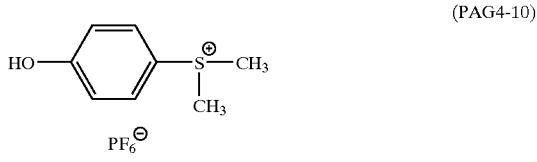
(PAG4-11)
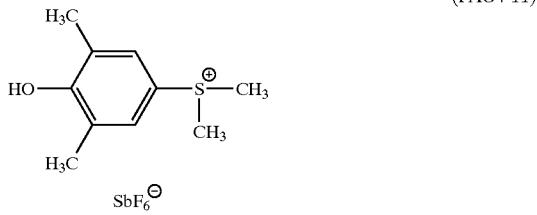

-continued
(PAG4-12) 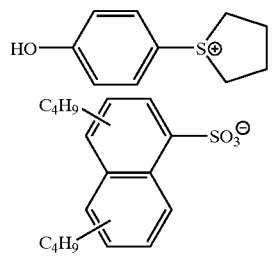
(PAG4-13) 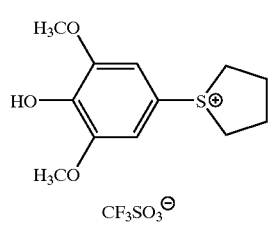
(PAG4-14) 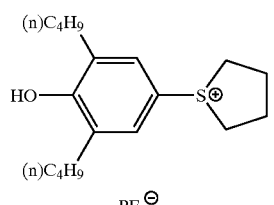
(PAG4-15) 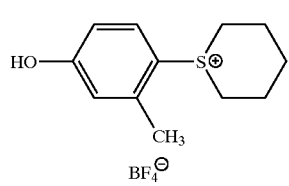
(PAG4-16) 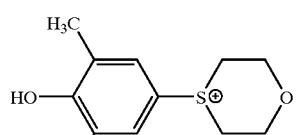
(PAG4-17) 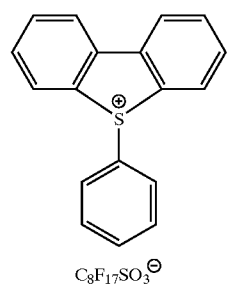
-continued
(PAG4-18) 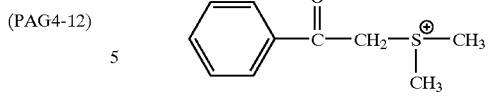
(PAG4-19) 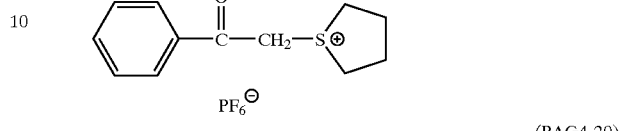
(PAG4-20) 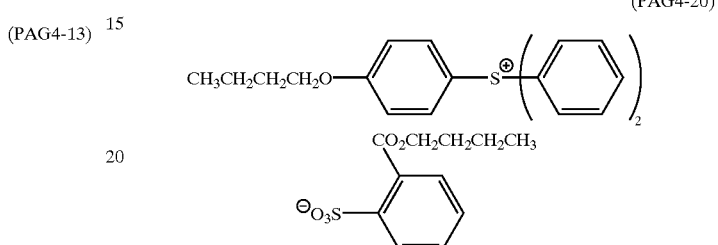
(PAG4-21) 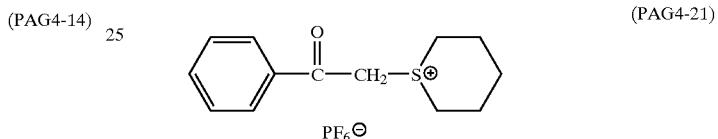
(PAG4-22) 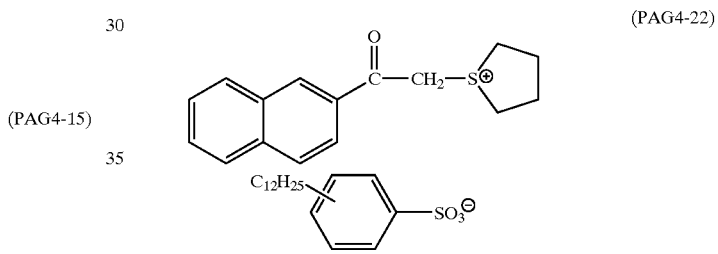
(PAG4-23) 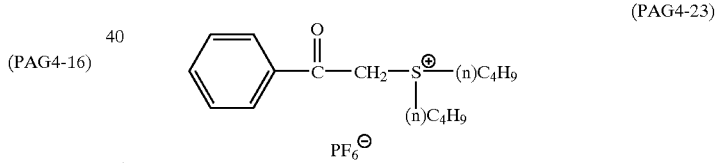
(PAG4-24) 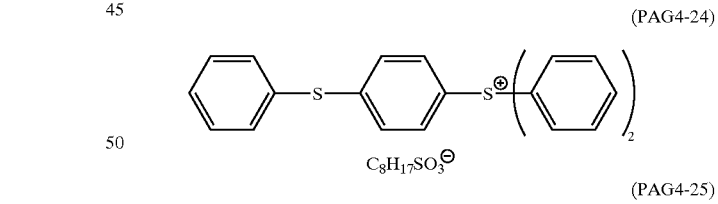
(PAG4-25) 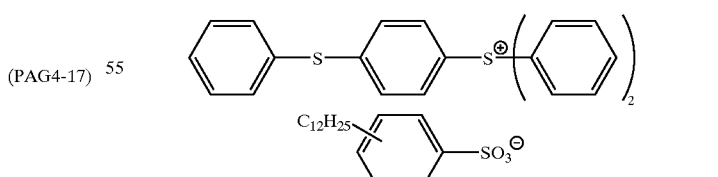
(PAG4-26) 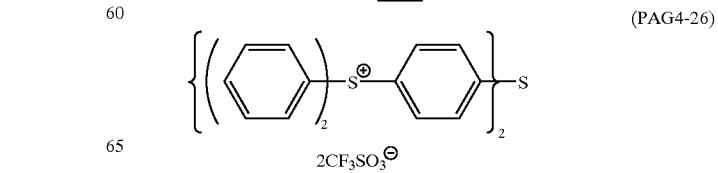

(PAG4-27)

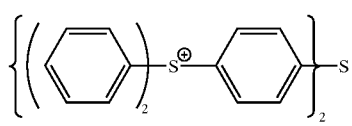

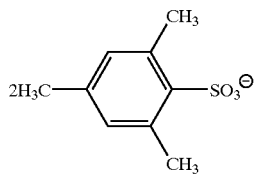

(PAG4-28)

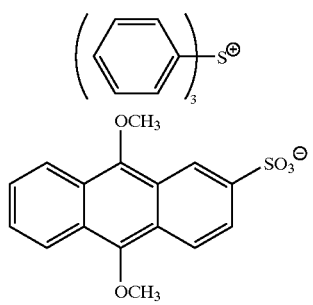

(PAG4-29)

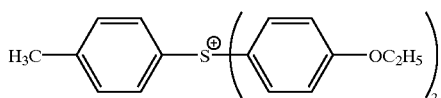

(PAG4-30)

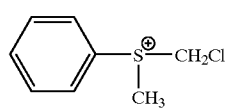

(PAG4-31)

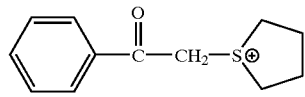

(PAG4-32)

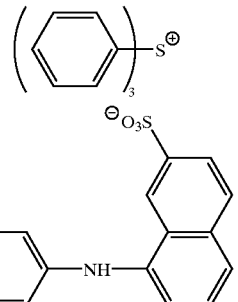

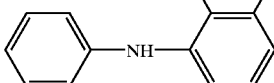

The onium salts represented by formulae (PAG3) and (PAG4) are known and can be synthesized by the methods described, for example, in J. W. Knapczyk et al., *J. Am. Chem. Soc.,* 91, 145 (1969), A. L. Maycok et al., *J. Org. Chem.,* 35, 2532 (1970), E. Goethas et al., *Bull. Soc. Chem. Belg.,* 73, 546 (1964), H. M. Leicester, *J. Ame. Chem. Soc.,* 51, 3587 (1929), J. V. Crivello et al., *J. Polym. Chem. Ed.,* 18, 2677 (1980), U.S. Pat. Nos. 2,807,648 and 4,247,473, and JP-A-53-101331.

(3) Disulfone derivative represented by formula (PAG5) shown below or iminosulfonate derivative represented by formula (PAG6) shown below:

$$Ar^3—SO_2—SO_2—Ar^4 \quad \text{(PAG5)}$$

(PAG6)

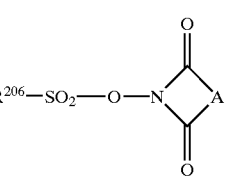

wherein $Ar^3$ and $Ar^4$ each independently represents a substituted or unsubstituted aryl group, $R^{206}$ represents a substituted or unsubstituted alkyl group or aryl group, and A represents a substituted or unsubstituted alkylene group, alkenylene group or arylene group.

Specific examples thereof include the following compounds, however, the present invention should not be construed as being limited thereto.

(PAG5-1)

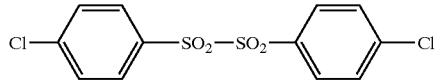

(PAG5-2)

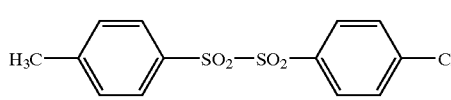

(PAG5-3)

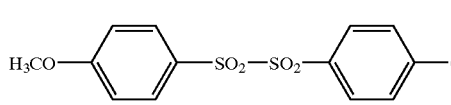

(PAG5-4)

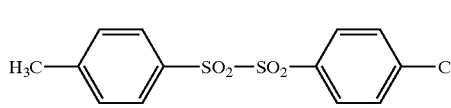

-continued
(PAG5-5)
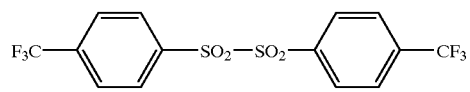
(PAG5-6)
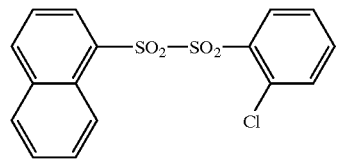
(PAG5-7)
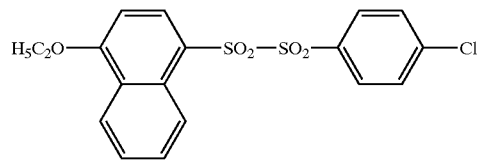
(PAG5-8)
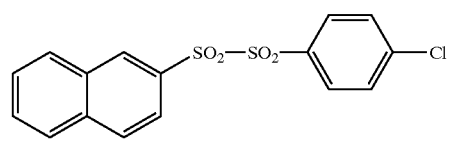
(PAG5-9)
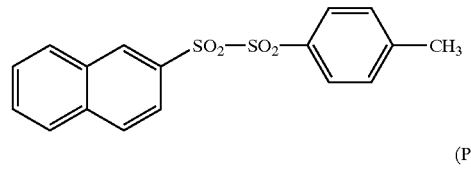
(PAG5-10)
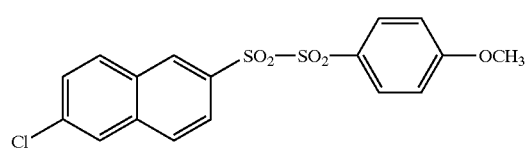
(PAG5-11)
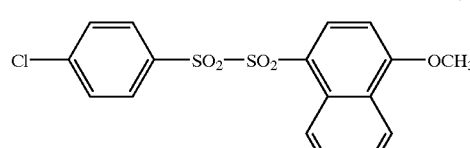
(PAG5-12)
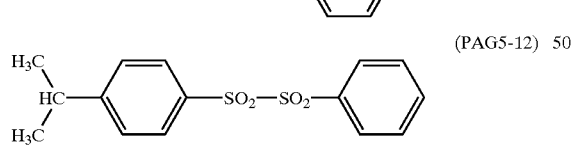
(PAG5-13)
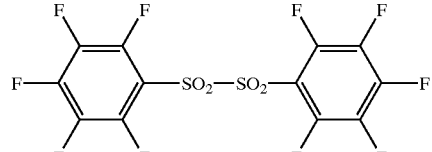
(PAG5-14)
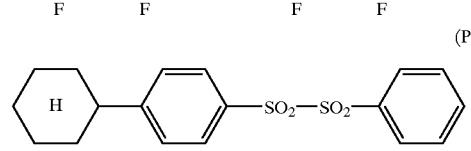
-continued
(PAG5-15)
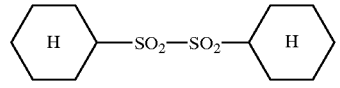
(PAG6-1)
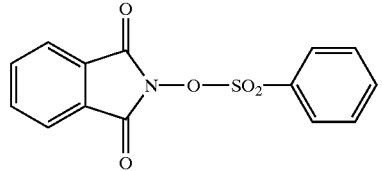
(PAG6-2)
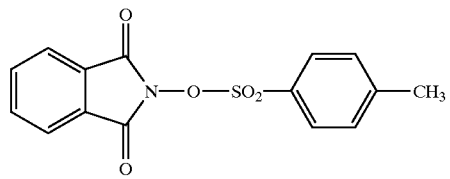
(PAG6-3)
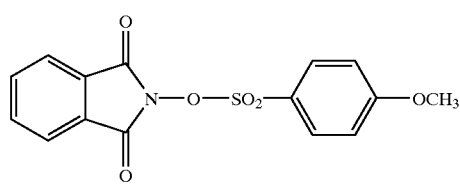
(PAG6-4)
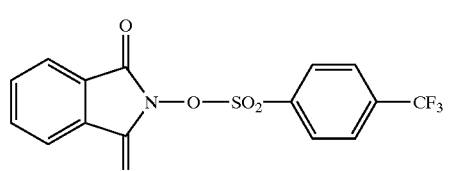
(PAG6-5)
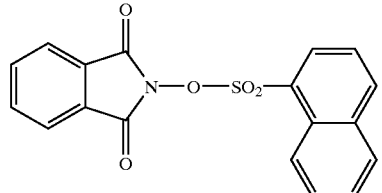
(PAG6-6)
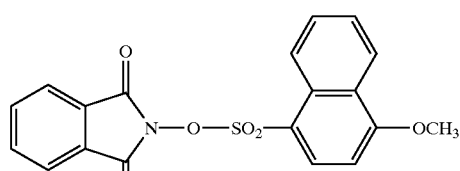
(PAG6-7)
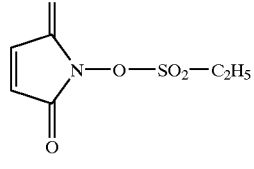

(PAG6-8)
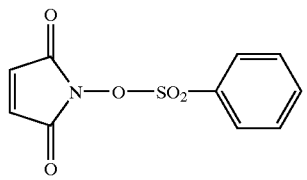

(PAG6-9)
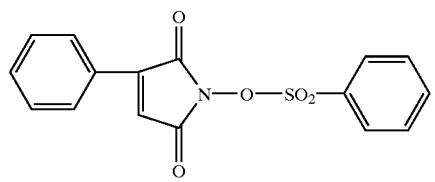

(PAG6-10)
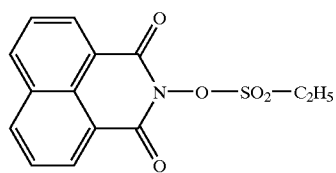

(PAG6-11)
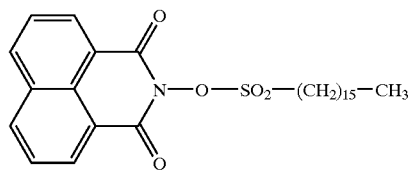

(PAG6-12)
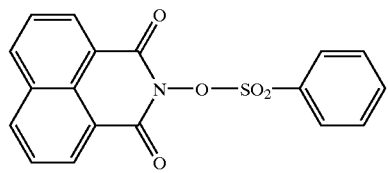

(PAG6-13)
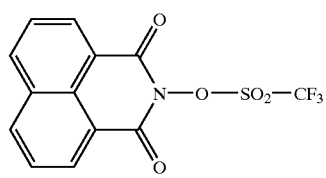

(PAG6-14)
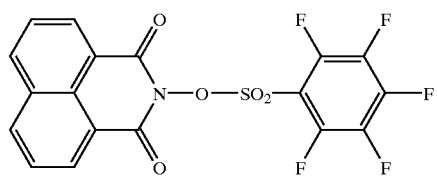

(PAG6-15)
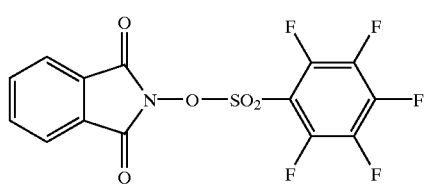

(PAG6-16)
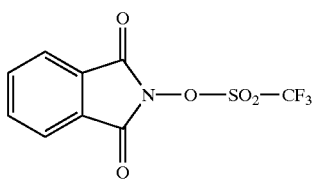

(PAG6-17)
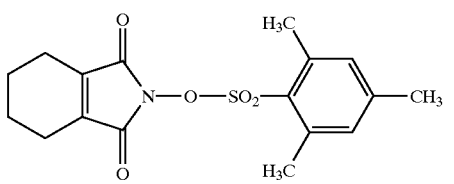

(PAG6-18)
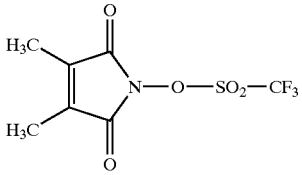

(PAG6-19)
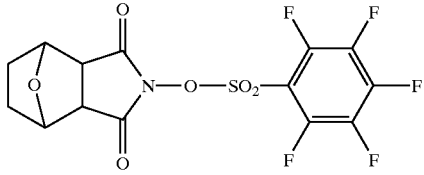

(PAG6-20)
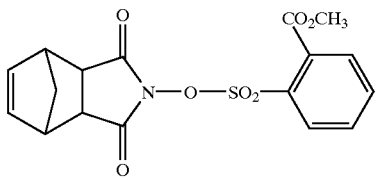

(4) Diazodisulfone derivative represented by formula (PAG7) shown below:

(PAG7)
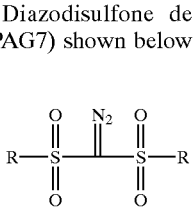

wherein R represents a straight-chain, branched chain or cyclic alkyl group or an aryl group which may be substituted.

Specific examples thereof include the following compounds, however, the present invention should not be construed as being limited thereto.

(PAG7-1)
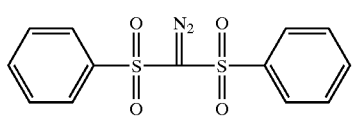

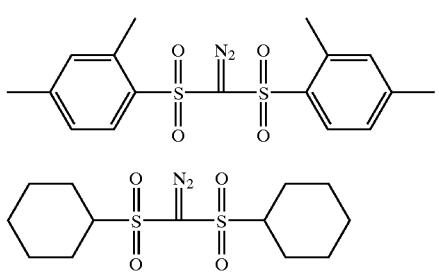

(PAG7-2)

(PAG7-3)

The amount of the compound which decomposes on irradiation of an actinic ray or radiation and generates an acid to be used is usually from 0.001 to 40% by weight, preferably from 0.01 to 20% by weight, more preferably from 0.1 to 5% by weight, based on the solid content of the positive photosensitive composition. If the amount added of the compound which decomposes on irradiation of an actinic ray or radiation and generates an acid is less than 0.001% by weight, the sensitivity is reduced, whereas if the amount added exceeds 40% by weight, the resist exhibits too much light absorption, resulting in causing disadvantageous effects such as deterioration of profile or narrow process (particularly bake) margin.

Other Components for use in the First Embodiment of the Photosensitive Composition According to the Present Invention:

The positive photosensitive composition of the present invention may further contain, if desired, an acid decomposable dissolution accelerating compound, a dye, a plasticizer, a surface active agent, a photosensitizer, an organic basic compound, a compound which accelerates the solubility in a developing solution, and the like.

The compound for accelerating the dissolution in a developing solution, which can be used in the present invention, is a low molecular compound containing two or more phenolic OH groups or one or more carboxyl group and having a molecular weight of 1,000 or less. In the case where the compound contains a carboxyl group, an alicyclic or aliphatic compound is preferred from the same reason as described above.

The amount of the dissolution accelerating compound added is preferably from 2 to 50% by weight, more preferably from 5 to 30% by weight, based on the resin according to the present invention. If the amount added exceeds 50 wt %, development residue increases adversely or a new problem disadvantageously arises such that the pattern deforms at the development.

The above-described phenol compound having a molecular weight of 1,000 or less can be easily synthesized by one skilled in the art making reference to the methods described, for example, in JP-A-1-22938, JP-A-2-28531, U.S. Pat. No. 4,916,210 and European Patent 219294.

Specific examples of the phenol compound are described below, however, the compounds which can be used in the present invention should not be construed as being limited thereto.

Resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucocide, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenylsulfone, tris(4-hydroxyphenyl) methane, 1,1-bis(4-hydroxyphenyl)cyclohexane, 4,4-(α-methylbenzylidene)bisphenol, α,α',α''-tris(4-hydroxyphenyl)-1,3,5-triisopropylbenzene, α,α',α''-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)-hexane, 1,2-tetrakis(4-hydroxyphenyl)ethane, 1,1,3-tris(hydroxyphenyl)butane and para [α,α,α',α'-tetrakis(4-hydroxyphenyl)]xylene.

The organic basic compound which can be used in the present invention is preferably a compound having basicity stronger than the phenol, more preferably a nitrogen-containing basic compound.

The preferred chemical environment thereof includes the following structures (A) to (E).

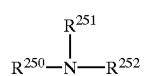

(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, and $R^{251}$ and $R^{252}$ may combine with each other to form a ring;

(B)

(C)

(D)

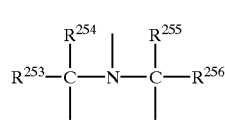

(E)

wherein $R^{253}$, $R^{254}$, $R^{255}$ and $R^{256}$, which may be the same or different, each represents an alkyl group having from 1 to 6 carbon atoms.

More preferred is a nitrogen-containing basic compound containing two or more nitrogen atoms of different chemical environments in one molecule, still more preferred is a compound containing both a substituted or unsubstituted amino group and a ring structure having a nitrogen atom, or a compound having an alkylamino group. Preferred specific examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. The substituent is preferably an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group or a cyano group. More preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)-piperidine, 4-amino-2,2,6,6-tetramethylpiperidine, 4-piperidinopiperidine, 2-iminopiperidine, 1-(2-aminoethyl)-pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diaza-bicyclo[4,3,0]non-5-ene, 1,8-diazabicyclo[5,4,0]undec-7-ene and 2,4,5-triphenylimidazole. However, the present invention should not be construed as being limited thereto.

The nitrogen-containing basic compounds are used individually or in combination of two or more thereof. The amount of the nitrogen-containing basic compound used is usually from 0.001 to 10% by weight, preferably from 0.01 to 5% by weight, based on the solid content of the photosensitive composition. If the amount used is less than 0.001% by weight, the effect owing to the addition of the nitrogen-containing basic compound may not be obtained, whereas if it exceeds 10% by weight, reduction in sensitivity or deterioration in developing property of the unexposed area is liable to occur.

Suitable dyes include an oil dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are manufactured by Orient Chemical Industries Co., Ltd.), Crystal Violet (CI42555), Methyl Violet (CI42535), Rhodamine B (CI45170B), Malachite Green (CI42000) and Methylene Blue (CI52015).

In order to improve acid generation ratio on exposure, a photosensitizer may be added. Specific examples of suitable photosensitizers include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, the present invention should not be construed as being limited thereto.

The photosensitizer may also be used as a light absorbent of far ultraviolet light from a light source. In this case, the absorbent reduces reflected light from a substrate and decreases the influence of multiple reflection in the resist layer, thereby exerting the effect of improving the standing wave.

The photosensitive composition of the present invention is dissolved in a solvent which can dissolve the above-described respective components, and then coated on a support. The solvent used is preferably ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone or tetrahydrofuran. The solvents are used individually or in combination of two or more thereof.

In the present invention, a surface active agent other than the fluorine-base and/or silicon-base surface active agent (F) described above may be added. Specific examples thereof include a nonionic surface active agent, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate. The amount of the surface active agent used is usually 2% by weight or less, preferably 1% by weight or less, based on the solid content of the photosensitive composition of the present invention.

The surface active agents may be used individually or in combination of two or more thereof.

Other components for use in the second embodiment of the photosensitive composition according to the present invention:

The positive photosensitive composition of the present invention may further contain, if desired, an acid decomposable dissolution inhibiting compound, and a dye, a plasticizer, a surface active agent, a photosensitizer, an organic basic compound, a compound which accelerates the dissolution in a developing solution, and the like as described regarding to the first embodiment of the photosensitive composition above.

The acid decomposable dissolution inhibiting compound for use in the present invention includes a low molecular weight compound containing at least one acid-decomposable group represented by formula (XIII) or (XIV) and having a molecular weight of 3,000 or less. In order to prevent reduction in the transmittance particularly at 220 nm or less, an alicyclic or aliphatic compound such as a cholic acid derivative described in *Proceeding of SPIE*, 2724, 355 (1996) is preferred. In the present invention, when the acid decomposable dissolution inhibiting compound is used, the amount thereof added is from 3 to 50% by weight, preferably from 5 to 40% by weight, more preferably from 10 to 35% by weight, based on the whole weight of the photosensitive composition (excluding the solvent).

The second embodiment of the photosensitive composition according to the present invention is also dissolved in a solvent which can dissolve the above-described respective components, and then coated on a support. Specific examples of the solvent used are same as those described for the first embodiment of the photosensitive composition above.

To the solvent, a surface active agent may be added. Specific examples thereof include a nonionic surface active agent, for example, polyoxyethylene alkyl ethers such as polyoxyethylene lauryl ether, polyoxyethylene stearyl ether, polyoxyethylene cetyl ether and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; a fluorine-base surface active agent such as F-top EF301, EF303 and EF352 (manufactured by Shin Akita Chemical Co., Ltd.), Megafac F171 and F173 (manufactured by Dainippon Ink and Chemicals, Inc.), Fluorad FC430 and FC431 (both manufactured by Sumitomo 3M Ltd.), Asahiguard AG710, Surflon S-382, SC101, SC102, SC103, SC104, SC105 and SC-106 (manufactured by Asahi Glass Co., Ltd.), organosiloxane polymer KP-341 (manufactured by Shin-Etsu Chemical Co., Ltd.), and acrylic acid-base or methacrylic acid-base (co)polymer Polyflow No. 75 and No. 95 (manufactured by Kyoeisha Yushi Kagaku Kogyo Co., Ltd.). The amount of the surface active agent added is ordinarily 2 parts by weight or less, preferably 1 part by weight or less, per 100 parts by weight of the solid content in the photosensitive composition according to the present invention.

The surface active agents may be used individually or in combination of two or more thereof.

The above-described first or second embodiment of the photosensitive composition is coated on a substrate (e.g. silicon/silicon dioxide coating) for use in the production of a precision integrated circuit element by an appropriate coating means such as spinner or coater, exposed through a predetermined mask, baked and developed to thereby obtain a good resist pattern.

The exposure light is preferably far ultraviolet light having a wavelength of 250 nm or less, more preferably 220 nm or less. Specific examples thereof include KrF excimer laser (248 nm), ArF excimer laser (193 m), $F_2$ excimer laser (157 nm), X ray and an electron beam.

A developing solution which can be used for the photosensitive composition according to the present invention is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide and tetraethylammonium hydroxide, and a cyclic amine such as pyrrole and piperidine.

To the alkaline aqueous solution, an appropriate amount of an alcohol or surface active agent may be added.

EXAMPLES

The present invention will be described in greater detail with reference to the following examples, however, the present invention should not be construed as being limited thereto.

Synthesis Example 1
Synthesis of Raw Material Monomer for Repeating Unit (a1)

In 500 ml of isopropyl alcohol, 25 g of γ-crotonolactone was dissolved and the resulting solution was irradiated with a low-pressure mercury lamp (6 W, manufactured by Usio Inc.) in a quartz photoreaction apparatus for 80 hours. The reaction solution was filtered and isopropyl alcohol was distilled off to obtain a crude product. The crude product was purified by distillation under a reduced pressure to obtain 31 g of an alcohol compound.

In 100 ml of tetrahydrofuran, 9.3 g (64.6 mmol) of the alcohol compound thus-obtained was dissolved, and to the solution were added 12.8 g (129.2 mmol) of triethylamine and 0.7 g of N,N-dimethylaminopyridine. To the solution was dropwise added 10.1 g (96.9 mmol) of methacrylic chloride under cooling with ice over a period of 30 minutes and the mixture was stirred for 2 hours under cooling with ice and then for 3 hours at room temperature. Water was added to the reaction solution and the mixture was stirred for some time, then ethyl acetate was added thereto, followed by separation. The organic layer was washed with water and then with brine, dried and concentrated to obtain a crude product. The crude product was purified by column chromatography to obtain 2.7 g of the desired compound.

Synthesis Example 2
Synthesis of Raw Material Monomer for Repeating Unit (a2)

Raw material monomer for repeating unit (a2) is obtained in the same manner as in Synthesis Example 1 above expect for changing methacrylic chloride used in Synthesis Example 1 to acrylic chloride.

Synthesis Example 3
Synthesis of Raw Material Monomer for Repeating Unit (a3)

Raw material monomer for repeating unit (a3) is obtained in the same manner as in Synthesis Example 1 above expect for changing isopropyl alcohol used in Synthesis Example 1 to cyclohexanol.

In the same manner as described above, an α,β-unsaturated carbonyl compound and a secondary alcohol were subjected to photoreaction to prepare a tertiary alcohol, and then the latter was reacted with the corresponding acid chloride, acid anhydride or isocyanate to obtain raw material monomers for repeating units (a4) to (a36), respectively.

Synthesis Example 4
Synthesis of Raw Material Monomer for Repeating Unit (a39)

In 80 ml of methyl isobutyl ketone, 19.8 g of α-bromo-γ-butyrolactone and 25 g of 2-hydroxyisobutyrate were dissolved and to the resulting solution was added 36 g of triethylamine. The mixture was reacted at room temperature for 10 hours and the solid thus deposited was filtered. The filtrate was washed with a 5% aqueous sodium hydrogen carbonate solution, distilled water and a saturated sodium chloride solution, dried and concentrated to obtain 11.7 g of a crude product.

The crude product was dissolved in 100 ml of tetrahydrofuran, and to the solution were added 12.7 g of triethylamine and 0.1 g of N,N-dimethylaminopyridine. To the solution was dropwise added 9.8 g of methacrylic chloride over a period of 30 minutes and the mixture was reacted for 20 hours at room temperature. To the reaction solution was added 100 ml of distilled water, and the mixture was stirred for 30 minutes and then extracted with ethyl acetate. The organic layer was washed with water, dried and concentrated to obtain a crude product. The crude product was purified by column chromatography to obtain 7.2 g of the desired compound.

Synthesis Example 5
Synthesis of Raw Material Monomer for Repeating Unit (a41)

In 80 ml of methanol, 9 g of sodium borohydride was dissolved and to the resulting solution was added dropwise 15 g of α-acetyl-γ-butyrolactone over a period of 30 minutes. After reacting at room temperature for 5 hours, 4.5 g of sodium borohydride was added to the mixture, followed by reacting for 5 hours. To the reaction solution was added 100 ml of water and hydrochloric acid was added thereto until the solution indicated week acidic property. The solution was concentrated and ethyl acetate was added thereto. After removing the insoluble substance by filtration, the filtrate was concentrated to obtain a crude product. The crude product was purified by column chromatography to obtain 10.5 g of an alcohol compound.

In 50 ml of tetrahydrofuran, 3 g of the alcohol compound thus-obtained was dissolved, and to the solution were added 2.3 g of triethylamine and 0.05 g of N,N-dimethylaminopyridine. To the solution was dropwise added 2.4 g of methacrylic chloride over a period of 30 minutes and the mixture was reacted for 2 hours at room temperature. To the reaction solution was added 100 ml of distilled water, and the mixture was stirred for 30 minutes and then extracted with ethyl acetate. The organic layer was washed with water, dried and concentrated to obtain a crude product. The crude product was purified by column chromatography to obtain 3.9 g of the desired compound.

Synthesis Example 6
Synthesis of Methyl-2-adamantyl Methacrylate (b1)

In 300 ml of tetrahydrofuran, 30 g of 2-methyl-2-adamantanol, 36 g of triethylamine and 4 g of N,N-dimethylaminopyridine were dissolved, and to the solution was dropwise added 29 g of methacrylic chloride under cooling with ice over a period of 30 minutes. The temperature of the solution was raised to room temperature and reacted as it was overnight. To the reaction solution was added 500 ml of distilled water under cooling with ice and then extracted with ethyl acetate. The organic layer was dried and concentrated to obtain a crude product. The crude product was purified by column chromatography to obtain 17 g of the desired compound.

Synthesis Example 7
Synthesis of Cedrol Acrylate (b5)

In 200 ml of tetrahydrofuran, 25 g of (+)-Cedrol (manufactured by Lancaster) was dissolved, and to the solution were added 22.8 g of triethylamine and 1 g of N,N-dimethylaminopyridine. To the solution was dropwise added 15.2 g of acrylic chloride under cooling with ice over a period of 30 minutes and the mixture was stirred at room temperature for 2 days. To the reaction solution was added 100 ml of distilled water under cooling with ice, and the mixture was stirred for 30 minutes and 300 ml of ethyl acetate was added thereto. The water layer was removed by separation and the organic layer was washed with water, dried and concentrated to obtain a crude product. The crude product was purified by column chromatography to obtain 18.2 g of the desired compound which is a raw material monomer for repeating unit (b5).

Synthesis Example 8
Synthesis of Polymer (P1) According to the Present Invention In 30 ml of N,N-dimethylacetamide, 10 g of Raw Material Monomer for Repeating Unit (a3), 0.05 g of 2',2'-azobis(2,4-dimethylvaleronitrile) (V-65 manufactured by Wako Pure Chemical Industries, Ltd.) as a polymerization initiator and 0.15 g of mercaptoacetic acid were dissolved, and the resulting solution was heated at 60° C. under a nitrogen gas stream and dropwise added to 10 ml of N,N-dimethylacetamide over a period of 4 hours. Two hours after the completion of the addition, 0.50 g of V-65 was added thereto, followed by reacting under heating for 2 hours. The reaction solution was allowed to cool and poured into one liter of ion exchanged water, and the solid deposited was collected by filtration. The solid was dissolved in 100 ml of tetrahydrofuran, the solution was poured into one liter of hexane, and the solid deposited was collected by filtration to obtain Polymer (P1) containing Repeating Unit (a3). A weight average molecular weight of the polymer was 7,300 and a degree of dispersion thereof was 2.8.

Synthesis Example 9
Synthesis of Polymer (P2) According to the Present Invention In 8.2 g of N,N-dimethylacetamide, 1.2 g of Raw Material Monomer for Repeating Unit (a1), 1.36 g of Raw Material Monomer for Repeating Unit (b1), 0.16 g of 2',2'-azobis(2,4-dimethylvaleronitrile) and 0.043 g of mercaptoacetic acid were dissolved, and 1.4 g of tetrahydrofuran was added thereto. The resulting solution was heated at 60° C. under a nitrogen gas stream and 2 g of N,N-dimethylacetamide was dropwise added thereto over a period of 4 hours. Two hours after the completion of the addition, 0.16 g of 2',2'-azobis (2,4-dimethylvaleronitrile) was added thereto, followed by reacting under heating for 2 hours. The reaction solution was allowed to cool and poured into one liter of ion exchanged water, and the solid deposited was collected by filtration. The solid was dissolved in 100 ml of tetrahydrofuran, the solution was poured into one liter of hexane, and the solid deposited was collected by filtration to obtain Polymer (P2). A weight average molecular weight of the polymer was 6,500 and a degree of dispersion thereof was 2.0.

In the same manner as described in Synthesis Examples 8 and 9, Polymers (P3) to (P25) were synthesized using raw material monomers corresponding to the repeating units shown in Table 1 below, respectively. In addition to the repeating units, the molar ratio of the raw material monomers used and the weight average molecular weight and degree of dispersion of the resin obtained are also shown in Table 1.

TABLE 1

| | Repeating Unit and Molecular Weight of Resins of the Present Invention | |
|---|---|---|
| Resin of the Present Invention | Repeating Unit Used (molar ratio) | Weight Average Molecular Weight (degree of dispersion) |
| (P1) | (a3) (100) | 7300 (2.3) |
| (P2) | (a1)/(b1) (50/50) | 6500 (2.0) |
| (P3) | (a2)/(b2) (50/50) | 10500 (3.0) |

TABLE 1-continued

Repeating Unit and Molecular Weight of
Resins of the Present Invention

| Resin of the Present Invention | Repeating Unit Used (molar ratio) | Weight Average Molecular Weight (degree of dispersion) |
|---|---|---|
| (P4) | (a3)/(b5) (60/40) | 8200 (2.2) |
| (P5) | (a20)/(b10) (40/60) | 6300 (3.0) |
| (P6) | (a31)/(b11) (50/50) | 7600 (1.6) |
| (P7) | (a21)/(tert-butyl methacrylate) (70/30) | 12300 (2.5) |
| (P8) | (a5)/(b43) (40/60) | 24000 (2.8) |
| (P9) | (a15)/(tert-butyl methacrylate/acrylic acid) (80/10/10) | 5700 (1.5) |
| (P10) | (a16)/(b34) (60/40) | 5900 (1.8) |
| (P11) | (a39)/(b1) (50/50) | 7500 (1.8) |
| (P12) | (a41)/(b1) (50/50) | 5500 (1.9) |
| (P13) | (a43)/(b2) (50/50) | 11500 (2.1) |
| (P14) | (a39)/(b1)/methacrylic acid (40/50/10) | 8900 (2.0) |
| (P15) | (a51)/(b1) (50/50) | 14600 (2.0) |
| (P16) | (a53)/(b51) (60/40) | 12800 (2.1) |
| (P17) | (a52)/(b2)/methacrylic acid (50/40/10) | 21300 (2.3) |
| (P18) | (a54)/(b53) (55/45) | 18600 (1.9) |
| (P19) | (a39)/(b51) (60/40) | 11900 (2.2) |
| (P20) | (a39)/(b51)/methacrylic acid (45/45/10) | 25800 (2.5) |
| (P21) | (a55)/(b1) (50/50) | 8900 (1.7) |
| (P22) | (a57)/(b1)/methacrylic acid (44/44/12) | 7000 (1.8) |
| (P23) | (a59)/(b51) (40/60) | 13300 (2.0) |
| (P24) | (a55)/(b51) (50/50) | 6400 (1.7) |
| (P25) | (a55)/(b2) (55/45) | 31100 (2.5) |

Example 1

Measurement of Optical Density

In 4.5 g of propylene glycol monomethyl ether acetate, 1.0 g of the resin obtained in the synthesis example described above according to the present invention and 0.03 g of triphenylsulfonium triflate were dissolved, and the resulting solution was filtered through a Teflon filter of 0.2 μm. The solution was uniformly coated on a quartz glass substrate by a spin coater and died by heating on a hot plate at 100° C. for 90 seconds to form a resist film having a thickness of 1 μm. Optical absorption of the resulting film was measured by an ultraviolet spectrophotometer. The optical density at 193 nm is shown in Table 2 below.

TABLE 2

Results of Optical Density Measurement
of Resins of the Present Invention

| Resin of the Present Invention | Optical Density at 193 nm (/μm) |
|---|---|
| (P1) | 0.38 |
| (P2) | 0.40 |
| (P3) | 0.37 |
| (P4) | 0.43 |
| (P5) | 0.34 |
| (P6) | 0.37 |
| (P7) | 0.45 |
| (P8) | 0.40 |
| (P9) | 0.33 |
| (P10) | 0.35 |
| Poly (p-hydroxystyrene) (Comparison) | 1.5 or more |

It can be seen from the results shown in Table 2 that the optical density value measured of each of the resins according to the present invention is smaller than the value of poly(p-hydroxystyrene) for comparison and the resins have sufficiently high transmittance to the light of 193 nm.

Example 2

Measurement of Dry Etching Resistance

In 4.5 g of propylene glycol monomethyl ether acetate, 1.0 g of the resin obtained in the synthesis example described above according to the present invention was dissolved, and the resulting solution was filtered through a Teflon filter of 0.2 μm. The solution was uniformly coated on a silicon substrate by a spin coater and died by heating on a hot plate at 100° C., for 90 seconds to form a resist film having a thickness of 0.7 μm. The film obtained was measured on a etching rate of $CF_4/O_2$ (8/2) gas using a reactive ion etching apparatus (CSE-1110 manufactured by ULVAC) under the etching conditions of power of 500 W, pressure of 4.6 Pa and gas flow rate of 10 sccm. The results obtained are shown in Table 3 below.

TABLE 3

Results of Dry Etching Resistance Measurement
of Resins of the Present Invention

| Resin of the Present Invention | Etching Rate (Å/min) |
|---|---|
| (P1) | 700 |
| (P2) | 750 |
| (P3) | 810 |
| (P4) | 700 |
| (P5) | 680 |
| (P6) | 740 |
| (P7) | 780 |
| (P8) | 700 |
| (P9) | 720 |
| (P10) | 710 |
| Poly (methyl methacrylate) (Comparison) | 1250 |
| Polymer (1) (Comparison) | 960 |
| Polymer (2) (Comparison) | 830 |

Polymer (1):

Tricyclodecanyl methacrylate/tetrahydropyranyl methacrylate/methacrylic acid (50/30/20 in molar ratio) copolymer (weight average molecular weight: 32,500; degree of dispersion: 2.7)

Polymer (2):
   2-Methyladamantyl methacrylate/methacrylic acid (±)-mevalonic lactone ester (synthesized by the method described in JP-A-9-90637)

It can be seen from the results shown in Table 3 that the etching rate of each of the resins according to the present invention is smaller than that of poly(methyl methacrylate), Polymer (1) or Polymer (2) for comparison and have a sufficiently high dry etching resistance.

Example 3

Evaluation of Image

In 4.5 g of propylene glycol monomethyl ether acetate, 1.0 g of the resin obtained in the synthesis example described above according to the present invention, 0.03 g of triphenylsulfonium triflate and 0.004 g of 1,5-diazabicyclo[4,3,0]non-5-ene were dissolved, and the resulting solution was filtered through a Teflon filter of 0.2 μm. The solution was uniformly coated on a silicon substrate which had been subjected to hexamethyldisilazane treatment by a spin coater and died by heating on a hot plate at 100° C. for 90 seconds to form a resist film having a thickness of 0.4 μm. The resist film was subjected to pattern exposure using KrF excimer laser stepper (NA=0.42; 248 nm) and heated on a hot plate at 110° C. for 60 seconds immediately after the exposure. Then the resist film was developed by immersing it in a 2.38% aqueous tetramethylammonium hydroxide solution at 23° C. for 60 seconds, rinsed with pure water for 30 seconds and dried.

A pattern form, sensitivity and resolution were evaluated with each resist pattern obtained. Specifically, the pattern form was determined by observation of the pattern obtained through a scanning electron microscope and a pattern in a rectangular form was evaluated good.

The sensitivity was evaluated using an exposure amount necessary for reproducing a mask pattern of 0.35 μm.

The resolution was evaluated using limiting resolution in an exposure amount necessary for reproducing a mask pattern of 0.35 μm.

As a result, with the sensitivity and resolution as shown in Table 4 below, good positive pattern wherein only the exposed portion of the resist film was dissolved out was obtained.

TABLE 4

| Resin of the Present Invention | Sensitivity (mJ/cm²) | Resolution (μm) | Pattern Form |
|---|---|---|---|
| (P1) | 22 | 0.26 | good |
| (P2) | 21 | 0.27 | good |
| (P3) | 24 | 0.25 | good |
| (P4) | 26 | 0.26 | good |
| (P5) | 18 | 0.25 | good |
| (P6) | 21 | 0.27 | good |
| (P7) | 23 | 0.25 | good |
| (P8) | 22 | 0.26 | good |
| (P9) | 20 | 0.27 | good |
| (P10) | 27 | 0.25 | good |
| Polymer (2) | 30 | 0.28 | good |

It can be seen from the results shown in Table 4 that the resist using the resin according to the present invention exhibits high sensitivity and good resolution. Further, a good pattern form was obtained using the resin according to the present invention.

Example 4

Evaluation of Image

On each of the resist films having a thickness of 0.4 μm obtained in Example 3, a mask prepared by drawing a pattern with chromium on a quartz plate was closely contacted and an ArF excimer laser beam (193 nm) was irradiated thereto. The resist film was heated on a hot plate at 110° C. for 60 seconds immediately after the exposure. Then the resist film was developed by immersing it in a 2.38% aqueous tetramethylammonium hyrdoxide solution at 23° C. for 60 seconds, rinsed with pure water for 30 seconds and dried. As a result, with the sensitivity and resolution as shown in Table 5 below, good positive pattern wherein only the exposed portion was dissolved out was obtained.

Further, the photosensitive resin composition prepared in Example 3 was uniformly coated on a silicon substrate which had been subjected to hexamethyldisilazane treatment by a spin coater and died by heating on a hot plate at 120° C. for 90 seconds to form a resist film having a thickness of 0.50 μm. The resist film was exposed to an ArF excimer laser beam through a mask and heated on a hot plate at 110° C. for 90 seconds immediately after the exposure. Then the resist film was developed with a 2.38% by weight aqueous tetramethylammonium hydroxide solution at 23° C. for 60 seconds, rinsed with pure water for 30 seconds and dried. The sample having a contact hole pattern formed thereon was examined by KLA 2112 (manufactured by KLA Tencol Co., Ltd.) to measure a number of development defects (Number of Development Defects I) (Threshould: 12; Pixcel Size: 0.39). The results obtained are also shown in Table 5 below.

TABLE 5

| Resin of the Present Invention | Sensitivity (mJ/cm²) | Resolution (μm) | Pattern Form | Number of Development Defects I |
|---|---|---|---|---|
| (P1) | 20 | 0.23 | good | 8 |
| (P2) | 16 | 0.23 | good | 10 |
| (P3) | 20 | 0.23 | good | 5 |
| (P4) | 21 | 0.23 | good | 9 |
| (P5) | 17 | 0.23 | good | 14 |
| (P6) | 22 | 0.23 | good | 12 |
| (P7) | 20 | 0.23 | good | 5 |
| (P8) | 21 | 0.23 | good | 15 |
| (P9) | 20 | 0.23 | good | 11 |
| (P10) | 21 | 0.23 | good | 10 |
| (P11) | 13 | 0.21 | good | 9 |
| (P12) | 28 | 0.23 | good | 14 |
| (P13) | 20 | 0.23 | good | 14 |
| (P14) | 14 | 0.21 | good | 12 |
| (P15) | 12 | 0.21 | good | 2 |
| (P16) | 15 | 0.22 | good | 4 |
| (P17) | 14 | 0.21 | good | 3 |
| (P18) | 15 | 0.22 | good | 4 |
| (P19) | 14 | 0.21 | good | 3 |
| (P20) | 13 | 0.21 | good | 4 |
| (P21) | 13 | 0.21 | good | 4 |
| (P22) | 14 | 0.21 | good | 2 |
| (P23) | 12 | 0.21 | good | 3 |
| (P24) | 14 | 0.21 | good | 4 |
| (p25) | 13 | 0.21 | good | 4 |
| Polymer (2) (Comparison) | 36 | 0.25 | good | 29 |
| Polymer (3) (Comparison) | 48 | 0.25 | good | 40 |

Polymer (3):
   2-Methyl-2-adamantyl methacrylate/α-methacryloxy-γ-butyrolactone copolymer (synthesized by the method described in EP-A-856,773)

With all of the polymers shown in Table 5, peeling off of the film did not occur at the development of fine patterns.

It can be seen from the results shown in Table 5 that the resist using the resin according to the present invention exhibits good sensitivity and resolution and forms a good positive pattern having a small number of development defects in case of using an ArF excimer laser beam.

Example 5

Evaluation of Image

To each of the photosensitive resin compositions prepared in Example 3 was added 0.005 g of each of the surface active agents shown in Table 6 below, and using the resulting composition a resist film was prepared. The resist film was subjected to the same procedure such as the heating, development, rinsing and drying as described for the examination of Number of Development Defects I in Example 4 except for eliminating the exposure (Number of Development Defects II). The results obtained are shown in Table 6 below.

TABLE 6

| Resin of the Present Invention | Surface Active Agent | Number of Development Defects II |
|---|---|---|
| (P1) | W1 | 18 |
| (P2) | W2 | 19 |
| (P3) | W3 | 12 |
| (P4) | W1 | 20 |
| (P5) | W1 | 33 |
| (P6) | W2 | 28 |
| (P7) | W3 | 15 |
| (P8) | W1 | 29 |
| (P9) | W1 | 28 |
| (P10) | W2 | 28 |
| (P11) | W1 | 14 |
| (P12) | W2 | 20 |
| (P13) | W3 | 27 |
| (P14) | W1 | 25 |
| (P15) | W1 | 11 |
| (P16) | W2 | 16 |
| (P17) | W3 | 13 |
| (P18) | W2 | 11 |
| (P19) | W3 | 10 |
| (P20) | W1 | 10 |
| (P21) | W1 | 11 |
| (P22) | W2 | 12 |
| (P23) | W3 | 12 |
| (P24) | W2 | 13 |
| (p25) | W3 | 11 |

W-1: Megafac F176 (manufactured by Dainippon Ink and Chemicals, Inc.) (fluorine-base)
W-2: Megafac R08 (manufactured by Dainippon Ink and Chemicals, Inc.) (fluorine-base and silicon-base)
W-3: Polysiloxane polymer KP-341 (manufactured by Shin-Etsu Chemical Co., Ltd.) (silicon-base)

It can be seen from the results shown in Table 6 that the resin composition containing a fluorine-base and/or silicon-base surface active agent according to the present invention has a small number of development defects.

As is apparent from the description above, the positive photosensitive composition containing the resin according to the present invention has high transmittance to far ultraviolet light particularly having a wavelength of 220 nm or less and exhibits good dry etching resistance and adhesion and a reduced number of development defect. Further, the positive photosensitive composition exhibits high sensitivity, good resolution and good pattern profile when far ultraviolet light having a wavelength of 250 nm or less, particularly 220 nm or less (especially an ArF excimer laser beam) is employed as an exposure light source, and thus it can be effectively employed for the formation of fine pattern necessary for the production of semiconductor elements.

Synthesis Example 10

Synthesis of Raw Material Monomer for Repeating Unit (a'1)

In 200 ml of tetrahydrofuran, 25 g of (+)-Cedrol (manufactured by Lancaster) was dissolved, and to the solution were added 22.8 g of triethylamine and 1 g of N,N-dimethylaminopyridine. To the solution was dropwise added 15.2 g of acrylic chloride under cooling with ice over a period of 30 minutes and the mixture was stirred at room temperature for 2 days. To the reaction solution was added 100 ml of distilled water under cooling with ice, and the mixture was stirred for 30 minutes and 300 ml of ethyl acetate was added thereto. The water layer was removed by separation and the organic layer was washed with water, dried and concentrated to obtain a crude product. The crude product was purified by column chromatography to obtain 18.2 g of the desired compound which is a raw material monomer for repeating unit (a'1).

Synthesis Example 11

Synthesis of Raw Material Monomer for Repeating Unit (a'2)

Raw material monomer for repeating unit (a'2) is obtained in the same manner as in Synthesis Example 10 above expect for employing methacrylic chloride in place of acrylic chloride used in Synthesis Example 10.

Synthesis Example 12

Synthesis of Raw Material Monomer for Repeating Unit (a'3)

Raw material monomer for repeating unit (a'3) is obtained in the same manner as in Synthesis Example 10 above expect for employing the compound shown below in place of (+)-Cedrol used in Synthesis Example 10.

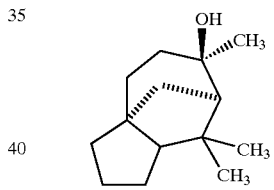

Other monomers can be obtained in the same manner as described above by reacting the corresponding alcohol with the corresponding acid chloride, acid anhydride or isocyanate, respectively.

Synthesis Example 13

Synthesis of Polymer (P1) composed of Unit (a'1)/Unit (c1)/acrylonitrile According to the Present Invention In 70 ml of 1-methoxy-2-propanol, 13.1 g of Raw Material Monomer for Repeating Unit (a'1), 3.6 g of Unit (c1) and 1.59 g of acrylonitrile were dissolved, and to the solution was added 100 mg of 2',2'-azobis(2,4-dimethylvaleronitrile) (V-65 manufactured by Wako Pure Chemical Industries, Ltd.) as a polymerization initiator with stirring at 70° C. under a nitrogen gas stream. Two hours and 4 hours after the initiation of the reaction, each 100 mg of V-65 was added thereto, followed by reacting for 3 hours and then at 90° C. for one hour. The reaction solution was allowed to cool and poured into one liter of ion exchanged water, and the solid deposited was collected by filtration and dried to obtain Polymer (P1) (45/30/25 in molar ratio) according to the present invention. A weight average molecular weight of the polymer measured by GPC and indicated in terms of polystyrene was 15,000 and a degree of dispersion thereof was 2.6.

In the same manner as described in Synthesis Example 13, the resins according to the present invention were synthesized using raw material monomers corresponding to the repeating units shown in Table 7 below, respectively. In addition to the repeating units, the molar ratio of the raw material monomers used and the weight average molecular weight and degree of dispersion of the resin purified are also shown in Table 7.

TABLE 7

Synthesis of Resins of the Present Invention

| Resin of the Present Invention | Repeating Unit Used (molar ratio) | Weight Average Molecular Weight (degree of dispersion) |
|---|---|---|
| (P2) | (a'1)/(c6)/(d2) (50/30/20) | 12600 (2.7) |
| (P3) | (a'2)/(c1) (50/50) | 7100 (1.9) |
| (P4) | (a'2)/(c14) (50/50) | 13500 (1.5) |
| (P5) | (a'3)/(c12)/(d8) (55/30/15) | 18000 (3.1) |
| (P6) | (a'4)/(c15)/(d14) (55/30/15) | 9400 (2.9) |
| (P7) | (a'5)/(c19)/(d18) (50/30/20) | 21000 (3.0) |
| (P8) | (a'6)/(c29)/(d2) (55/30/15) | 28000 (2.7) |
| (P9) | (a'7)/(c14) (50/50) | 32700 (2.8) |
| (P10) | (a'8)/(c18) (40/60) | 6400 (2.6) |

Synthesis of Polymer (2) for Comparison

2-Methyladamantyl methacrylate/tert-butyl methacrylate (50/50 in molar ratio) copolymer was synthesized according to the method described in JP-A-9-73173. The weight average molecular weight of the copolymer was 6,500 and the degree of dispersion thereof was 2.0.

Synthesis of Polymer (3) for Comparison

2-Methyladamantyl methacrylate/methacrylic acid (±)-mevalonic lactone ester (47/53 in molar ratio) copolymer was synthesized according to the method described in JP-A-9-90637. The weight average molecular weight of the copolymer was 14,500 and the degree of dispersion thereof was 1.80.

Example 6
Measurement of Optical Density

A resist film was prepared in the same manner as in Example 1. Optical absorption of the resulting film was measured by an ultraviolet spectrophotometer. The optical density at 193 nm is shown in Table 8 below.

TABLE 8

Results of Optical Density Measurement of Resins of the Present Invention

| Resin of the Present Invention | Optical Density at 193 mn (/μm) |
|---|---|
| (P1) | 0.39 |
| (P2) | 0.42 |
| (P3) | 0.38 |
| (P4) | 0.42 |
| (P5) | 0.37 |
| (P6) | 0.39 |
| (P7) | 0.40 |
| (P8) | 0.42 |
| (P9) | 0.35 |
| (P10) | 0.37 |
| Polymer (2) (Comparison) | 0.42 |
| Polymer (3) (Comparison) | 0.43 |
| Poly (p-hydroxystyrene) (Comparison) | 1.5 or more |

It can be seen from the results shown in Table 8 that the optical density value measured of each of the resins according to the present invention is smaller than the value of poly(p-hydroxystyrene) for comparison and the resins have sufficiently high transmittance to the light of 193 nm.

Example 7
Measurement of Dry Etching Resistance

A resist film was prepared in the same manner as in Example 2. The film obtained was measured on a etching rate of $CF_4/O_2$ (8/2) gas using a reactive ion etching apparatus (CSE-1110 manufactured by ULVAC) under the etching conditions of power of 500 W, pressure of 4.6 Pa and gas flow rate of 10 sccm. The results obtained are shown in Table 9 below.

TABLE 9

Results of Dry Etching Resistance Measurement of Resins of the Present Invention

| Resin of the Present Invention | Etching Rate (Å/min) |
|---|---|
| (P1) | 800 |
| (P2) | 770 |
| (P3) | 800 |
| (P4) | 720 |
| (P5) | 690 |
| (P6) | 730 |
| (P7) | 710 |
| (P8) | 730 |
| (P9) | 750 |
| (P10) | 720 |
| Poly (methyl methacrylate) (Copolymer) | 1250 |
| Polymer (1) (Comparison) | 940 |
| Polymer (2) (Comparison) | 870 |
| Polymer (3) (Comparison) | 920 |

Polymer (1):

Tricyclodecanyl methacrylate/tetrahydropyranyl methacrylate/methacrylic acid (50/30/20 in molar ratio) copolymer (weight average molecular weight: 32,500; degree of dispersion: 2.7)

It can be seen from the results shown in Table 9 that the etching rate of each of the resins according to the present invention is smaller than that of poly(methyl methacrylate), Polymer (1), Polymer (2) or Polymer (3) for comparison and have a sufficiently high dry etching resistance.

Example 8
Evaluation of Image

In 4.5 g of propylene glycol monomethyl ether acetate, 1.0 g of the resin obtained in the synthesis example described above according to the present invention and 0.03 g of triphenylsulfonium triflate were dissolved, and the resulting solution was filtered through a Teflon filter of 0.2 $\mu$m. The solution was uniformly coated on a silicon substrate which had been subjected to hexamethyldisilazane treatment by a spin coater and died by heating on a hot plate at 100° C. for 90 seconds to form a resist film having a thickness of 0.4 $\mu$m. The resist film was subjected to pattern exposure using KrP excimer laser stepper (NA=0.42; 248 nm) and heated on a hot plate at 110° C. for 60 seconds immediately after the exposure. Then the resist film was developed by immersing it in a 2.38% aqueous tetramethylammonium hydroxide solution at 23° C. for 60 seconds, rinsed with pure water for 30 seconds and dried.

A pattern form, sensitivity and resolution were evaluated with each resist pattern obtained. Specifically, the pattern form was determined by observation of the pattern obtained through a scanning electron microscope and a pattern in a rectangular form was evaluated good.

The sensitivity was evaluated using an exposure amount necessary for reproducing a mask pattern of 0.35 $\mu$m.

The resolution was evaluated using limiting resolution in an exposure amount necessary for reproducing a mask pattern of 0.35 $\mu$m.

As a result, with the sensitivity and resolution as shown in Table 10 below, good positive pattern wherein only the exposed portion of the resist film was dissolved out was obtained.

TABLE 10

| Resin of the Present Invention | Sensitivity (mJ/cm$^2$) | Resolution ($\mu$m) | Pattern Form |
|---|---|---|---|
| (P1) | 25 | 0.26 | good |
| (P2) | 20 | 0.27 | good |
| (P3) | 26 | 0.25 | good |
| (P4) | 23 | 0.26 | good |
| (P5) | 19 | 0.25 | good |
| (P6) | 20 | 0.27 | good |
| (P7) | 26 | 0.25 | good |
| (P8) | 28 | 0.26 | good |
| (P9) | 21 | 0.27 | good |
| (P10) | 27 | 0.25 | good |
| Polymer (2) | 37 | 0.30 | good |
| Polymer (3) | 35 | 0.30 | good |

It can be seen from the results shown in Table 10 that the resist using the resin according to the present invention exhibits high sensitivity and good resolution. Further, a good pattern form is obtained using the resin according to the present invention.

Example 9

Evaluation of Image

On each of the resist films having a thickness of 0.4 $\mu$m obtained in Example 8, a mask prepared by drawing a pattern with chromium on a quartz plate was closely contacted and an ArF excimer laser beam (193 nm) was irradiated thereto. The resist film was heated on a hot plate at 110° C. for 60 seconds immediately after the exposure. Then the resist film was developed by immersing it in a 2.38% aqueous tetramethylammonium hydroxide solution at 23° C. for 60 seconds, rinsed with pure water for 30 seconds and dried. As a result, with the sensitivity and resolution as shown in Table 11 below, good positive pattern wherein only the exposed portion of the resist film was dissolved out was obtained. The evaluations were conducted in the same manner as described above.

TABLE 11

| Resin of the Present Invention | Sensitivity (mJ/cm$^2$) | Resolution ($\mu$m) | Pattern Form |
|---|---|---|---|
| (P1) | 22 | 0.23 | good |
| (P2) | 16 | 0.23 | good |
| (P3) | 23 | 0.23 | good |
| (P4) | 22 | 0.23 | good |
| (P5) | 17 | 0.23 | good |
| (P6) | 20 | 0.23 | good |
| (P7) | 23 | 0.23 | good |
| (P8) | 25 | 0.23 | good |
| (P9) | 20 | 0.23 | good |
| (P10) | 24 | 0.23 | good |
| Polymer (2) | 33 | 0.27 | good |
| Polymer (3) | 30 | 0.27 | good |

It can be seen from the results shown in Table 11 that the resist using the resin according to the present invention exhibits good sensitivity and resolution and forms a good positive pattern in case of using an ArF excimer laser beam.

As is apparent from the description above, the positive photosensitive composition containing the resin according to the present invention has high transmittance to far ultraviolet light particularly having a wavelength of 220 nm or less and exhibits good dry etching resistance. Further, the positive photosensitive composition exhibits high sensitivity, good resolution and good pattern profile when far ultraviolet light having a wavelength of 250 nm or less, particularly 220 nm or less (especially an ArF excimer laser beam) is employed as an exposure light source, and thus it can be effectively employed for the formation of fine pattern necessary for the production of semiconductor elements.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition comprising:
   (A) a compound which generates an acid upon irradiation with an actinic ray or radiation;
   (B) a resin having a group which is decomposed by the action of an acid to increase solubility in an alkaline developing solution, wherein the resin contains at least one structure represented by the following formula (a); and
   (F) a fluorine-base and/or silicon-base surface active agent:

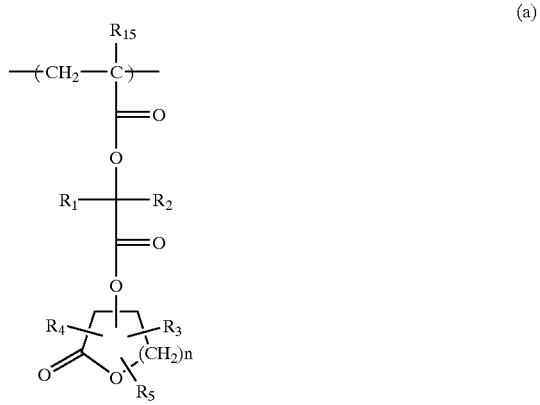

wherein $R_1$ and $R_2$, which may be the same or different, each represents a hydrogen atom or an optionally substituted straight-chain, branched chain or cyclic alkyl group, or $R_1$ and $R_2$ may be bonded to each other to form a monocyclic or polycyclic ring which may contain an oxygen atom, a sulfur atom, a nitrogen atom, a ketone bond, an ester bond, an imido bond or an amido bond as a linking group; $R_3$, $R_4$ and $R_5$, which may be the same or different, each represents a hydrogen atom, an optionally substituted straight-chain, branched chain or cyclic alkyl or alkoxy group, or two or more of $R_3$, $R_4$ and $R_5$ may be bonded to each other to form a monocyclic or polycyclic ring which may contain an oxygen atom, a sulfur atom, a nitrogen atom, a ketone bond, or an ester bond as a linking group; $R_{15}$ represents a hydrogen atom, a halogen atom, a cyano group, an alkyl group or haloalkyl group; and n represents an integer of from 1 to 3.

2. The positive photosensitive composition as claimed in claim 1, wherein the resin having a group which is decomposed by the action of an acid to increase solubility in an alkaline developing solution is (D) a resin which contains at least one repeating unit having the structure represented by formula (a) and a repeating unit having a monoalicyclic or polyalicyclic hydrocarbon moiety.

3. The positive photosensitive composition as claimed in claim 2, wherein the repeating unit having a monoalicyclic or polyalicyclic hydrocarbon moiety is a repeating unit represented by the following formula (VII), (VIII) or (IX):

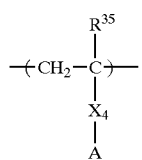

(VII)

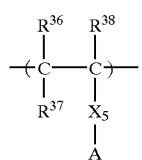

(VIII)

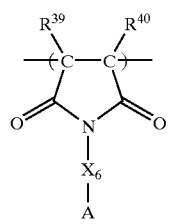

(IX)

wherein $R_{35}$, $R_{36}$ and $R_{38}$ to $R_{40}$, which may be the same or different, each represents a hydrogen atom, a halogen atom, a cyano group, an alkyl group or a haloalkyl group; $R_{37}$ represents a cyano group, —CO—O$R_{47}$ or —CO—N$R_{48}R_{49}$; $X_4$, $X_5$ and $X_6$, which may be the same or different, each represents a single bond, an optionally substituted divalent alkylene, alkenylene or cycloalkylene group, —CO—, —SO$_2$—, —O—CO—$R_{50}$—, —CO—O—$R_{51}$—, or —CO—N$R_{52}$—$R_{53}$—; $R_{47}$ represents a hydrogen atom, an optionally substituted alkyl, cycloalkyl or alkenyl group, or a group which is decomposed by the action of an acid to increase solubility in an alkaline developing solution; $R_{48}$, $R_{49}$ and $R_{52}$, which may be the same or different, each represents a hydrogen atom or an optionally substituted alkyl, cycloalkyl or alkenyl group, or $R_{48}$ and $R_{49}$ may be bonded to each other to form a ring; $R_{50}$, $R_{51}$ and $R_{53}$, which may be the same or different, each represents a single bond or a divalent alkylene, alkenylene or cycloalkylene group, or a divalent group formed by combining each of these groups with an ether, ester, amido, urethane or ureido group; and A represents a monoalicyclic or polyalicyclic group.

4. The positive photosensitive composition as claimed in claim 2, wherein the monoalicyclic or polyalicyclic hydrocarbon moiety is an adamantane residue.

5. The positive photosensitive composition as claimed in claim 1, wherein $R_1$ and $R_2$ each represents a substituent other than a hydrogen atom.

6. The positive photosensitive composition as claimed in claim 1, wherein the composition is suitable for exposure using far ultraviolet light having a wavelength of 250 nm or less as an exposure light source.

7. The positive photosensitive composition as claimed in claim 1, wherein the composition is suitable for exposure using far ultraviolet light having a wavelength of 220 nm or less as an exposure light source.

8. The positive photosensitive composition as claimed in claim 1, wherein the group which is decomposed by the action of an acid to increase solubility in an alkaline developing solution is a group represented by the following formula (XIII) or (XIV):

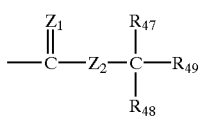

(XIII)

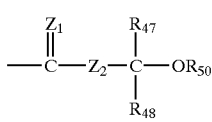

(XIV)

wherein $R_{47}$ to $R_{49}$, which may be the same or different, each represents a hydrogen atom or an optionally substituted alkyl, cycloalkyl or alkenyl group, provided that at least one of $R_{47}$ to $R_{49}$ in formula (XIII) is not a hydrogen atom; $R_{50}$ represents an optionally substituted alkyl, cycloalkyl, or alkenyl group; or two of $R_{47}$ to $R_{49}$ in formula (XIII) or two of $R_{47}$, $R_{48}$, and $R_{50}$ in formula (XIV) may be bonded to each other to form a three- to eight-membered cyclic structure comprising carbon atoms and optionally containing one or more heteroatoms; and $Z_1$ and $Z_2$, which may be the same or different, each represents an oxygen atom or a sulfur atom.

9. The positive photosensitive composition as claimed in claim 1, wherein the resin (B) comprises at least one repeating unit represented by the following formulae (X), (XI) and (XII):

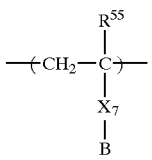

(X)

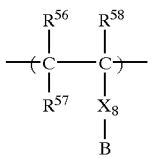

(XI)

-continued

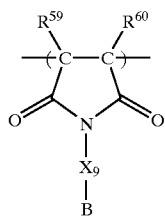
(XII)

wherein $R_{55}$, $R_{56}$ and $R_{58}$ to $R_{60}$, which may be the same or different, each represents a hydrogen atom, a halogen atom, a cyano group, an alkyl group or a haloalkyl group; $R_{57}$ represents a cyano group, —CO—$OR_{67}$ or —CO—$NR_{68}R_{69}$; $X_7$, $X_8$ and $X_9$, which may be the same or different, each represents a single bond, an optionally substituted divalent alkylene, alkenylene or cycloalkylene group, —CO—, —SO$_2$—, —O—CO—$R_{70}$—, —CO—O—$R_{71}$— or —CO—$NR_{72}$—$R_{73}$—; $R_{67}$ represents a hydrogen atom, an optionally substituted alkyl, cycloalkyl or alkenyl group, or a group which is decomposed by the action of an acid to increase solubility in an alkaline developing solution; $R_{68}$, $R_{69}$ and $R_{72}$, which may be the same or different, each represents a hydrogen atom or an optionally substituted alkyl, cycloalkyl or alkenyl group, or $R_{68}$ and $R_{69}$ may be bonded to each other to form a ring; $R_{70}$, $R_{71}$ and $R_{73}$, which may be the same or different, each represents a single bond or a divalent alkylene, alkenylene or cycloalkylene group, or a divalent group formed by combining each of these groups with an ether, ester, amido, urethane or ureido group; and B is a group which is decomposed by the action of an acid to increase solubility in an alkaline developing solution.

10. The positive photosensitive composition as claimed in claim 1, wherein the resin (B) further comprises a carboxy group.

11. The positive photosensitive composition as claimed in claim 1, wherein the resin (B) further comprises at least one repeating unit represented by the following formulae (XV), (XVI) and (XVII):

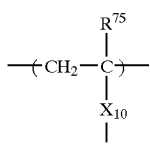
(XV)

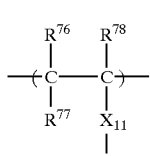
(XVI)

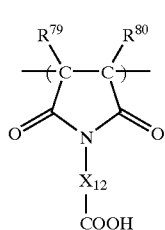
(XVII)

wherein $R_{75}$, $R_{76}$ and $R_{78}$ to $R_{80}$, which may be the same or different, each represents a hydrogen atom, a halogen atom, a cyano group, an alkyl group or a haloalkyl group; $R_{77}$ represents a cyano group, —CO—$OR_{87}$ or —CO—$NR_{88}R_{89}$; $X_{10}$, $X_{11}$ and $X_{12}$, which may be the same or different, each represents a single bond, an optionally substituted divalent alkylene, alkenylene or cycloalkylene group, —CO—, —SO$_2$—, —O—CO—$R_{90}$—, —CO—O—$R_{91}$— or —CO—$NR_{92}$—$R_{93}$—; $R_{87}$ represents a hydrogen atom, an optionally substituted alkyl, cycloalkyl or alkenyl group, or a group which is decomposed by the action of an acid to increase solubility in an alkaline developing solution; $R_{88}$, $R_{89}$ and $R_{92}$, which may be the same or different, each represents a hydrogen atom or an optionally substituted alkyl, cycloalkyl or alkenyl group, or $R_{88}$ and $R_{89}$ may be bonded to each other to form a ring; and $R_{90}$, $R_{91}$ and $R_{93}$, which may be the same or different, each represents a single bond or a divalent alkylene, alkenylene or cycloalkylene group, or a divalent group formed by combining each of these groups with an ether, ester, amido, urethane or ureido group.

12. The positive photosensitive composition as claimed in claim 1, wherein the resin having a group which is decomposed by the action of an acid to increase solubility in an alkaline developing solution contains a structure represented by formula (b):

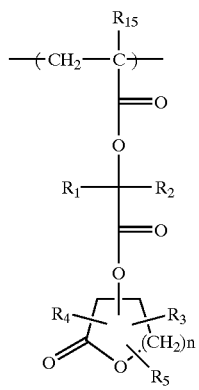
(b)

wherein $R_1$ and $R_2$, which may be the same or different, each represents a hydrogen atom or an optionally substituted straight-chain, branched chain or cyclic alkyl group, or $R_1$ and $R_2$ may be bonded to each other to form a monocyclic or polycyclic ring which may contain an oxygen atom, a sulfur atom, a nitrogen atom, a ketone bond, an ester bond, an imido bond or an amido bond as a linking group; $R_3$, $R_4$ and $R_5$, which may be the same or different, each represents a hydrogen atom, an optionally substituted straight-chain, branched chain or cyclic alkyl or alkoxy group, or two or more of $R_3$, $R_4$ and $R_5$ may be bonded to each other to form a monocyclic or polycyclic ring which may contain an oxygen atom, a sulfur atom, a nitrogen atom, a ketone bond, or an ester bond as a linking group; $R_{15}$ represents a hydrogen atom, a halogen atom, a cyano group, an alkyl group or a haloalkyl group; and n represents an integer of from 1 to 3.

* * * * *